(12) United States Patent
de Rochemont

(10) Patent No.: US 9,905,928 B2
(45) Date of Patent: Feb. 27, 2018

(54) ELECTRICAL COMPONENTS AND METHOD OF MANUFACTURE

(71) Applicant: L. Pierre de Rochemont, Austin, TX (US)

(72) Inventor: L. Pierre de Rochemont, Austin, TX (US)

(*) Notice: Subject to any disclaimer, the term of this patent is extended or adjusted under 35 U.S.C. 154(b) by 160 days.

(21) Appl. No.: 14/268,082

(22) Filed: May 2, 2014

(65) Prior Publication Data
US 2015/0070238 A1    Mar. 12, 2015

Related U.S. Application Data

(62) Division of application No. 11/479,159, filed on Jun. 30, 2006, now Pat. No. 8,715,839.

(Continued)

(51) Int. Cl.
*H01Q 15/02* (2006.01)
*H01Q 9/04* (2006.01)
(Continued)

(52) U.S. Cl.
CPC ............ *H01Q 9/0414* (2013.01); *B82Y 30/00* (2013.01); *H01C 7/003* (2013.01); *H01C 17/003* (2013.01); *H01C 17/06533* (2013.01); *H01G 4/10* (2013.01); *H01G 4/33* (2013.01); *H01L 23/642* (2013.01); *H01L 23/647* (2013.01); *H01Q 1/2283* (2013.01); *H01Q 1/38* (2013.01);
(Continued)

(58) Field of Classification Search
CPC ..... H01Q 1/38; H01Q 9/0414; H01Q 15/0086

USPC .......................... 343/700 MS, 841, 843, 909
See application file for complete search history.

(56) References Cited

U.S. PATENT DOCUMENTS

| 2,283,925 A | 5/1942 | Harvey |
| 2,886,529 A | 5/1959 | Louis |

(Continued)

FOREIGN PATENT DOCUMENTS

| CN | 1450580 A | 10/2003 |
| EP | 0026056 A1 | 4/1981 |

(Continued)

OTHER PUBLICATIONS

International Search Report and Written Opinion in corresponding PCT application No. PCT/US06/25650, dated Feb. 5, 2007.

(Continued)

*Primary Examiner* — Dameon E Levi
*Assistant Examiner* — Hasan Islam
(74) *Attorney, Agent, or Firm* — Burns & Levinson LLP; Jerry Cohen; David Gomes

(57) ABSTRACT

An electrical component provides a ceramic element located on or in a dielectric substrate between and in contact with a pair of electrical conductors, wherein the ceramic element includes one or more metal oxides having fluctuations in metal-oxide compositional uniformity less than or equal to 1.5 mol % throughout the ceramic element. A method of fabricating an electrical component, provides or forming a ceramic element between and in contact with a pair of electrical conductors on a substrate including depositing a mixture of metalorganic precursors and causing simultaneous decomposition of the metal oxide precursors to form the ceramic element including one or more metal oxides.

10 Claims, 45 Drawing Sheets

TOP VIEW

Related U.S. Application Data

(60) Provisional application No. 60/695,485, filed on Jun. 30, 2005.

(51) Int. Cl.
| | |
|---|---|
| *B82Y 30/00* | (2011.01) |
| *H01C 7/00* | (2006.01) |
| *H01C 17/00* | (2006.01) |
| *H01C 17/065* | (2006.01) |
| *H01G 4/10* | (2006.01) |
| *H01G 4/33* | (2006.01) |
| *H01Q 1/22* | (2006.01) |
| *H01Q 1/38* | (2006.01) |
| *H01Q 15/00* | (2006.01) |
| *H01L 23/64* | (2006.01) |
| *H01L 23/498* | (2006.01) |
| *H05K 1/02* | (2006.01) |
| *H05K 1/09* | (2006.01) |
| *H05K 1/16* | (2006.01) |
| *H05K 3/20* | (2006.01) |

(52) U.S. Cl.
CPC ......... *H01Q 15/0086* (2013.01); *H05K 1/162* (2013.01); *H05K 1/165* (2013.01); *H05K 1/167* (2013.01); *C04B 2235/768* (2013.01); *C04B 2235/781* (2013.01); *H01L 23/49822* (2013.01); *H01L 2224/16* (2013.01); *H01L 2224/16225* (2013.01); *H01L 2924/0102* (2013.01); *H01L 2924/01019* (2013.01); *H01L 2924/01021* (2013.01); *H01L 2924/01025* (2013.01); *H01L 2924/01037* (2013.01); *H01L 2924/01057* (2013.01); *H01L 2924/01067* (2013.01); *H01L 2924/01068* (2013.01); *H01L 2924/01077* (2013.01); *H01L 2924/01078* (2013.01); *H01L 2924/01079* (2013.01); *H01L 2924/01087* (2013.01); *H01L 2924/3011* (2013.01); *H01L 2924/3025* (2013.01); *H05K 1/0298* (2013.01); *H05K 1/092* (2013.01); *H05K 1/16* (2013.01); *H05K 3/207* (2013.01); *H05K 2201/017* (2013.01); *H05K 2201/0175* (2013.01); *H05K 2201/09763* (2013.01); *H05K 2203/016* (2013.01); *H05K 2203/0338* (2013.01); *H05K 2203/121* (2013.01); *Y10T 428/12493* (2015.01)

(56) References Cited

U.S. PATENT DOCUMENTS

| | | |
|---|---|---|
| 3,574,114 A | 4/1971 | Monforte |
| 3,614,554 A | 10/1971 | Shield et al. |
| 3,983,077 A | 9/1976 | Fuller et al. |
| 4,400,683 A | 8/1983 | Eda et al. |
| 4,455,545 A | 6/1984 | Shelly |
| 4,523,170 A | 6/1985 | Huth, III |
| 4,646,038 A | 2/1987 | Wanat |
| 4,759,120 A | 7/1988 | Bernstein |
| 4,859,492 A | 8/1989 | Rogers, Jr. et al. |
| 4,880,770 A | 11/1989 | Mir et al. |
| 4,967,201 A | 10/1990 | Rich, III |
| 5,070,317 A | 12/1991 | Bhagat |
| 5,084,349 A | 1/1992 | Losee et al. |
| 5,130,675 A | 7/1992 | Sugawara |
| 5,139,999 A | 8/1992 | Gordon et al. |
| 5,154,973 A | 10/1992 | Imagawa et al. |
| 5,191,669 A | 3/1993 | Ganslmeier et al. |
| 5,198,824 A | 3/1993 | Poradish |
| 5,217,754 A | 6/1993 | Santiago-Aviles et al. |
| 5,219,377 A | 6/1993 | Poradish |
| 5,263,198 A | 11/1993 | Geddes et al. |
| 5,272,485 A | 12/1993 | Mason et al. |
| 5,403,797 A | 4/1995 | Ohtani et al. |
| 5,427,988 A | 6/1995 | Sengupta et al. |
| 5,456,945 A | 10/1995 | McMillan et al. |
| 5,478,610 A | 12/1995 | Desu et al. |
| 5,503,912 A | 4/1996 | Setoyama et al. |
| 5,513,382 A | 4/1996 | Agahi-Kesheh et al. |
| 5,535,445 A | 7/1996 | Gunton |
| 5,540,772 A | 7/1996 | McMillan et al. |
| 5,543,773 A | 8/1996 | Evans et al. |
| 5,584,053 A | 12/1996 | Kommrusch et al. |
| 5,590,387 A | 12/1996 | Schmidt et al. |
| 5,614,252 A | 3/1997 | McMillan et al. |
| 5,625,365 A | 4/1997 | Tom et al. |
| 5,629,553 A | 5/1997 | Ikeda et al. |
| 5,635,433 A | 6/1997 | Sengupta |
| 5,656,561 A | 8/1997 | Rogers et al. |
| 5,707,459 A | 1/1998 | Itoyama et al. |
| 5,707,715 A | 1/1998 | deRochemont et al. |
| 5,747,870 A | 5/1998 | Pedder |
| 5,759,923 A | 6/1998 | McMillan et al. |
| 5,764,189 A | 6/1998 | Lohninger |
| 5,771,567 A | 6/1998 | Pierce et al. |
| 5,854,608 A | 12/1998 | Leisten |
| 5,859,621 A | 1/1999 | Leisten |
| 5,888,583 A | 3/1999 | McMillan et al. |
| 5,889,459 A | 3/1999 | Hattori et al. |
| 5,892,489 A | 4/1999 | Kanba et al. |
| 5,903,421 A | 5/1999 | Furutani et al. |
| 5,933,121 A | 8/1999 | Rainhart et al. |
| 5,945,963 A | 8/1999 | Leisten |
| 6,023,251 A | 2/2000 | Koo et al. |
| 6,027,826 A | 2/2000 | deRochemont et al. |
| 6,028,568 A | 2/2000 | Asakura et al. |
| 6,031,445 A | 2/2000 | Marty et al. |
| 6,040,805 A | 3/2000 | Huynh et al. |
| 6,046,707 A | 4/2000 | Gaughan et al. |
| 6,052,040 A | 4/2000 | Hino |
| 6,111,544 A | 8/2000 | Dakeya et al. |
| 6,130,471 A | 10/2000 | Boles |
| 6,143,432 A | 11/2000 | deRochemont et al. |
| 6,154,176 A | 11/2000 | Fathy et al. |
| 6,176,004 B1 | 1/2001 | Rainhart et al. |
| 6,181,297 B1 | 1/2001 | Leistei |
| 6,188,368 B1 | 2/2001 | Koriyama et al. |
| 6,195,049 B1 | 2/2001 | Kim et al. |
| 6,204,203 B1 | 3/2001 | Narwankar et al. |
| 6,208,843 B1 | 3/2001 | Huang et al. |
| 6,222,489 B1 | 4/2001 | Tsuru et al. |
| 6,227,188 B1 | 5/2001 | Tankala et al. |
| 6,266,020 B1 | 7/2001 | Chang |
| 6,271,803 B1 | 8/2001 | Watanabe et al. |
| 6,300,894 B1 | 10/2001 | Lynch et al. |
| 6,320,547 B1 | 11/2001 | Fathy et al. |
| 6,323,549 B1 | 11/2001 | deRochemont et al. |
| 6,492,949 B1 | 12/2002 | Breglia et al. |
| 6,496,149 B1 | 12/2002 | Birnbaum et al. |
| 6,501,415 B1 | 12/2002 | Viana et al. |
| 6,541,820 B1 | 4/2003 | Bol |
| 6,552,693 B1 | 4/2003 | Leisten |
| 6,559,735 B1 | 5/2003 | Hoang et al. |
| 6,583,699 B2 | 6/2003 | Yokoyama |
| 6,597,318 B1 * | 7/2003 | Parsche .................... H01Q 1/36 343/700 MS |
| 6,605,151 B1 | 8/2003 | Wessels et al. |
| 6,611,419 B1 | 8/2003 | Chakravorty |
| 6,620,750 B2 | 9/2003 | Kim et al. |
| 6,639,556 B2 | 10/2003 | Baba |
| 6,642,908 B2 | 11/2003 | Pleva et al. |
| 6,650,303 B2 | 11/2003 | Kim et al. |
| 6,670,497 B2 | 12/2003 | Tashino et al. |
| 6,680,700 B2 | 1/2004 | Hilgers |
| 6,683,576 B2 | 1/2004 | Achim |
| 6,686,406 B2 | 2/2004 | Tomomatsu et al. |
| 6,690,336 B1 | 2/2004 | Leisten et al. |
| 6,697,605 B1 | 2/2004 | Atokawa et al. |
| 6,720,926 B2 * | 4/2004 | Killen .................... H01Q 9/16 343/700 MS |
| 6,726,992 B1 | 4/2004 | Yadav |

(56) References Cited

U.S. PATENT DOCUMENTS

| | | |
|---|---|---|
| 6,737,364 B2 | 5/2004 | Black |
| 6,742,249 B2 | 6/2004 | deRochemont et al. |
| 6,742,611 B1 | 6/2004 | Illerhaus et al. |
| 6,743,744 B1 | 6/2004 | Kim et al. |
| 6,750,820 B2 | 6/2004 | Killen |
| 6,762,237 B2 | 7/2004 | Glatkowski et al. |
| 6,791,496 B1 | 9/2004 | Killen et al. |
| 6,824,713 B2 | 11/2004 | Kuzuoka |
| 6,864,848 B2 | 3/2005 | Sievenpiper |
| 6,906,674 B2 | 6/2005 | McKinzie, III et al. |
| 6,919,119 B2 | 7/2005 | Kalkan et al. |
| 6,940,087 B2 | 9/2005 | Komoda et al. |
| 7,002,436 B2 | 2/2006 | Ma et al. |
| 7,047,637 B2 | 5/2006 | deRochemont et al. |
| 7,116,949 B2 | 10/2006 | Irie et al. |
| 7,230,316 B2 | 6/2007 | Yamazaki et al. |
| 7,405,698 B2 | 7/2008 | deRochemont |
| 7,456,449 B2 | 11/2008 | Fujiwara et al. |
| 7,522,124 B2 | 4/2009 | Smith et al. |
| 7,564,887 B2 | 7/2009 | Wang et al. |
| 7,572,313 B2 | 8/2009 | Palanisamy et al. |
| 7,595,623 B2 | 9/2009 | Bennett |
| 7,652,901 B2 | 1/2010 | Kirchmeier et al. |
| 7,679,102 B2 | 3/2010 | Chik et al. |
| 7,763,917 B2 | 7/2010 | deRochemont |
| 7,892,659 B2 | 2/2011 | Oboodi et al. |
| 7,917,311 B2 | 3/2011 | Finkel et al. |
| 7,968,273 B2 | 6/2011 | Chen |
| 8,066,805 B2 | 11/2011 | Zurcher et al. |
| 8,069,690 B2 | 12/2011 | DeSantolo et al. |
| 8,069,935 B1 | 12/2011 | Miess et al. |
| 8,134,177 B2 | 3/2012 | Murooka |
| 8,178,457 B2 | 5/2012 | de Rochemont |
| 8,334,154 B2 | 12/2012 | Fuertes et al. |
| 8,350,657 B2 | 1/2013 | de Rochemont |
| 8,354,294 B2 | 1/2013 | de Rochemont et al. |
| 8,715,839 B2 | 5/2014 | de Rochemont |
| 8,759,670 B2 | 6/2014 | Furusawa |
| 2001/0023779 A1 | 9/2001 | Sugaya et al. |
| 2001/0027119 A1 | 10/2001 | Furutani et al. |
| 2001/0046603 A1 | 11/2001 | Constantino |
| 2001/0048969 A1 | 12/2001 | Constantino et al. |
| 2002/0039667 A1 | 4/2002 | Takaya et al. |
| 2002/0047768 A1 | 4/2002 | Duffy |
| 2002/0070983 A1 | 6/2002 | Kozub et al. |
| 2002/0092472 A1 | 7/2002 | Hayahi et al. |
| 2002/0110004 A1 | 8/2002 | Parks |
| 2002/0190818 A1 | 12/2002 | Endou et al. |
| 2003/0002045 A1 | 1/2003 | Nemat-Nasser et al. |
| 2003/0034124 A1 | 2/2003 | Sugaya et al. |
| 2003/0073565 A1 | 4/2003 | Ellis et al. |
| 2003/0080325 A1 | 5/2003 | Uchiyama et al. |
| 2003/0107455 A1 | 6/2003 | Imanaka et al. |
| 2003/0111714 A1 | 6/2003 | Bates et al. |
| 2003/0122647 A1 | 7/2003 | Ou |
| 2003/0148024 A1 | 8/2003 | Kodas et al. |
| 2003/0161959 A1 | 8/2003 | Kodas et al. |
| 2003/0170436 A1 | 9/2003 | Sumi et al. |
| 2003/0186636 A1 | 10/2003 | Akyuz et al. |
| 2003/0221621 A1 | 12/2003 | Pokharna et al. |
| 2004/0000964 A1 | 1/2004 | Killen et al. |
| 2004/0000966 A1 | 1/2004 | Killen et al. |
| 2004/0000970 A1 | 1/2004 | Killen et al. |
| 2004/0000972 A1 | 1/2004 | Killen et al. |
| 2004/0000975 A1 | 1/2004 | Killen et al. |
| 2004/0000976 A1* | 1/2004 | Killen .................. H01P 1/2039 333/219 |
| 2004/0001024 A1 | 1/2004 | Killen et al. |
| 2004/0001026 A1 | 1/2004 | Killen et al. |
| 2004/0001027 A1 | 1/2004 | Killen et al. |
| 2004/0001028 A1 | 1/2004 | Killen et al. |
| 2004/0012081 A1 | 1/2004 | Kwon |
| 2004/0033654 A1 | 2/2004 | Yamagata |
| 2004/0070334 A1 | 4/2004 | Buckley et al. |
| 2004/0070915 A1 | 4/2004 | Nagai et al. |
| 2004/0084080 A1 | 5/2004 | Sager et al. |
| 2004/0113738 A1 | 6/2004 | Ahn et al. |
| 2004/0118448 A1 | 6/2004 | Scher et al. |
| 2004/0145874 A1 | 7/2004 | Pinel et al. |
| 2004/0189528 A1 | 9/2004 | Killen et al. |
| 2006/0086994 A1 | 4/2006 | Viefers et al. |
| 2006/0093860 A1 | 5/2006 | Schuisky et al. |
| 2006/0134491 A1 | 6/2006 | Hilchenko et al. |
| 2006/0189104 A1 | 8/2006 | Yan |
| 2007/0166453 A1 | 7/2007 | Van Duren et al. |
| 2007/0259768 A1 | 11/2007 | Kear et al. |
| 2010/0055492 A1 | 3/2010 | Barsoum et al. |
| 2010/0155786 A1 | 6/2010 | Heald et al. |
| 2011/0049394 A1 | 3/2011 | De Rochemont |
| 2011/0065224 A1 | 3/2011 | Bollman et al. |

FOREIGN PATENT DOCUMENTS

| | | |
|---|---|---|
| EP | 0939451 A1 | 1/1999 |
| EP | 1376759 A2 | 2/2004 |
| GB | 1125897 A | 9/1968 |
| WO | 2007143197 A2 | 12/2007 |
| WO | 2010048580 A2 | 4/2010 |

OTHER PUBLICATIONS

Examination Report in corresponding India application No. 274/DELNP/2008, dated Nov. 26, 2014.

Andrenko et al. "EM Analysis of PBG Substrate Microstrip Circuits for Integrated Transmitter Front End" MMET Proceedings 295-297 (2000).

Bardi et al. "Plane Wave Scattering From Frequency-Selectrive Surfaces by the Finite-Element Method"IEEE Transactions on Magnetics 38(2):641-644 (2002).

Chappell et al. "Composite Metamaterial Systems for Two-Dimensional Periodic Structures" IEEE 384-387 (2002).

Cheng et al. "Preparation and Characterization of (Ba, Sr) TiO$_3$ thin films using interdigital electrodes" Microelectronic Engineering 66:872-879 (2003).

Clavijo et al. "Design Methodology for Sievenpiper High-Impedance Surfaces: An Artificial Magnetic Conductor for Positive Gain Electrically Small Antennas" IEEE Transactions on Antennas and Propagation 51(10):2678-2690 (2003).

Diaz et al. "Magnetic Loading of Artificial Magnetic Conductors for Bandwidth Enhancement" IEEE 431-434 (2003).

Hansen "Effects of High-Impedance Screen on a Dipole Antenna" IEEE Antennas and Wireless Propagation Letters 1:46-49 (2002).

Joshi et al. "Processing and Characterization of Pure and Doped $Ba_{0.6}Sr_{0.4}TiO_3$ Thin Films for Tunable Microwave Applications" Mat. Res. Soc. Symp. Proc. 656E: DD4.9.1-DD4.9.6 (2001).

Kern et al. "Active Negative Impedance Loaded EBG Structures for the Realization of Ultra-Wideband Artificial Magnetic Conductors" IEEE 427-430 (2003).

Kern et al. "The Synthesis of Metamaterial Ferrites for RF Applications Using Electromagnetic Bandgap Structures" IEEE 497-500 (2003).

Kern et al. "Ultra-thin Electromagnetic Bandgap Absorbers Systhesized via Genetic Algorithms" IEEE 1119-1122 (2003).

Kuhn et al., "Characterization of Novel Mono- and Bifacially Active Semi-Transparent Crystalline Silicon Solar Cells" IEEE Transactions on Electron Devices, 46(10): 2013-2017 (1999).

Kretly et al. "The Influence of the Height Variation of the Frequency Bandgap in an AMC Artificial Magnetic Conductor for Wireless Applications: an EM Experimental Design Approach" Proceeding SBMO/IEEE MTT-S IMOC 219-223 (2003).

Lee et al. "Investigation of Electromagnetic Bandgap (EBG) Structures for Antenna Pattern Control" IEEE 1115-1118 (2003).

McKinzie III et al. "Mitigation of Multipath Through the Use of an Artificial Magnetic Conductor for Precision CPS Surveying Antennas" IEEE 640-643 (2002).

McKinzie et al. "A Multi-Band Artificial Magnetic Conductor Comprised of Multiple FSS Layers" IEEE 423-426 (2003).

(56) References Cited

OTHER PUBLICATIONS

Monorchio et al. "Synthesis of Artificial Magnetic Conductors by Using Multilayered Frequency Selective Surfaces" IEEE Antennas and Wireless Propagation Letters 1:196-199 (2002).

Mosallaei et al. "Periodic Bandgap and Effective Dielectric Materials in Electromagnetics: Characterization and Applications in Nanocavities and Waveguides" IEEE Transactions on Antennas and Propagation 51(3):549-563 (2003).

Pontes et al. "Study of the dielectric and ferroelectric properties of chemically processed $Ba_x Sr_{1-x} TiO3$ thin films" Thin Solid Films 386(1): 91-98 (2001).

Rogers et al. "AMCs Comprised of Interdigital Capacitor FSS Layers Enable Lower Cost Applications" IEEE 411-414 (2003).

Rogers et al. "An AMC-Based 802.111a/b Antenna for Laptop Computers" IEEE 10-13 (2003).

Sievenpiper et al. "Two-Dimensional Beam Steering Using an Electrically Tunable Impedance Surface" IEEE Transactions on Antennas and Propagation 51(10):2713-2722 (2003).

Sun et al. "Efficiency of Various Photonic Bandgap (PBG) Structures" $3^{Rd}$ Int'l . Conf. on Microwave and Millimeter Wave Technology Proceedings 1055-1058 (2002).

Tsunemine et al. "$Pt/Ba_x Sr_{(1-x)} TiO_3$/Pt Capacitor Technology for 0.15 μm Embedded Dynamic Random Access Memory" Jap. J. Appl. Phys. 43(5A):2457-2461 (2004).

Vest "Metallo-organic decomposition (MOD) processing of ferroelectric and electro-optic films: A review" Ferroelectrics 102: 53-68 (1990).

Viviani et al. "Positive Temperature Coefficient of Electrical Resistivity below 150k of Barium Strontium Titanate" J. Amer. Ceram. Soc. 87: 756-758 (2004).

Weily et al. "Antennas Based on 2-D and 3-D Electromagnetic Bandgap Materials" IEEE 847-850 (2003).

Yang et al. "Surface Waves of Printed Antennas on Planar Artificial Periodic Dielectric Structures" IEEE Transactions on Antennas and Propagation 49(3):444-450 (2001).

Zhang et al. "Planar Artificial Magnetic Conductors and Patch Antennas." IEEE Transactions on Antennas and Propagation 51(10):2704-2712 (2001).

Ziroff et al. "A Novel Approach for LTCC Packaging Using a PBG Structure for Shielding and Package Mode Suppression" 33rd European Microwave Conference—Munich 419-422 (2003).

Supplementary European Search Report in corresponding European application No. EP06774375, dated Aug. 24, 2017.

\* cited by examiner

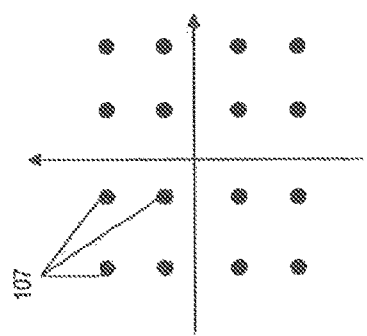
FIG. 1A
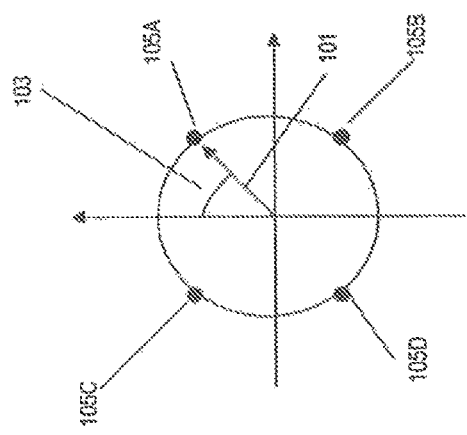
FIG. 1B
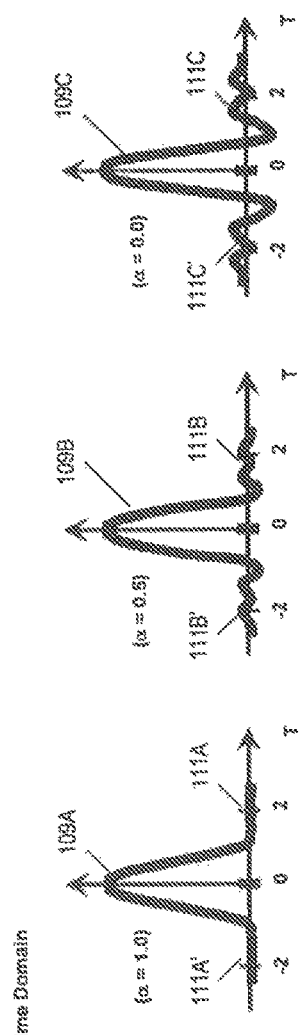
FIG. 2A
FIG. 2B
FIG. 2C

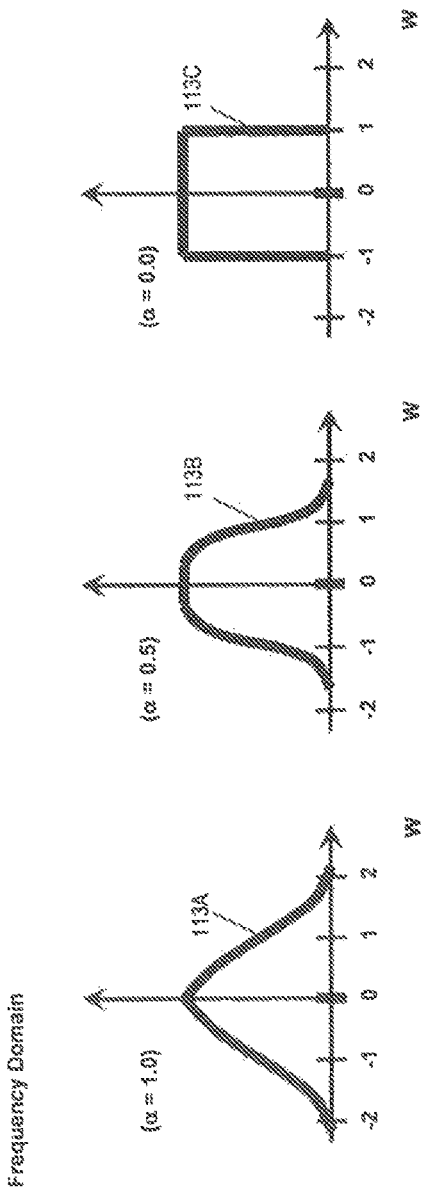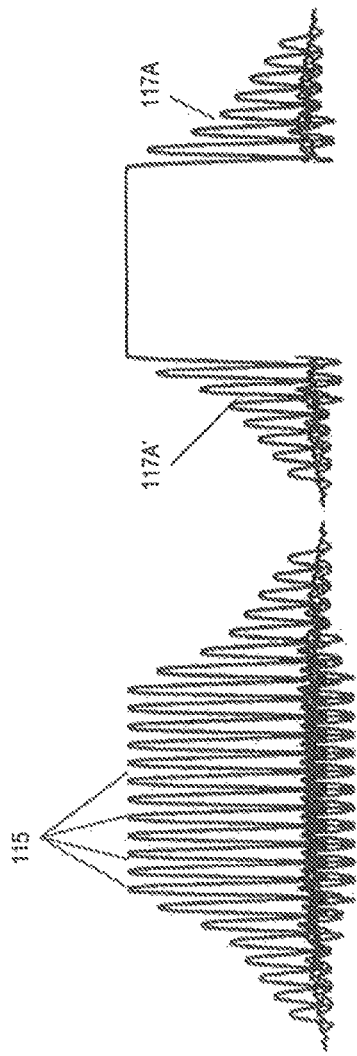

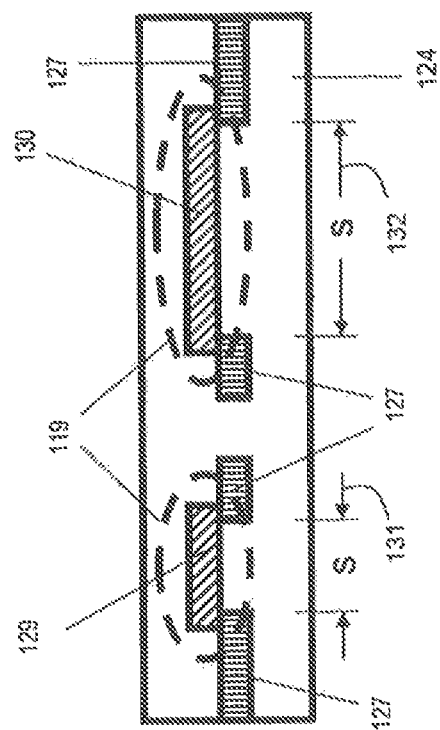
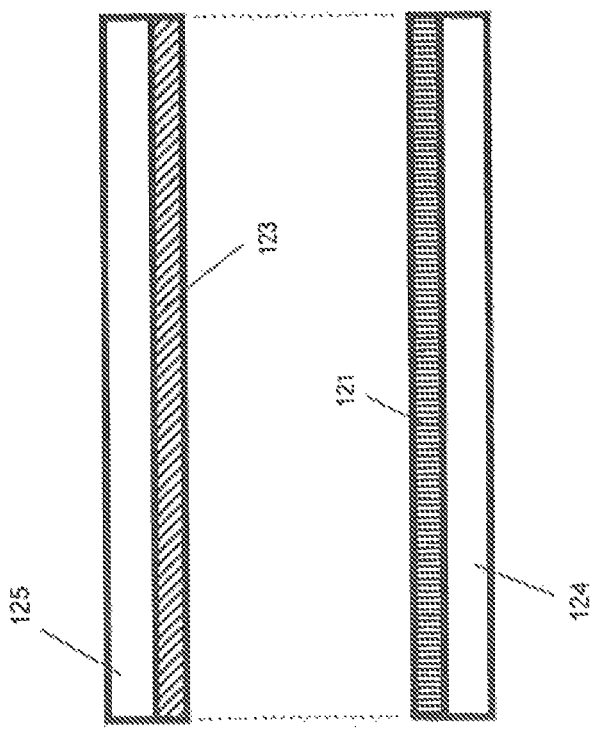
FIG. 5A
Prior Art
FIG. 5B
Prior Art

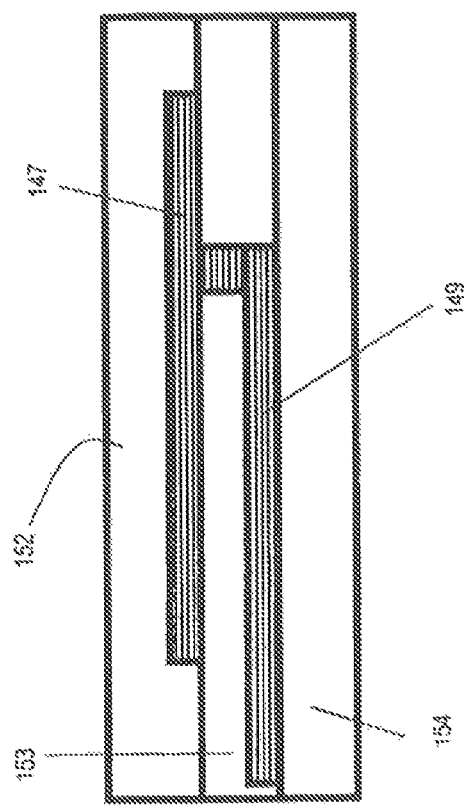
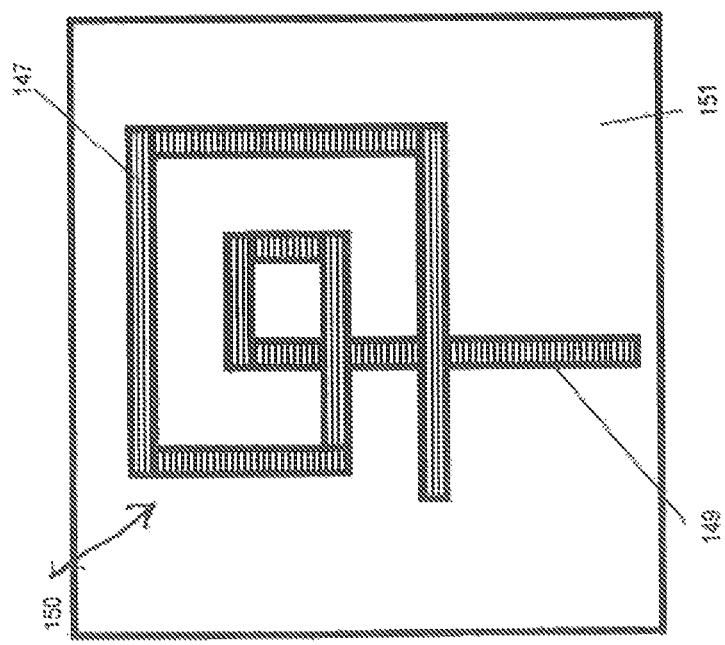
FIG. 7B
FIG. 7A

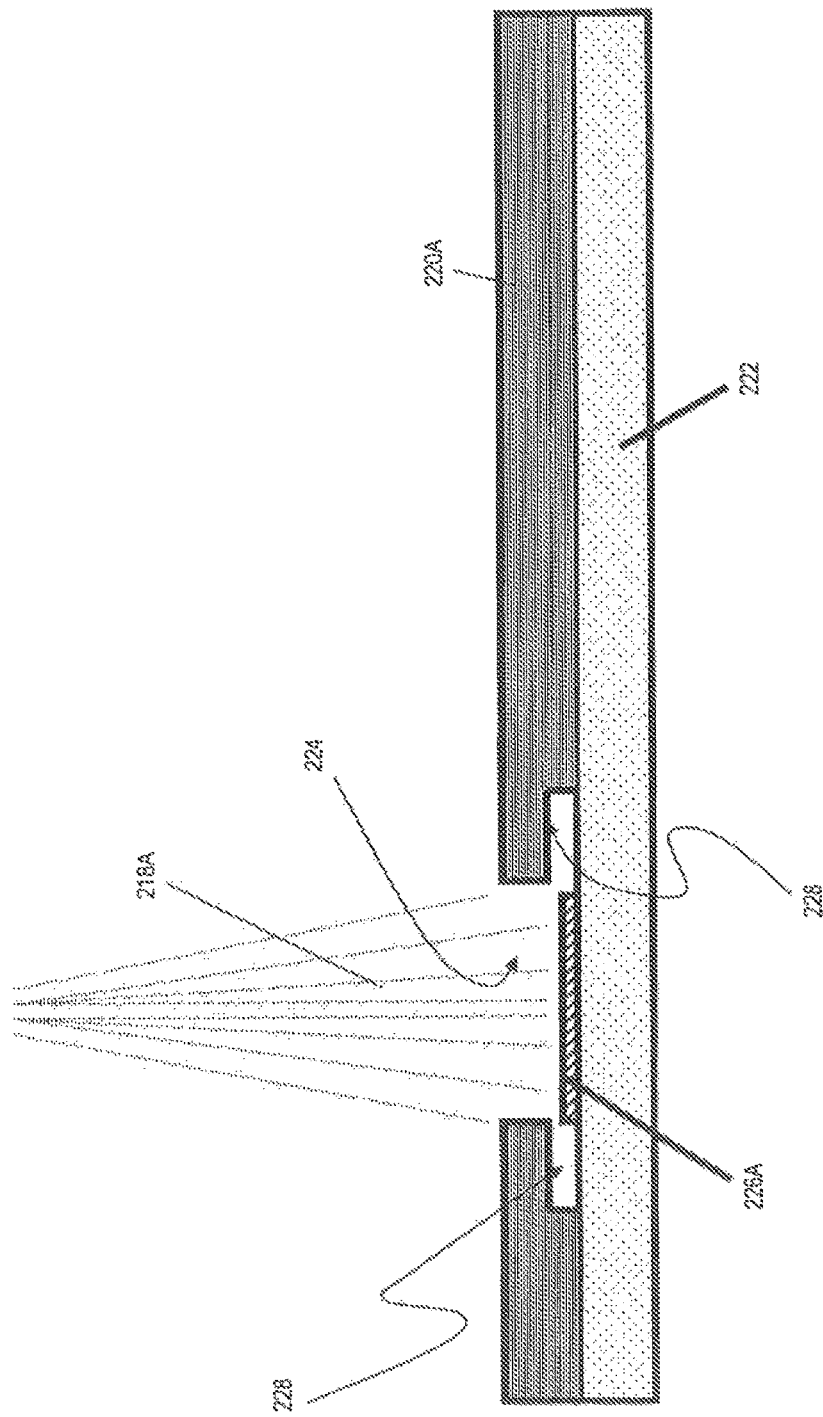

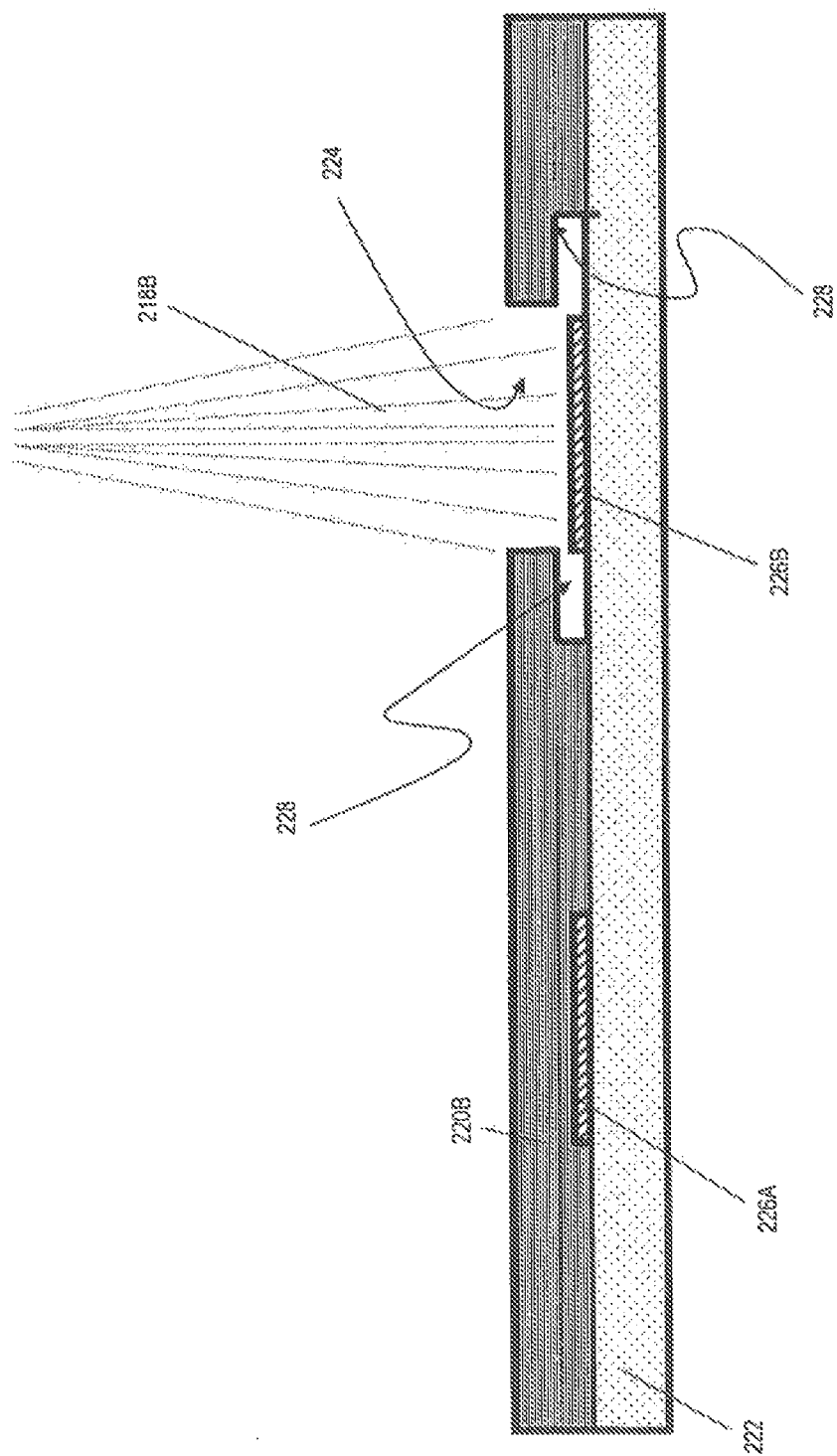

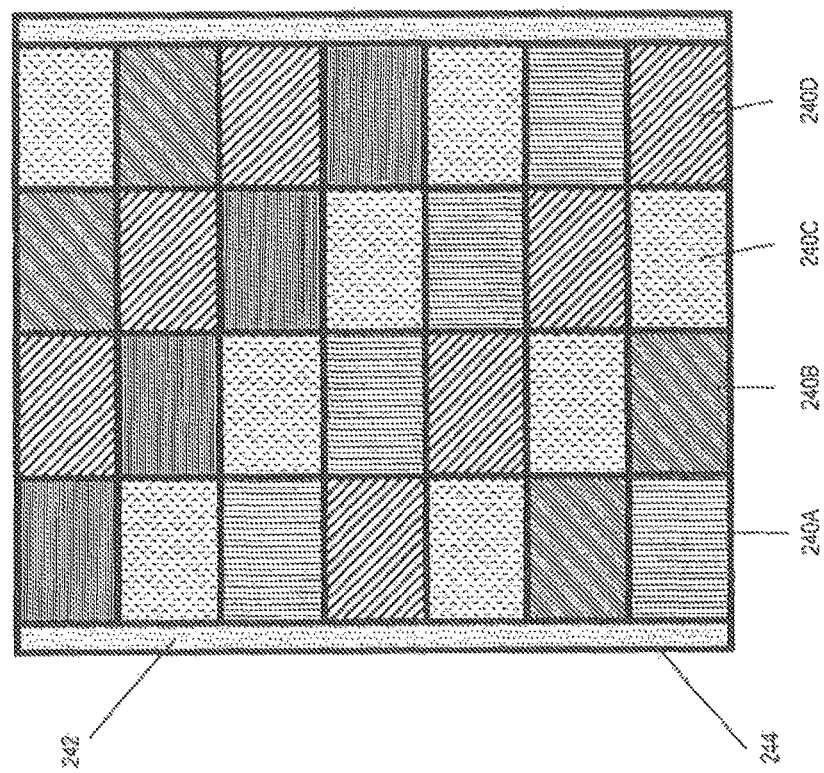
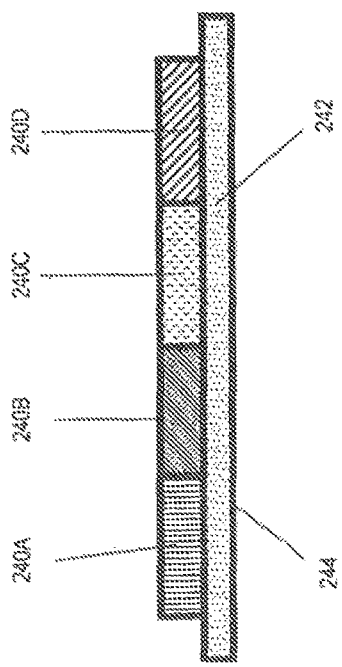
FIG. 12A2
FIG. 12A1

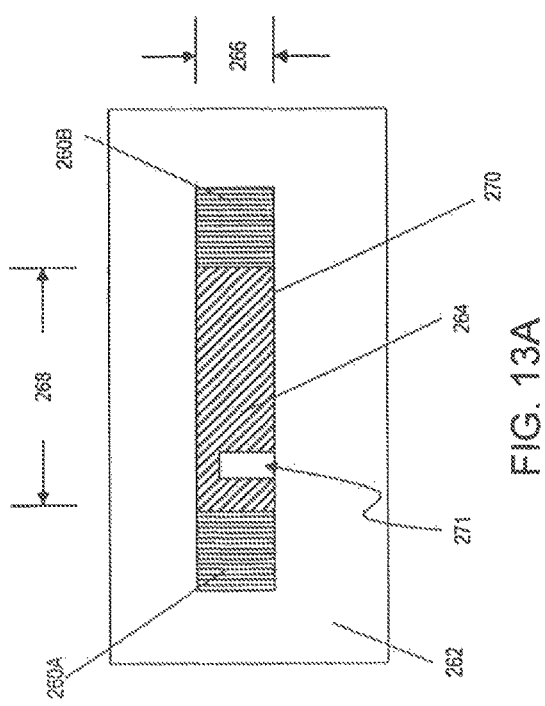
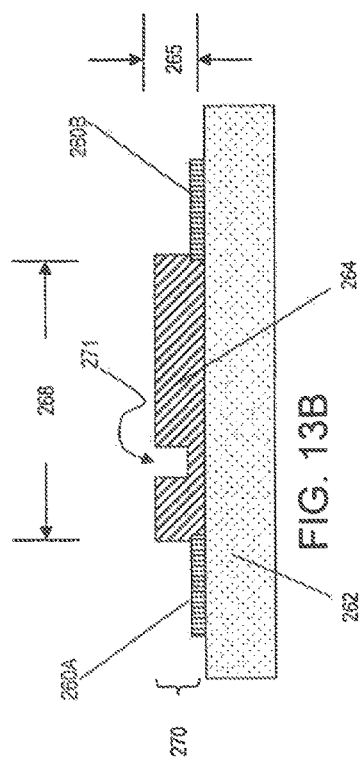
FIG. 13A
FIG. 13B

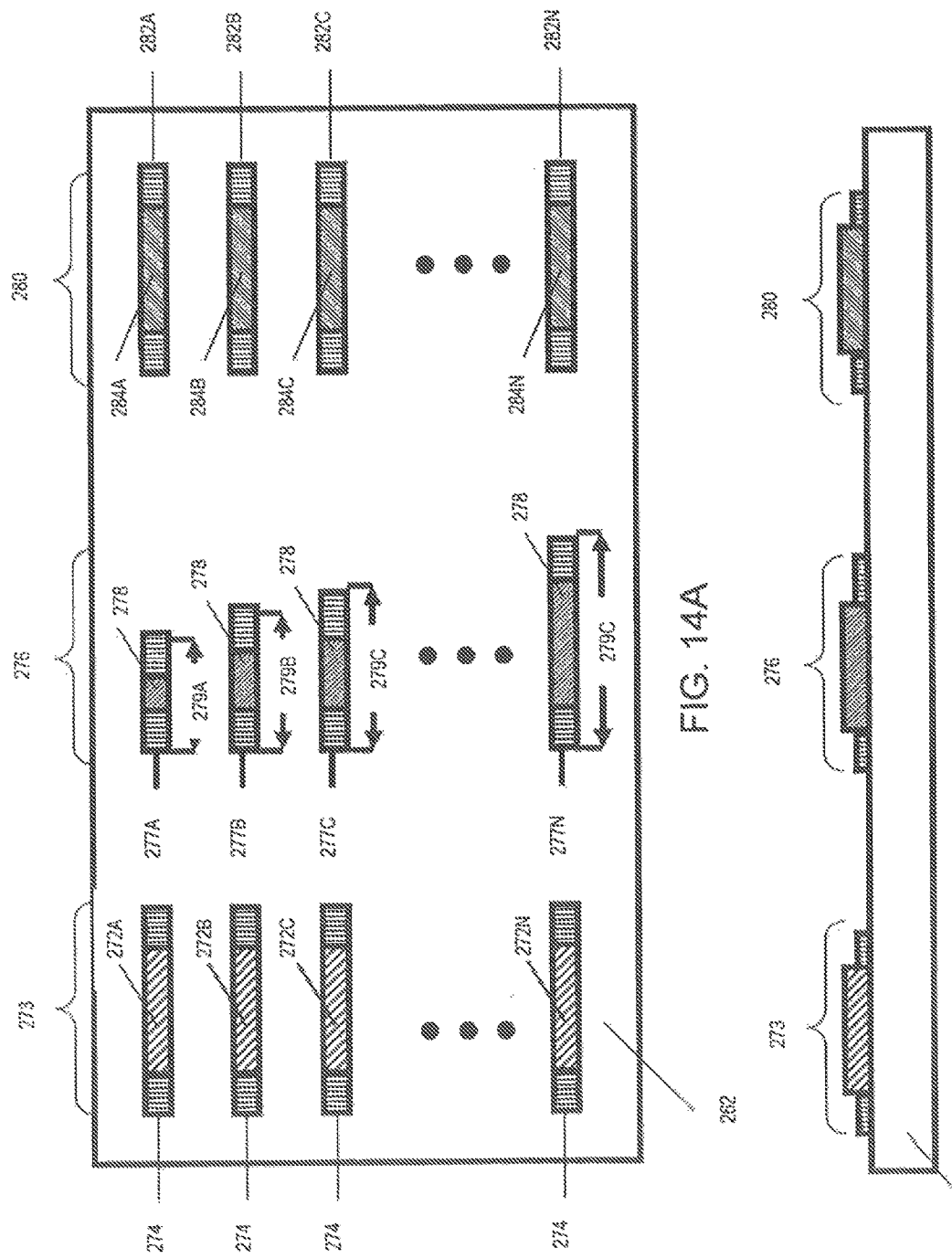

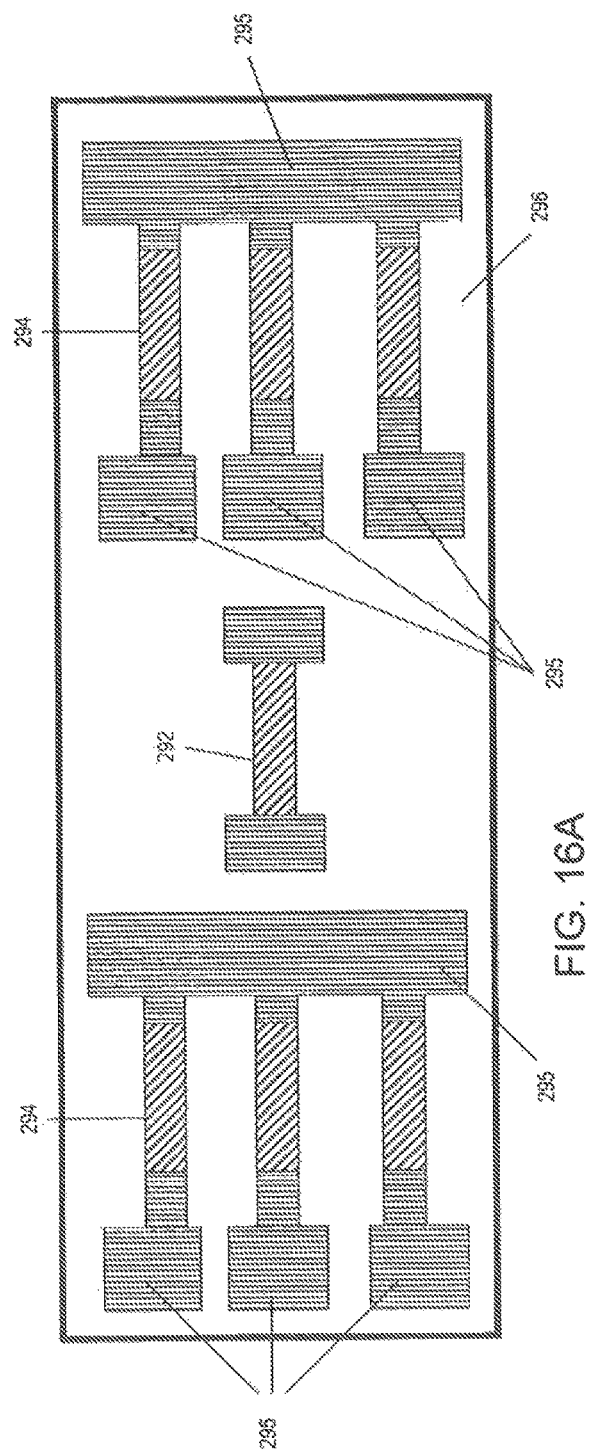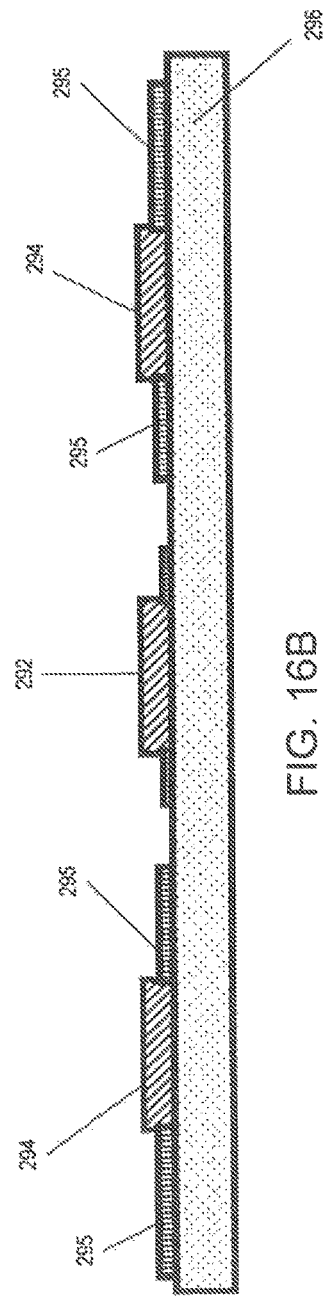

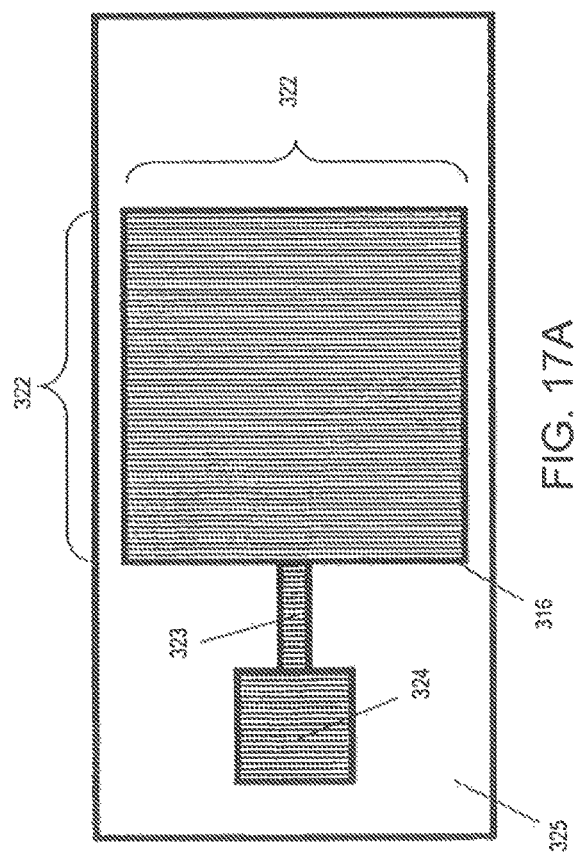
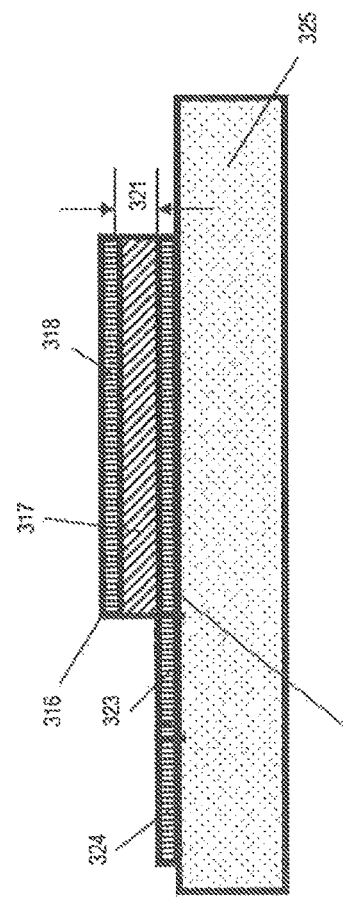
FIG. 17A
FIG. 17B

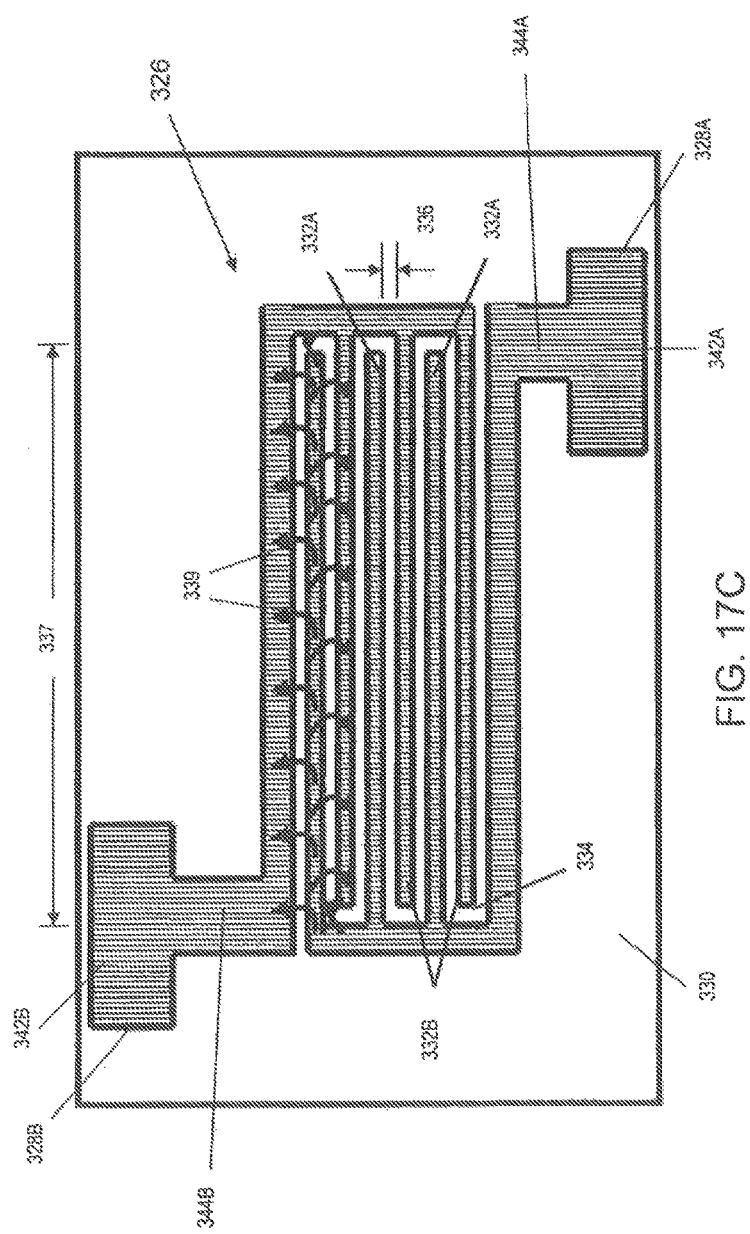
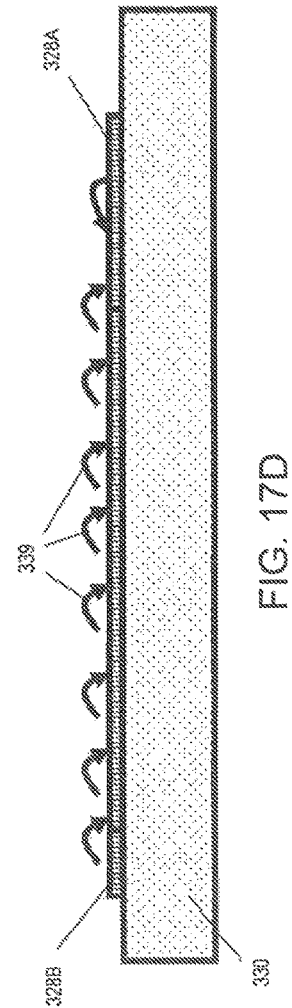
FIG. 17C
FIG. 17D

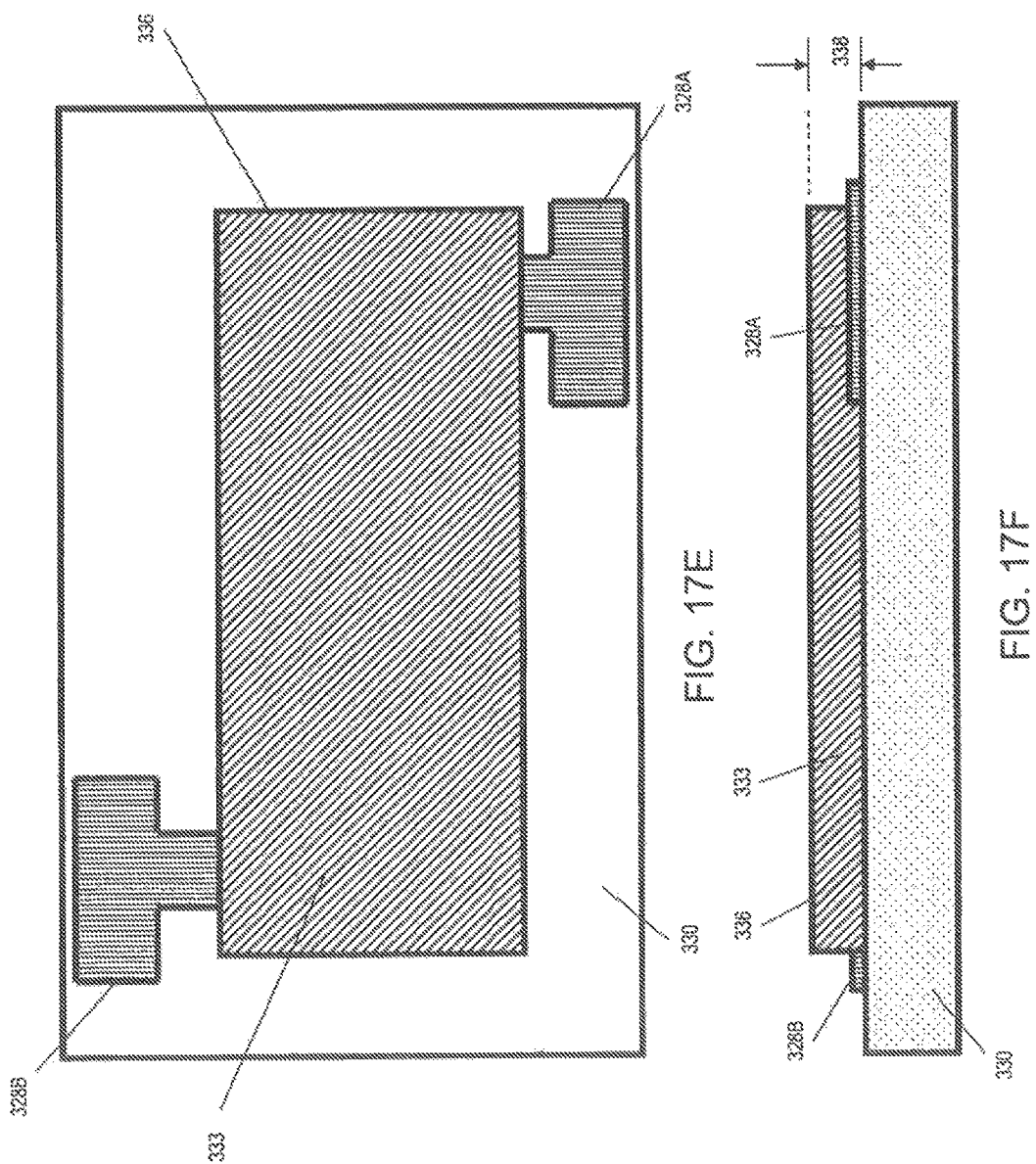

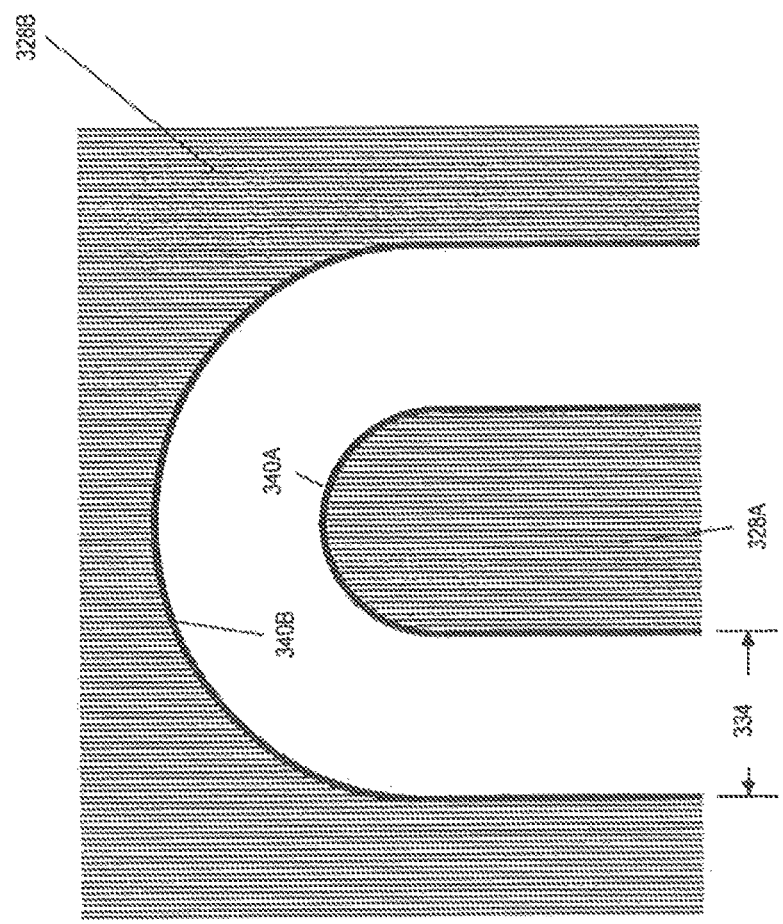

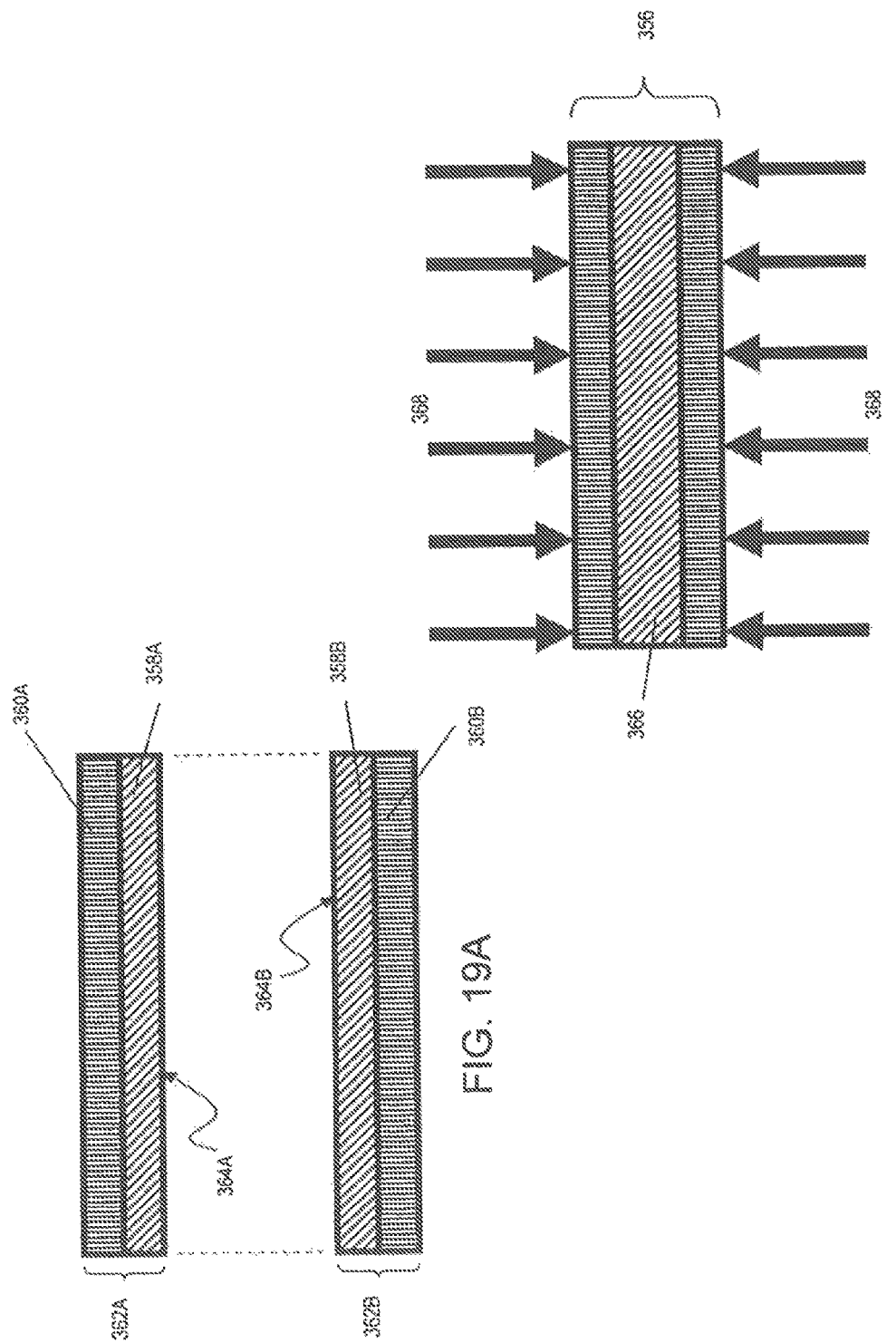

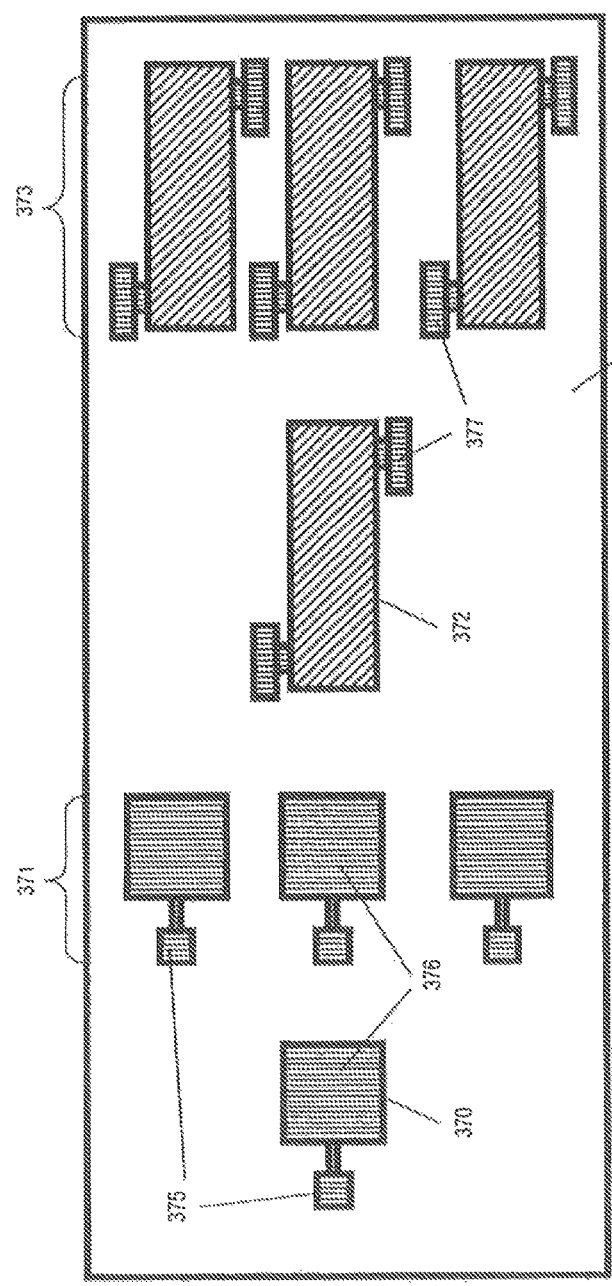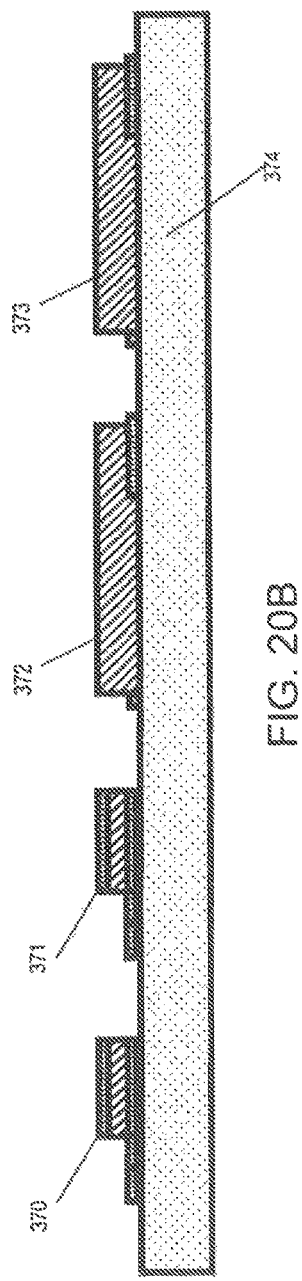
FIG. 20A
FIG. 20B

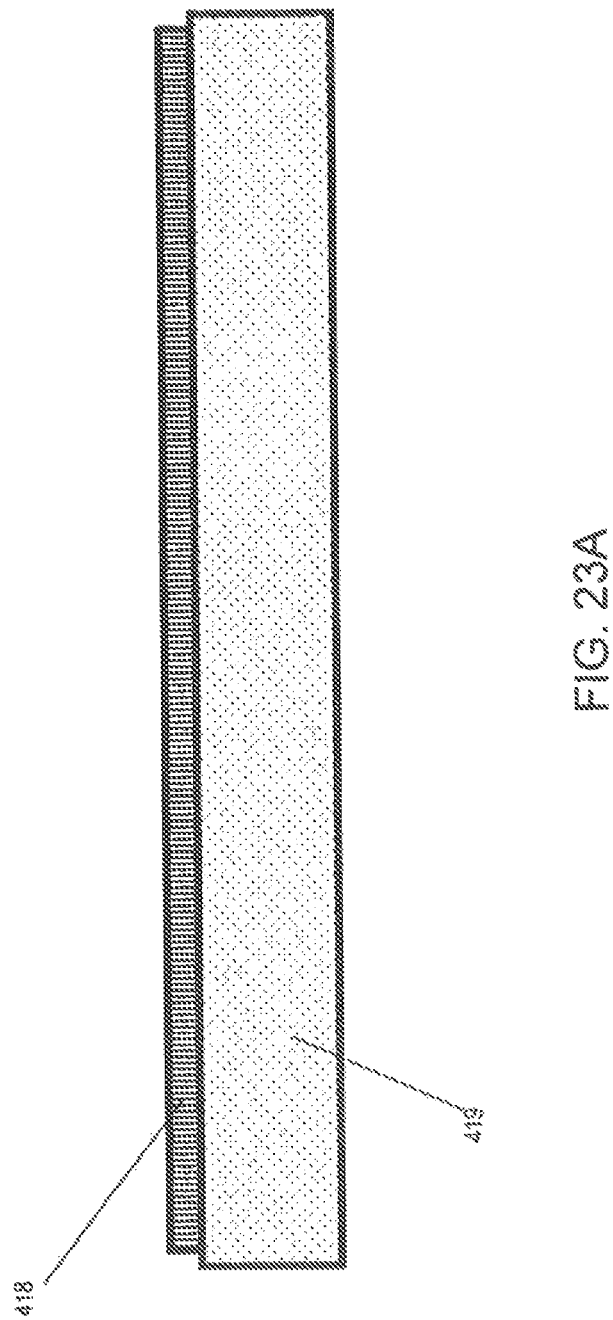

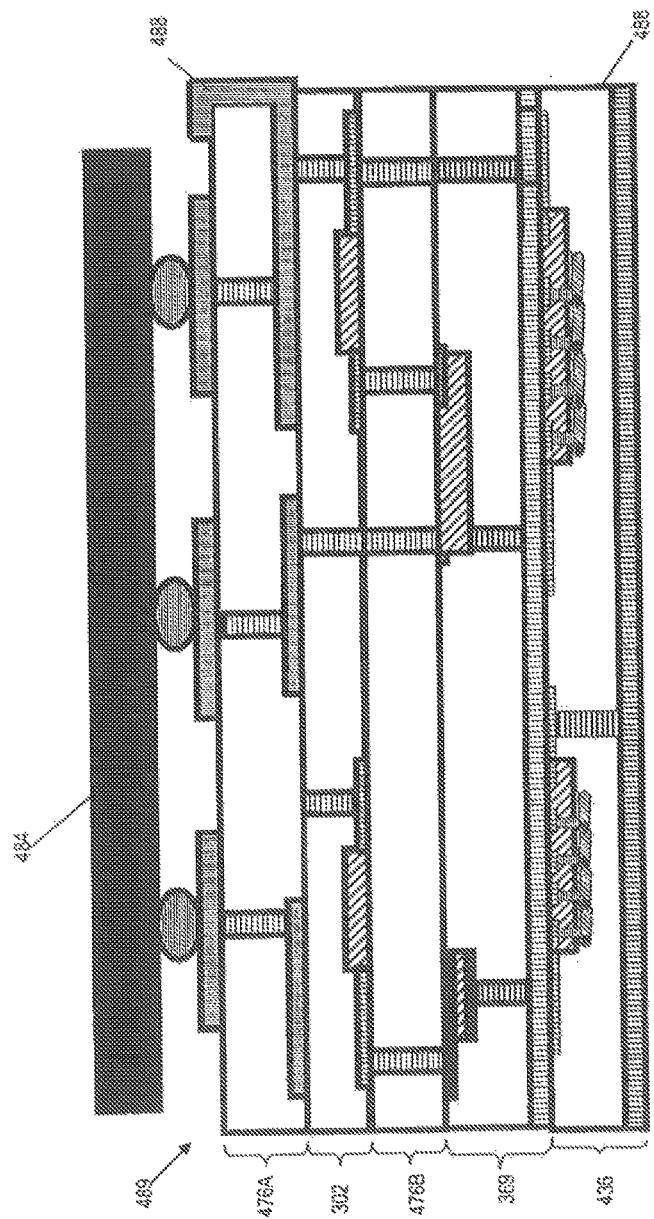
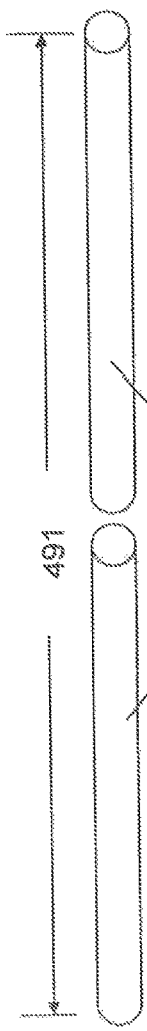
FIG. 27B
FIG. 28

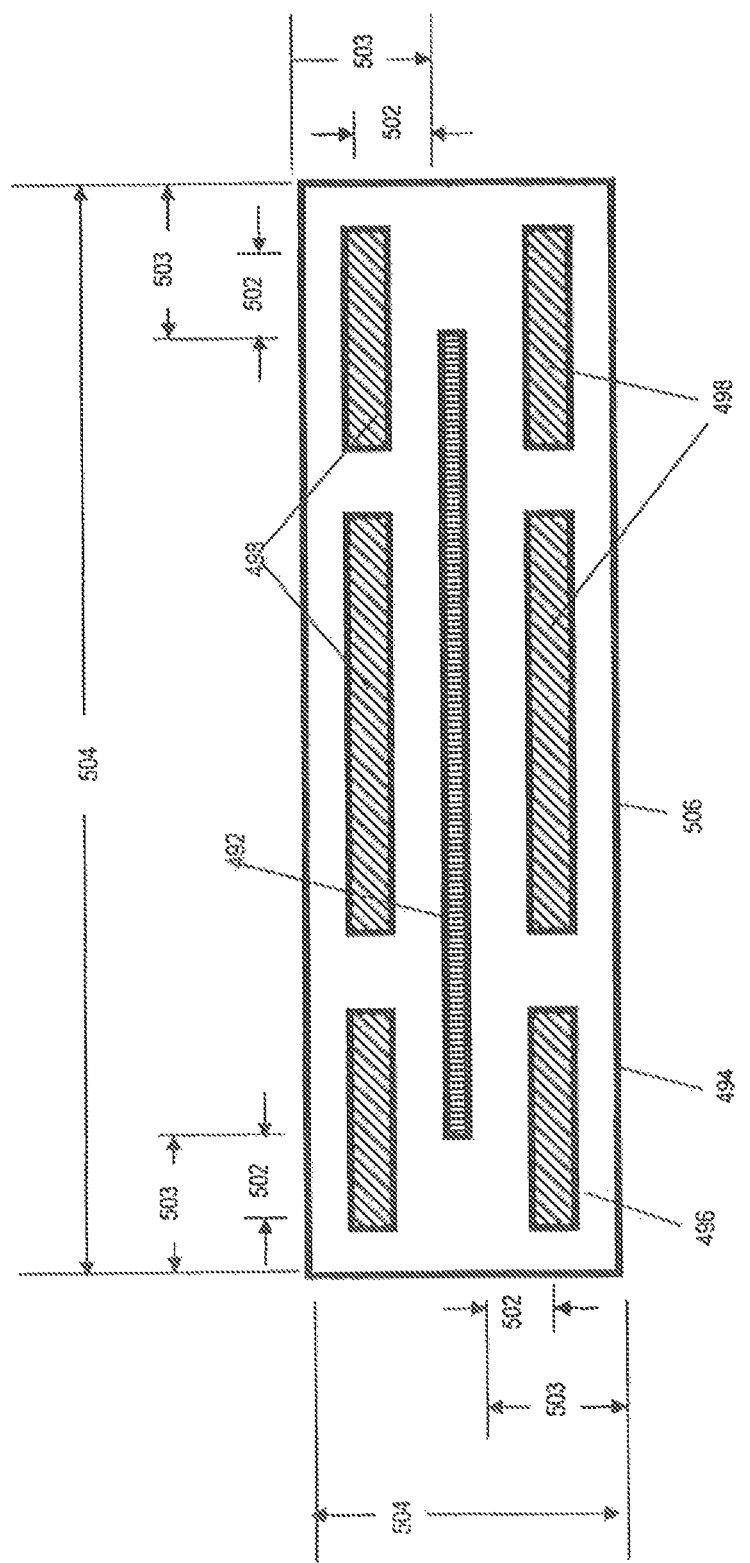

TOP VIEW

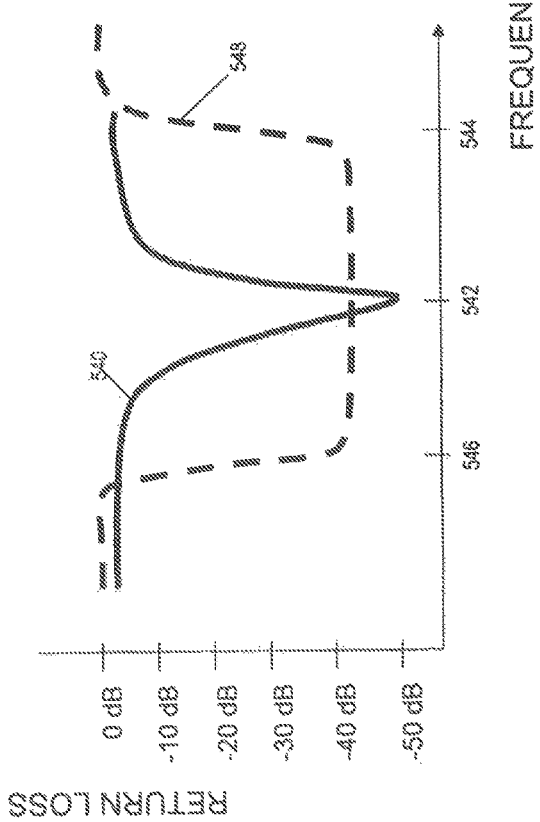
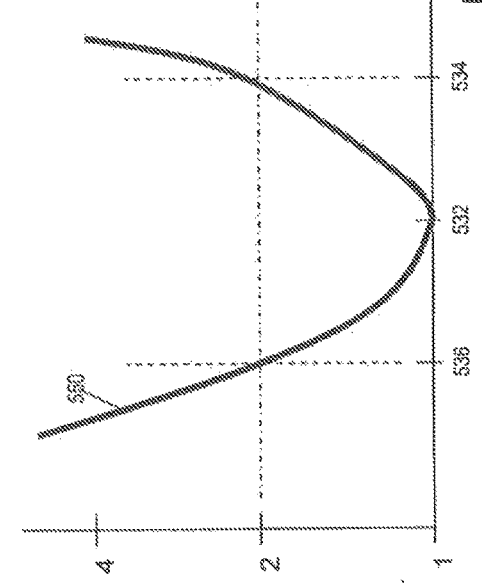
FIG. 32A
FIG. 32B

ELECTRICAL COMPONENTS AND METHOD OF MANUFACTURE

RELATED APPLICATIONS

Applicant claims priority of U.S. patent application Ser. No. 11/479,159, filed Jun. 30, 2006 and entitled ELECTRICL COMPONENTS AND METHOD OF MANUFACTURE, which in turn claims priority of US Provisional Patent Application No. 60/695,485, filed Jun. 30, 2005 and entitled SPREAD SPECTRUM RECEIVER AND METHOD OF MANUFACTURE, the contents of which are hereby incorporated herein.

FIELD OF THE INVENTION

The present invention generally relates to the construction of embedded electronic components, and in particular, to such components as they apply to signal processing.

BACKGROUND OF THE INVENTION

Conventional digital communications utilize the intensity of a signal pulse to encode a binary bit of information, using a full or high amplitude pulse to convey the 1 bit of information and a low or no amplitude pulse to signal the 0 bit datum, or vice versa. Wireless communications operate under the constraints of finite bandwidth and multiple sources of signal interference that can cause high bit error rate levels in data streams using simple digital codes. Spread-spectrum signaling protocols have been developed to address these issues in a manner that provide meaningful data rates and higher signal integrity. These protocols utilize phase shift keying (PSK) or quadrature amplitude modulation techniques to shape the transmitted pulse into a symbol that encodes a series of consecutive data bits into a single pulse. FIG. 1A uses a phase map to depict how a signal with constant amplitude 101 and modulated phase shift 103 produces four different phase states 105A, 105B, 105C, 105D that are used to symbolize four different two-bit combinations of data [1,1], [0,1], [1,0], [0,0]. FIG. 1B depicts how a signal constellation containing 16 different amplitude and phase states 107 is used to encode four (4) bits per symbol: [1,1,1,1], [1,1,1,0], [1,1,0,1], [1,0,1,1], [0,1,1,1], [1,0,0,1], [1,0,0,0], [0,1,0,1], [0,1,0,0], [0,0,1,0], [1,0,0,1], [0,0,0,1], [1,0,0,0], [0,0,0,1], [0,1,1,0], and [0,0,0, 0].

These symbol modulation techniques affect the shape of the pulse through the signal roll-off parameter, α, which can take on values ranging between 1≤α≤0. As shown in FIGS. 2A, 2B, 2C, different roll-off parameters used to represent different symbols will not significantly modulate the signal carrier when the pulse 109A, 109B, 109C is viewed in the time domain. Time domain signal modulation primarily affects the leading and trailing tails 111A, 111A', 111B, 111B', 111C, 111C' of the pulse. FIGS. 3A, 3B, 3C depicts how the varying roll-off parameters affect the pulse in the frequency domain 113A, 113B, 113C. T is used to define the symbol time length and W is the Nyquist rate, W=½T, in FIGS. 2, 3. This modulation format causes the pulse's power spectral density to be spread over more frequencies as the roll-off parameter is increased. Therefore, symbol detection is more efficiently performed by analyzing the symbol in the frequency domain.

Conventional receivers will use sensors to register the pulse's time domain signature and dedicate processor functions to perform inverse Fast Fourier Transforms (IFFF) or inverse Discrete Fast Fourier Transforms that mathematically compute pulse's power spectral density. The use of mathematical methods to de-convolve a symbol's power spectral density adds component cost to the receiver, consumes additional power from any available power budget, and occupies valuable real estate when packaged on a mobile wireless platform.

This is particularly so in wireless communications systems based on orthogonal frequency division multiplexing (OFDM). OFDM techniques, including, but not limited to, WiMAX systems, are multi-carrier modulation methods developed to boost data rates reliably. Boosting data rates on a single carrier by shortening symbol time lengths is often more susceptible to increased bit error rates. OFDM methods use a plurality of carriers (often referred to as "sub-carriers") operating at a lower data rate. This allows the composite data of all sub-carriers to be communicated at a combined rate that is comparable to the data rate of a single carrier with the same channel bandwidth using the same basic modulation at a higher data rate. The principal advantages to using longer symbol duration times is a net reduction in error rate by reduced susceptibility to errors from inter-symbol interference caused by multi-path time dispersion. Furthermore, inter-symbol interference is not as problematic when frequency-selective fading is distributed only over a few of the sub-carriers and the fading depth over the majority of sub-carriers is not great enough to generate significant bit errors. FIGS. 4A, 4B show how a plurality of sub-carriers 115 produce a composite power spectra of the individual sub-carriers that has a rectangular shape with most of the modulated data contained in the power spectral densities of leading/trailing side bands 117A, 117A'. However, the greater number of sub-carriers also increases the IFFF and/or IDFFF computational processing power needed to interpret the sub-carrier symbols, which processing power is limited on a mobile platform.

Passive resistor, capacitor, and inductor components, collectively referred to as passive components, are used to form the filtering stages that comprise these devices. At present, most passive components are assembled on the surface of a printed circuit board and generally comprise 80% of all the components used in a fully populated circuit board and account for 50% of the real estate occupied on the circuit board's major surface. Small form factor is a general requirement for mobile wireless systems. Therefore, methods that reduce a circuit's footprint by transferring the passive components from the circuit board's surface to one or more interior layers are desirable. This practice, more commonly known as embedded passive technology, is also useful in larger scale high-speed circuits, such as servers and telecommunications switches, which require a large number of electrically terminated transmission lines. Although embedded passive technologies have been under development since the early 1980's, very few approaches have been successful in meeting optimal performance tolerances. The inability to rework (exchange) an out-of-tolerance passive component after it has been embedded into the circuit board requires tolerances of ±1% of targeted performance for these components, since the failure of a single component causes the entire board value to be lost. Additionally, it is desirable for embedded passives to maintain their targeted performance tolerances over all anticipated operating temperatures to facilitate design and ensure circuit reliability. Operating temperatures typically range from −40° C. to +125° C. Most of the prior art on embedded passive technologies relies on thin film technologies that comprise a layer of material with uniform dielectric properties. Resistive metal thin films have demonstrated the greatest ability to achieve thermally stable performance with tolerances within ±1%.

As shown in FIGS. 5A, 5B, embedded resistors 119 typically comprise two metal sheets consisting of a conductive metal layer 121 and a resistive metal layer 123 that are affixed to respective dielectric layers 124, 125. The respective metal layers are patterned to produce conductive leads 127 within the conductive metal layer 121 and resistor elements 129, 130 in resistive metal layer 123. This results in the location of resistor elements 129, 130 over gaps 131, 132 between conductive leads 127 when the two laminated sheets are aligned and brought into contact as depicted in FIG. 5B. The resistance of the resistor elements, 129, 131 is controlled by the spacing of gaps 131, 132 between conductive leads 127, and the sheet resistivity and thickness of the resistive metal layer 123. Elemental resistance is determined by the spacing of gaps 131, 132 as the laminated resistive metal sheet will have uniform thickness and resistivity. In general, dimensional controls of the thin film metallic resistor elements 129, 130 will achieve tolerances of ±5% and laser trimming is used to bring the performance tolerance to within ±1% of the targeted value. Resistive thin films comprised of nickel (Ni) or platinum (Pt) have low thermal coefficients of resistance (TCR) that provide thermal stability within a tolerance of ±1% over operating temperatures. Primary reliability issues with thin film resistor elements 129, 130 include interactions with metallic electrodes 127 and/or the material forming dielectric layer 125 that cause metallic plaques to form, as well as mismatches between the thermal coefficients of expansion that may cause delamination between the thin film resistor elements 129, 130 and encapsulating dielectric 125.

Thin film techniques are also used to fabricate embedded capacitors. Demand for embedded capacitors has been driven largely by a need to suppress power noise in high-speed CMOS semiconductor circuits, wherein simultaneous flipping of switching devices draws a large surge current that is supplied by the power plane embedded in the circuit board to which the semiconductor device is attached. Power noise is generated in the circuit when inadequate charge is available from within the power plane to supply the surge current. Decoupling capacitors are used to suppress power noise in high-speed circuits. FIGS. 6A, 6B generally depict the use of embedded decoupling capacitors 131 to suppress power noise in a circuit comprising a circuit board 133 and a high-speed semiconductor chip 135. The power plane 137 is constructed as a laminate sheet capacitor consisting of a dielectric layer 139 inserted between two conducting metal sheets 141, 142 (FIG. 6A). One of the conducting metal layers 142 is patterned to provide floating ground planes 143 (FIG. 6B) in areas where the power plane 137 maintains electrical contact with a via 145 that supplies surge currents to the semiconductor device. Embedded decoupling capacitors 131, formed by dielectric layer 139 being located between the metal sheet 141 and the floating ground plane 143, collect and supply surplus charge to suppress power noise that can be created when there is inadequate stored charge to supply the surge current. C-Ply material manufactured by 3M Company utilizes a dielectric layer 139 that consists of an epoxy loaded with high-κ dielectric barium titanate powders. While these structures provide high sheet capacitance (6 nF/inch$^2$), higher capacitance values are desired. Furthermore, the dielectric powders loaded into the dielectric layer 139 have grain sizes (1-2 micron) that are inadequate to provide a low thermal coefficient of capacitance (TCC) and stable temperature performance. As such, 3M C-Ply decoupling capacitors are only rated to have X7R-type behavior (performance values within ±15% of the targeted value over anticipating operating temperatures). Fujitsu, Ltd. has reported the development of an aerosol deposition technique that forms a film of high-κ barium titanate ceramic at room temperature, which can be used to embed capacitors within a circuit board using an aerosol of pre-formulated ceramic powders. Grain sizes reported to be required to form high-quality films (0.05-2 micron) are also insufficient to maintain a TCC suitable for stable thermal performance or COG-type behavior.

FIGS. 7A, 7B show top and profile views of a passive inductor 150 embedded into an interconnect structure or printed circuit board 151. Inductor 150 typically comprises a coil structure 147, or a simple loop structure (not shown), configured on one or more dielectric sheets 152, with a feed line 149 supplying current to the coil 147, that is situated on a separate dielectric layer 153 located inferior (or superior) to the plane(s) upon which the coil is located. The dielectric layers 152, 153, 154 are generally comprised of the identical material used to construct the circuit.

U.S. Pat. No. 5,154,973 to Imagawa, et al., disclose a dielectric lens antenna that includes high-κ dielectric ceramic compositions prepared from powders with a mean particle size ranging between 1 and 50 micron that are mixed with an organic thermoplastic material. U.S. Pat. No. 5,892,489 to Kanba et al., disclose a chip antenna incorporating high-κ oxide ceramics formed from powders having a mean particle size of 10 microns. U.S. patent No. to K-D Koo, et al., disclose a chip antenna which comprises helically wound conductors formed by printing planar trace structures on dielectric sheets and assembling those sheets to form said chip antenna. U.S. Pat. No. 6,028,568 to K. Asakura, et al., disclose a chip antenna containing at least one folded antenna formed by printing conductor on a plurality of dielectric layers, wherein at least one dielectric layer is a magnetic material, and fusing said dielectric layers into a solid structure. U.S. Pat. No. 6,222,489 B1 to T. Tsuru, et al., disclose a chip antenna containing monopole or dipole antenna prepared by printing conductor traces on a plurality of dielectric layers, wherein each individual layer has uniform composition providing said individual layer with either a relative permittivity of $\epsilon_R$=1-130 or relative permeability of $\mu_R$ 1-7, and said plurality of layers is fused into a single component. U.S. Pat. No. 6,650,303 B2 to H. J. Kim, et al., disclose a chip antenna comprising a plurality of dielectric sheets, wherein each sheet has uniform composition throughout the sheet, and conductor leads that are configured to form a helical antenna. U.S. Pat. No. 6,680,700 B2 and U.S. Pat. No. 6,683,576 B2 to A. Hilgers disclose a chip antenna that comprises a core ceramic substrate having uniform dielectric properties and conducting metal traces on its periphery that is surface mounted to a circuit board. U.S. Pat. No. 6,025,811 to Canora et al. disclose a directional antenna with a closely-coupled director embedded or mounted on a circuit wherein the director element is a conductive element that has a rectangular cross-sectional profile. U.S. Ser. No. 10/265,351 filed by T. T. Kodas et al. disclose inkjet techniques to form conductive electronic materials from a colloidal suspension of nanoparticles in a low viscosity solvent. U.S. Ser. No. 10/286,363 filed by Koda et al. disclose direct-write (syringe-based) methods to form inorganic resistors and capacitors from a flowable high-viscosity precursor solution consisting of combination of molecular precursors and inorganic powders. U.S. Pat. Nos. 6,036,899 and 5,882,722 disclose methods and formulations to apply metallization layers using nano-particle pastes.

U.S. Pat. No. 6,027,826 to de Rochemont, et al., disclose articles and methods to form oxide ceramic on metal substrates to form laminate, filament and wire metal-ceramic composite structures using metalorganic (molecular) precursor solutions and liquid aerosol spray techniques. U.S. Pat. Nos. 6,323,549 and 6,742,249 to de Rochemont, et al., disclose articles that comprise, and methods to construct, an interconnect structure that electrically contacts a semiconductor chip to a larger system using at least on discrete wire that is embedded in silica ceramic, as well as methods to embed passive components within said interconnect structure using metalorganic (molecular) precursor solutions and liquid aerosol spray techniques. U.S. Pat. Nos. 5,707,715 and 6,143,432 to de Rochemont, et al., disclose articles and methods to relieve thermally-induced mechanical stress in metal-ceramic circuit boards and metal-ceramic and ceramic-ceramic composite structures prepared from a solution of metalorganic (molecular) precursors, and further discloses the incorporation of secondary phase particles (powders) in said solution of said solution of metalorganic (molecular) precursors. The contents of each of these references are incorporated herein by reference as if laid out in their entirety. U.S. Ser. No. 11/243,422 discloses articles and methods to impart frequency selectivity and thermal stability to a miniaturized antenna element, and the construction of simplified RF front-end architectures in a single ceramic module.

SUMMARY

One embodiment of the present invention provides an electrical component, comprising a ceramic element located on or in a dielectric substrate between and in contact with a pair of electrical conductors, wherein the ceramic element includes one or more metal oxides having fluctuations in metal-oxide compositional uniformity less than or equal to 1.5 mol % throughout the ceramic element.

The metal oxides may substantially consist of particles having a substantially uniform grain size. The grain size is measured along a major axis of each particle, and it is less than 1.5 times and greater than 0.5 times an average grain size contained in the ceramic element. The grain size is determined by controlling heat treatment during fabrication.

The ceramic element an electrical characteristic determined by which specific metal oxides are included. The electrical characteristic is effected by controlling average grain size using heat treatment during fabrication. The electrical characteristic of the ceramic element exhibits a substantially constant value which varies ≤1% over an operating temperature range of 40° C. to 120° C.

The ceramic element may be fabricated by causing simultaneous decomposition of metalorganic precursors. The simultaneous decomposition may be achieved by using rapid thermal annealing on deposited the metalorganic precursors. The ceramic element may be fabricated by depositing carboxylate salt precursors prior to the simultaneous decomposition. The precursors may be deposited as a wax compound. Radiant energy may be applied to the deposited precursors to cause the simultaneous decomposition.

The metal oxides may have a rutile, pyrochlore, perovskite, body-centered cubic, rhombic dodecahedron, rhombic trapezohedron crystalline phase, or mixtures thereof, that includes amounts of one or more of copper oxide (CuO), nickel oxide (NiO), ruthenium oxide ($RuO_2$), iridium oxide ($IrO_2$), rhomdium oxide ($Rh_2O_3$), osmium oxide ($OsO_2$), antimony oxide ($Sb_2O_3$), titanium oxide (TiO2), zirconium oxide (ZrO), hafnium oxide (HfO), tantalum oxide ($Ta_2O_5$), niobium oxide ($Nb_2O_5$), iron oxide ($Fe_2O_3$), and silicon oxide ($SiO_4$).

The ceramic element may include a resistive metal oxide material having an intrinsic sheet resistivity greater than 25 μΩ-cm. The ceramic element may also include a conductive metal oxide and further wherein the electrical component is a resistor. The metal oxides may have a rutile, pyrochlore, or perovskite crystalline phase that includes amounts of one or more of copper oxide (CuO), nickel oxide (NiO), ruthenium oxide ($RuO_2$), iridium oxide ($IrO_2$), rhomdium oxide ($Rh_2O_3$), osmium oxide ($OsO_2$), antimony oxide ($Sb_2O_3$), and indium-tin oxide. The metal oxides may be from the group consisting of: bismuth oxide ($Bi_2O_3$), lanthanum oxide ($La_2O_3$), cerium oxide ($Ce_2O_3$), lead oxide (PbO) and neodymium oxide ($Nd_2O_3$). The metal oxides may include alkaline earth metal oxides drawn from the group consisting of magnesium oxide (MgO), calcium oxide (CaO), strontium oxide (SrO), barium oxide (BaO), scandium oxide ($Sc_2O_3$), titanium oxide, ($Ti_2O_3$), vanadium oxide ($V_2O_3$), chromium oxide ($Cr_2O_3$), manganese oxide ($Mn_2O_3$), and iron oxide ($Fe_2O_3$). The metal oxides may substantially consist of particles having a substantially uniform grain size. The ceramic element may have a resistivity or resistance value which varies ≤5% over an operating temperature range of −40° C. to 125° C. The ceramic element may have a resistivity or resistance value which varies ≤1% over an operating temperature range of −40° C. to 125° C. The ceramic element can have a resistance value anywhere between 10 ohms and 50 mega-ohms. The ceramic element can have a resistance value anywhere between 1 ohm and 500 mega-ohms.

The electrical component may be a capacitor with the pair of electrical conductors forming opposing electrodes and the ceramic element forming a dielectric thereof. The one or more metal oxides may substantially consist of particles having a substantially uniform grain size.

The capacitor can have a capacitance value anywhere between 0.01 pF to 900 μF. Each of the pair of electrical conductors may include a separate enlarged area having an opposed orientation to each other with the ceramic element located there between. The electrical conductors and the ceramic element may form a sheet capacitor having a capacitance >20 nF/inch$^2$.

The pair of electrical conductors may be in the form of circuit board traces and create a multiplicity of closely spaced, interdigitated fingers for the opposing electrodes. The ceramic element may be located in a meandering gap formed between the interdigitated fingers, and the meandering gap may maintains a substantially constant spacing and even in curved or corner areas of the meandering gap.

The ceramic element may have a dielectric constant value which varies ≤5% over an operating temperature range of 40° C. to 120° C. The metal oxides may substantially consist of particles having a substantially uniform grain size which averages less than 70 nanometers. The ceramic element may have a dielectric constant value which varies ≤1% over an operating temperature range of 40° C. to 120° C. The metal oxides may substantially consist of particles having a substantially uniform grain size which averages less than 50 nanometers.

The ceramic element may have high permittivity, and the one or more metal oxides may have perovskite crystal structures and will generally have the chemical formula $M^{(1)}M^{(2)}O_3$, with metals from group $M^{(1)}$ and $M^{(2)}$ included in 1:1 molar ratios. Each group $M^{(1)}$, $M^{(2)}$ may include a plurality of metals with the combined molarity for each group being the same. The two metals, $M^{(1a)}$, $M^{(1b)}$, may be selected from group $M^{(1)}$ and two other metals may selected from group $M^{(2)}$, and the one or more metal oxides have the chemical formula $M^{(1a)}_{(1-x)}M^{(1b)}_{(x)}M^{(2a)}_{(1-y)}M^{(2b)}_{(y)}O_3$. The metal oxides of group M(1) may include: alkaline earth metal oxides selected from magnesium oxide (MgO), calcium oxide (CaO), strontium oxide (SrO), and barium oxide (BaO); alkali metal oxides selected from lithium oxide ($Li_2O$), sodium oxide ($Na_2O$), potassium oxide ($K_2O$), and rubidium oxide ($Rb_2O$); and heavy-metal oxides selected from the group including lanthanum oxide ($La_2O_3$), cerium oxide ($Ce_2O_3$), lead oxide (PbO) and neodymium oxide ($Nd_2O_3$). The metal oxides of group M(2) may include titanium oxide (TiO2), zirconium oxide (ZrO), hafnium oxide (HfO), tantalum oxide ($Ta_2O_5$), and niobium oxide ($Nb_2O_5$).

The pair of electrical conductors may be connected by one or more additional electrical conductors, which encircle the ceramic element to form an inductor. The inductor may exhibits an inductance anywhere over the range of 0.1 pH to 500 nH. The inductor may maintains its inductance value within ±1% over an operating temperature range of 40° C. to 120° C. The metal oxides may have a body-centered cubic crystalline phase, that includes iron oxide ($Fe_2O_3$) and amounts of one or more of: cobalt monoxide (CoO), nickel oxide (NiO), zinc oxide (ZnO), manganese oxide (MnO), copper oxide (CuO), vanadium oxide (VO), magnesium oxide (MgO) and lithium oxide ($Li_2O$) The electrical component of claim 42, wherein one metal oxide of the one or more metal oxides is silicon oxide ($SiO_4$) and the ceramic element adopts a rhombic dodecahedron or rhombic trapezohedron crystalline phase, and the other metal oxides include amounts of one or more of: aluminum oxide ($Al_2O_3$), iron oxide ($Fe_2O_3$), chromium oxide ($Cr_2O_3$), vanadium oxide ($V_2O_3$), zirconium oxide ($ZrO_2$), titanium oxide ($TiO_2$), silicon oxide ($SiO_2$), yttrium oxide ($Y_2O_3$), cobalt oxide ($Co_3O_4$), gadolinium oxide ($Gd_2O_3$) neodymium oxide ($Nd_2O_3$) and holmium oxide ($Ho_2O_3$).

The additional electrical conductors may form a coil around the ceramic element. The additional electrical conductors may include a multiplicity of additional conductors, including one or more second electrical conductors formed as circuit board traces and located beneath the ceramic element. Each of the one or more second electrical conductors may be elongated and have contact pads located at opposing ends thereof, wherein the multiplicity of additional conductors includes a plurality of electrical contact posts located on the contact pads and adjacent the ceramic element. The multiplicity of additional conductors may include one or more wire bonds located over the ceramic element and connecting the electrical conductor posts.

The ceramic element may include a plurality of ceramic elements embedded in the dielectric substrate and operatively interconnected. The plurality of ceramic elements may include first and second ceramic elements which each form a different type of passive component. The first and second ceramic elements may form a capacitor and an inductor, respectively. The plurality of ceramic elements may form an electronic filter.

The electrical component may further comprise an integrated circuit mounted on the dielectric substrate and operatively connected to one of the pair of electrical conductors. The ceramic element may include a plurality of ceramic elements embedded in the dielectric substrate, and further wherein the plurality of ceramic elements form an electronic filter. The electrical component may further comprise an antenna element operatively connected to the electronic filter.

The dielectric substrate may be one of a plurality of layers in a multilayer circuit board. One or more of the electrical conductors may include a contact pad, and further comprise an electrical conductor post positioned on the contact pad for providing electrical connection through the dielectric substrate to an adjacent layer in the circuit board. One or more other layers in the multilayer circuit board may include embedded electrical components. The electrical component may further comprise an integrated circuit mounted on one layer of the multilayer circuit board, and operatively connected to one of the pair of electrical conductors.

The dielectric substrate may be formed around the ceramic element. One or more of the electrical conductors and the ceramic element may be first formed on a base substrate. The base substrate may be removed before combining the dielectric substrate with other dielectric substrates to form a multilayer circuit board. One or more additional electrical components may be formed on top of the dielectric substrate at the level of a second layer of the multilayer circuit board, wherein a second dielectric layer is formed around the one or more additional electrical components to form the multilayer circuit board.

In another embodiment of the present invention, a method of fabricating an electrical component, comprises the steps of forming a ceramic element between and in contact with a pair of electrical conductors on a substrate including depositing a mixture of metalorganic precursors and causing simultaneous decomposition of the metal oxide precursors to form the ceramic element including one or more metal oxides.

The simultaneous decomposition may be achieved by using rapid thermal annealing of deposited metalorganic precursors. The ceramic element may be fabricated by depositing carboxylate salt precursors prior to the simultaneous decomposition. The precursors may be deposited as a wax compound. Radiant energy may be applied to the deposited precursors to cause the simultaneous decomposition. The metal oxides may have a rutile, pyrochlore, or perovskite crystalline phase that includes amounts of one or more of copper oxide (CuO), nickel oxide (NiO), ruthenium oxide (RuO2), iridium oxide (IrO2), rhomdium oxide (Rh2O3), osmium oxide (OsO2), and antimony oxide (Sb2O3). The metal oxides are formed having fluctuations in metal-oxide compositional uniformity less than or equal to 1.5 mol % throughout the ceramic element. The metal oxides may substantially consist of particles having a substantially uniform grain size. The grain size is measured along a major axis of each particle, and further wherein the grain sizes are less than 1.5 times and greater than 0.5 times an average grain size contained in the ceramic element. The grain size is determined by controlling heat treatment during fabrication.

Yet another embodiment of the invention provides an antenna, comprising: a folded antenna element having a maximum dimension D; and a meta-material dielectric body embedding the folded antenna element a distance S from an exterior surface of the meta-material dielectric body; wherein the meta-material dielectric body comprises a dielectric host have a relative permittivity $\in_R \leq 10$ and one or more dielectric inclusions having relative permittivity $\in_R < 10$; the distance S is greater than the protrusion length d of the folded antenna element's reactive near-field region, wherein the reactive near-field protrusion length d is defined as $d=0.62 \sqrt{(D^3/\lambda)}$, and $\lambda$ is the wavelength of an electromagnetic excitation emitted or received by the folded antenna element.

The dielectric host may be an organic dielectric. The organic dielectric may include FR4, Rogers Duroid or PFTE Teflon dielectric. The organic dielectric host may have a loss tangent tan $\delta \leq 10^{-3}$. The dielectric host may be an inorganic dielectric. The inorganic dielectric host may be a silica or alumina dielectric. The inorganic dielectric host may have a loss tangent tan $\delta \leq 10^{-3}$. The inorganic dielectric host may have a value for relative permittivity $\in_R$ that is stable over operating temperatures between −150° C. and +250° C.

A further embodiment of the present invention provides an antenna, comprising: a folded antenna element having a maximum dimension D; and a meta-material dielectric body embedding the folded antenna element a distance S from a dielectric inclusion contained within the meta-material dielectric body; wherein the meta-material dielectric body comprises a dielectric host have a relative permittivity $\in_R \leq 10$ and one or more dielectric inclusions having relative permittivity $\in_R > 10$; the distance S is greater than the protrusion length d of the folded antenna element's reactive near-field region, wherein the reactive near-field protrusion length d is defined as $d=0.62 \sqrt{(D^3/\lambda)}$, and $\lambda$ is the wavelength of an electromagnetic excitation emitted or received by the folded antenna element.

The present invention describes various embodiments that allow frequency-selective antennas to be configured as a spread-spectrum receiver and use high-k inclusions and closely coupled directors in a manner that imparts radiative gain.

BRIEF DESCRIPTION OF THE FIGURES

For a better understanding of the present invention, together with other and further aspects thereof, reference is made to the following description taken in conjunction with the accompanying figures of the drawing, wherein:

FIGS. 1A, 1B depict quadrature phase states used to encode a bit pair and a four bit packet as symbols by methods of phase shift keying and quadrature amplitude modulation, respectively;

FIGS. 2A, 2B, 2C are representative time domain pulse shapes of symbols encoded with different roll-off parameters;

FIGS. 3A. 3B, 3C are representative power spectral densities as viewed in the frequency domain of the time domain symbols presented in FIGS. 2A, 2B, 2C;

FIGS. 4A, 4B show the power spectral density for pulses modulated over a plurality of sub-carriers as the individual PSD components and when combined to form high data-rate, low bit error rate wireless communications link;

FIGS. 5A, 5B depict prior art for thin film embedded resistors;

FIGS. 7A, 7B depict prior art on thin film embedded inductors;

FIGS. 10A, 10B depict a method to apply a plurality of ceramic compositions in selective locations on a substrate surface using liquid aerosol sprays;

FIGS. 12A1, 12A2, 12B depict an alternative method to apply a plurality of ceramic compositions in selective locations on a substrate surface by printing LCD electroceramic using solid wax precursors;

FIGS. 13A, 13B depict top and side views of a ceramic resistor element;

FIGS. 14A, 14B depict top and side views of ceramic resistor arrays composed of elements having different resistive values;

FIGS. 16A, 16B, 16C, 16D depict embodiments and fabrication relating to a printed circuit board that contains electrically interconnected embedded discrete resistor components;

FIGS. 17A, 17B, 17C, 17D, 17E, 17F, 17G depict embodiments and fabrication relating to discrete capacitor components having COG-type behavior;

FIGS. 19A, 19B depict embodiments and fabrication relating to a sheet capacitor with COG-type behavior formed with metal foil electrodes;

FIGS. 20A, 20B, 20C depict embodiments and fabrication relating to embedding discrete capacitor elements in a dielectric layer;

FIGS. 23A, 23B, 23C, 23D, 23E, 23F, 23G depict embodiments and fabrication relating to discrete inductor coils;

FIGS. 27A, 27B depict embodiments and fabrication relating to a printed circuit board that contains electrically interconnected embedded resistors, capacitors, and inductors;

FIG. 28 depicts an antenna dimension;

FIGS. 29A, 29B, 29C depict a folded antenna element embedded in a meta-material dielectric that confines the antenna's reactive near field within the physical perimeter of the meta-material dielectric;

FIGS. 32A, 32B show representative conduction bands and corresponding VSWR profiles of a frequency-selective antenna.

DETAILED DESCRIPTION OF THE DRAWINGS

Figures 6A, 6B:
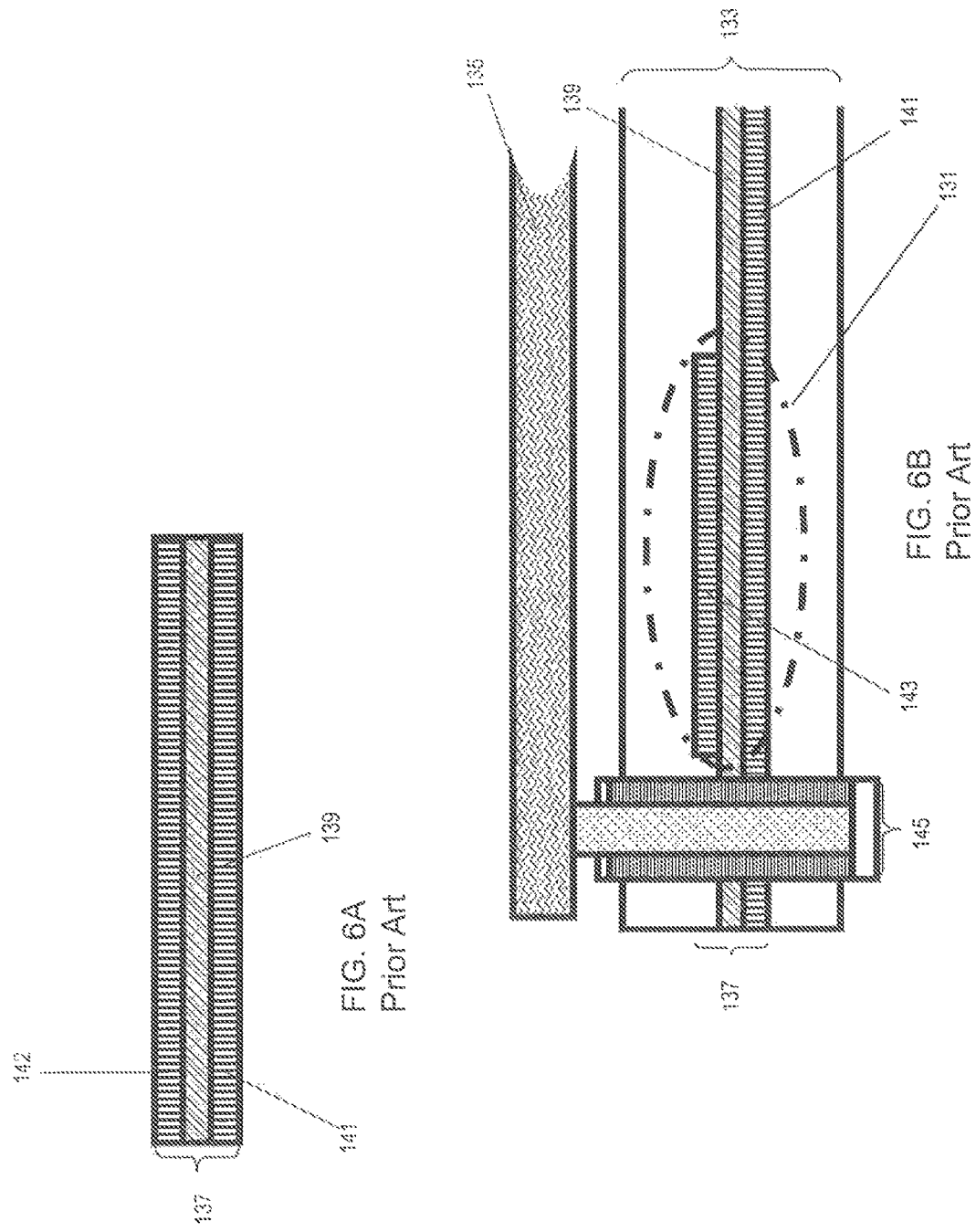
FIGS. 6A, 6B depict prior art on thin film embedded capacitors.

The following terms are used herein in the sense of their stated meanings.

The term circuit board is hereinafter defined to mean a passive circuit comprising a single dielectric layer or a plurality of stacked dielectric layers on which conductive traces have been printed or applied that is used to route electrical or electronic signals between one or more semiconductor devices, passive components, and power sources within a larger electronic system. For the purpose of this invention, circuit board may be understood to mean a back plane, a mother board, or a daughter card.

The term "interconnect" is hereinafter defined to mean passive circuit comprising a single dielectric layer or a plurality of stacked dielectric layers on which conductive traces have been printed or applied that is used to route electrical or electronic signals between one or more semiconductors, passive components, power sources, and a circuit board within a larger electronic system. For the purpose of this invention, interconnect is understood to mean a smaller wiring structure that is inserted between one or more semiconductor devices and a circuit board, such that the combination of the interconnect and the one or semiconductor devices functions as a module, or a subsystem module.

The term "electroceramic" is hereinafter defined to mean a ceramic composition that comprises two or more metal oxide components, wherein said metal oxide components have been selected to produce a specific electrical or dielectric response or physical property, such as, dielectric constant (principally defined by the materials relative permittivity ($\in_R$), relative permeability ($\mu_R$), and loss tangent (tan $\delta$)) or electrical resistivity, etc.

The term "ferroelectric" is used to define a state of spontaneous polarization generated by the collective displacement of ions within the lattice of certain ionic crystals that produces a state of internal electrical polarization without the application of an external electric field. Ferroelectric materials are characterized by a transition-temperature, known as the Curie transition-temperature, below which the ionic crystal displays paraelectric behavior.

The term "paraelectric" is used to define a condition in which a material does not possess internal electrical polarization in the absence of electrical fields.

The acronym "LCD" is hereinafter defined to refer to liquid chemical deposition. Liquid chemical deposition is hereinafter defined to mean the method whereby low-volatility metalorganic salt solutions containing metal oxide precursors to a desired ceramic composition, preferably carboxylate salt precursors, are used to deposit a desired oxide composition by means of a liquid aerosol spray on a substrate heated to temperatures between 250° C. and 500° C., preferably 325° C. and 430° C., or by means of a wax-based inkjet system on substrates held at temperatures below 350° C., preferably below 250° C.

The term "metalorganic precursor" is hereinafter understood to describe an organic molecule to which a specific metal atom has been attached to a carbon atom through an intermediate oxygen bond.

The term "organometallic precursor" is hereinafter understood to describe an organic molecule to which a desired metal atom has been attached directly to a carbon atom.

The term "meta-material dielectric" is hereinafter understood to describe a dielectric body that comprises a lower permittivity, non-magnetic host dielectric that contains at least one higher permittivity or high permeability ($\mu_R \neq 1$) dielectric inclusion within its body, wherein the inclusion has physical dimension that is small ($\leq \lambda/4$, preferably $\leq \lambda/8$) compared to the wavelength of an electromagnetic excitation propagating through or incident upon the meta-material dielectric body.

The term "nano-particle conductive pastes" is hereinafter understood to describe a flowable precursor that consists of fine metal particles, with particle dimensions ranging from 10 nm to 100 nm, and additional chemical additives that can be used to screen print or inkjet high quality metallization layers with low conversion temperatures in the range or 100° C. to 350° C.

The term "rapid thermal annealing" is hereinafter understood to describe a heating process wherein a combination of resistive heat and focused radiation are applied to material layers deposited on the surface of substrate in such a way that cause said deposited material layers to be heated to internal temperatures sufficient to initiate crystallization processes in said deposited materials for a short duration of time, but leaves said substrate largely unaffected by the rapid thermal annealing process even if said substrate is susceptible to change in material phase at internal temperatures significantly lower than those used to crystallize said deposited materials. Focused radiation normally is understood to mean an absorptive wavelength of infrared, visible, or ultraviolet light delivered using a laser, a pulsed laser, or one or more lamps. Focused radiation may also include microwave radiation. Controlled gas atmospheres may also need to be used during a rapid thermal annealing process.

The term "passive component" is hereinafter understood to describe an elemental resistor, capacitor, or inductor.

The term "standard operating temperatures" is hereinafter understood to mean temperatures in the range of −40° C. to +125° C.

Applicant hereby incorporates by reference herein the contents of co-pending U.S. patent application Ser. No. 11/243,422, filed Oct. 3, 2005, entitled CERAMIC ANTENNA MODULE AND METHODS OF MANUFACTURE THEREOF.

Methods and devices that provide a means to determine the power spectral density of transmitted symbols using passive, rather than computational methods, have value in reducing the power consumption and cost of a transceiver component used in mobile wireless systems. Furthermore, methods and devices that reduce the form factor of such simplified receivers are also desirable in mobile wireless systems. Precisely tuned passive circuitry with tuning parameters that remain stable with operational temperature, and which is not affected by the surrounding electromagnetic environment, plays an important role in providing the above benefits. Factors that make these circuits susceptible to de-tuning are related primarily to materials selection, the manufacturing methods used to process the selected materials and the design of the dielectric medium that envelopes one or more antennas contained within the module. In general, the tuning of an antenna is affected by dielectric materials that are located within the antenna's near-field radiation pattern. As discussed below, the antenna's near field pattern extends a distance, $d_{near\ field}$, away from the antenna element that is a function of the antenna's maximum dimension and its radiation wavelength. Near-fields often extend beyond the perimeter of the handheld device, which causes the antenna's tuning to change by the dielectric loads that are applied when the device is handled or brought close to the users' head. As discussed below, a specific objective of the present invention is to provide one or more antennas embedded within a dielectric medium that has been engineered to contain all or most of the antenna's reactive near-field within the device. This reduces external influences on the near-field and, in turn, stabilizes the antenna's electromagnetic tuning. Another specific objective is to provide circuits and manufacturing methods with the ability to integrate passive components and dielectric materials having a wide range of performance values on a single circuit layer, wherein said performance values have tolerances and thermal stability that is ≤±1% of the targeted value. This is achieved using liquid chemical deposition (LCD), alternatively referred to as spray-pyrolyzed metalorganic decomposition (SP-MOD) in de Rochemont et al., provides the means to achieve this need.

LCD uses liquid solution to mix one or more metalorganic salt precursors to one or more desired metal oxides at the molecular level. Low volatility metalorganic salts are preferred precursor compounds, specifically carboxylate salt compounds, and, in particular, carboxylate salt compounds having rank (number of carbon atoms) greater than 5. Carboxylate salt compounds with rank 5 or more are predisposed to decompose rather than evaporate at elevated temperatures. This allows a wide variety of precursor compounds to be intimately mixed at the molecular-level in solution, atomized into an aerosol spray and deposited on a substrate that is heated to temperatures elevated above the decomposition temperatures of said precursor compounds. Each species of metalorganic precursor will have a unique decomposition temperature, ranging roughly between 250° C. and 350° C. The molecular-level precursor subdivision achieved in the solution is replicated in the sprayed deposit when the substrate is heated to temperatures that initiate the simultaneous decomposition of all metalorganic species. LCD methods provide a means to achieve a very high degree of chemical uniformity in deposited materials and, more specifically, provide a means to prepare very precisely controlled materials formulations irrespective of the deposited materials' chemical complexity (number of distinct metal oxide components). LCD methods have demonstrated an ability to produce chemically uniform materials with control over metal stoichiometry that has a statistical variance ≤±1.5 mol %. Fluctuations in electroceramic composition that are less than 1.5 mol % have a negligible affect on dielectric performance when the electroceramic is processed into a state of controlled and uniform microstructure. The initial physical state of dielectric materials prepared using LCD methods is that of a solid solution/or glass, which has no discernible crystalline microstructure or grain/particle-size. Microstructure is now understood to have a very strong influence on the dielectric constant and physical properties of electroceramics. A uniform microstructure is a key characteristic of properly annealed LCD ceramics. Unlike powder processed ceramics, which provide a distribution of grain/particle sizes around a certain average where 20%-30% of the grains/particles will have diameters >1.5× the average grain/particle size, a properly annealed LCD 100% of the grains will have particle diameters that are ≤1.5× and ≥0.5× the average grain size, preferably 100% of the grains will have particle diameters that are ≤1.25× and ≥0.75× the average grain size. Proper annealing conditions include temperatures and redox atmospheres that are dependent upon specific ceramic compositions.

Figure 8:
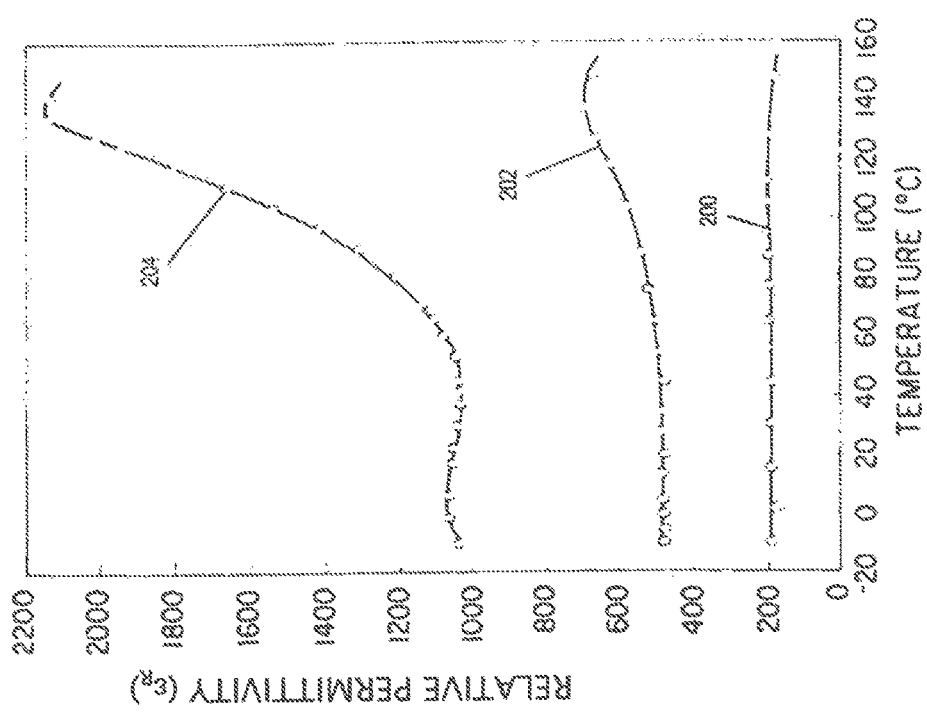
FIG. 8 depicts the influence grain-size has on dielectric response as a function of temperature in BST electroceramics.

FIG. 8 [referenced from Vest, Ferroelectrics, 102, 53-68 (1990)] depicts the dielectric constant as a function of temperature of a barium-strontium titanate (BST) electroceramic prepared from metalorganic precursors that was heat treated to produce identical materials compositions having three different grain sizes: 0.034 micron (μm) 200, 0.10 μm 202, and 0.200 μm 204, respectively. BST electroceramic is a dielectric material with high-κ properties that are useful in making small capacitors. As shown, BST electroceramic with grain sizes greater than 0.10 μm or 100 nanometer (nm) 202 exhibit very high dielectric constant values ($\in_R$>400) and ferroelectric behavior with a peak dielectric constant at a Curie transition temperature of approximately 135° C. The Curie transition temperature represents the temperature at which the dielectric will shift from paraelectric to ferroelectric behavior. In general, a larger grain size produces a higher dielectric constant and more strongly pronounced ferroelectric behavior, which is highly unstable with temperature. FIG. 8 also demonstrates a high relative permittivity ($\in_R$≥200) with a stable dielectric constant over temperature 200 when the ceramic grain/particle size is restricted to very small dimension ~34 nm.

In the case of high permittivity electroceramics, smaller grain sizes suppress the formation of critical domains that initiate cooperative interactions responsible for the paraelectric to ferroelectric phase transition. A BST electroceramic parallel plate capacitor, where total capacitance C is derived as:

$$C = A\in_o\in_R/d \quad (1)$$

Where A is the plate area, $\in_o$ is the permittivity constant for free-space ($\in_o$=8.854×10$^{-12}$ F/m), and $\in_R$ is the relative permittivity constant of the material, will have thermally unstable performance values when the ceramic contains grains have particle dimensions that are greater than 50-70 nm. Stable electrical performance (≤±1% of targeted performance values over designated operating temperatures) cannot be achieved in electroceramic capacitors formed from powder preparations due to their inability to control ceramic microstructure with the requisite precision. Although, recent advances in nano-powder technology claim fine powder preparations ranging from 10 nm to 80 nm, powder preparations do not permit uniform control over particle diameter. Particle diameter is typically defined as the length of the particle's major axis. In general, a given powder preparation will consist of a distribution of particle sizes with an average diameter, wherein 20%-30% of the distribution by volume will include particle diameters that are >1.5× larger than the distributions' average. Although the relationship between grain size (particle diameter) and value of dielectric performance is not linear, however, the curves for 202 and 204 in FIG. 8 clearly show that a simple doubling of grain size (particle diameter) of BST electroceramic can produce a dielectric response value that can be 2-3× larger than the average. Furthermore, powder processes require subsequent heat treatments to sinter or convert the ceramic that initiates larger grain growth, which heat treatments cannot be uniformly controlled to high precision with a distribution of particle sizes. Thus, even a narrow distribution of particles is not sufficient to control electroceramic performance tolerances to within ±1% of targeted values over standard operating temperatures. Certain electroceramics, particularly those compositions containing neodymium oxide (Nd$_2$O$_3$), will exhibit dielectric properties that are stable with temperature, but they will, in general also have, low relative permittivity, $\in_R$≤40. Therefore, electroceramics and methods or fabrication that provide devices with high relative permittivity ($\in_R \geq 50$), precise control over targeted values (tolerances<±1%), and stable thermal performance are desirable.

LCD electroceramics deposits initially form as a solid solution without any discernible grains. Subsequent heat or laser treatments can be used to supply energy to the electroceramic to nucleate specific microstructure states. The rate of grain growth within the ceramic is dependent upon the precise chemical composition at a nucleation site. LCD controls ceramic composition very precisely (≤±1.5%) throughout the deposit to assure uniform grain growth when energy in sufficient quantities is supplied to initiate nucleation. Thus a specific embodiment of the invention is its ability to fabricate capacitors using high permittivity ceramic electroceramics ($\in_R \geq 50$), generally known to exhibit ferroelectric behavior, that are provided stable temperature performance through uniform microstructure with grain sizes <70 nm, preferably <50 nm. In a further embodiment of the present invention, said capacitors are embedded within a circuit board or interconnect structure.

Reference is now made to FIGS. 9-12 to illustrate methods to fabricate electroceramic compositions useful to the design and construction of passive components having performance tolerances and thermal stability ≤±5%, preferably ≤±1%, that provide high performance functions for high frequency components. To achieve this goal, methods are provided to deliver a plurality of LCD precursor materials in selective locations across a single substrate layer, as well as methods to apply a single layer of high-quality electroceramic uniformly across an entire substrate surface. LCD materials fabrication starts with a solution preparation step that consists of reacting the metal precursors with a carboxylic acid solvent, preferably a carboxylic acid of rank 5 or higher, to form a carboxylic acid salt solution 206A, 206B, . . . , 206N for each metal oxide incorporated into the final deposit. A single component solution is used when the objective is to fabricate a single component (one metal oxide), a plurality of single component solutions are prepared when it is desirable to synthesize a mixed metal oxide material. Two carboxylic acid salts, 2-ethylhexanoate and neo-decanoate, are preferred for their superior liquid film forming and efficient pyrolytic decomposition properties. A preferred method to form a carboxylate salt involves driving an exchange reaction between said carboxylic acid with an initial high volatility lower rank metal precursor, such as an acetate salt, through vacuum distillation and filtering. While acetate salts represent a suitable lower rank precursor for use in the LCD process, other lower rank high volatility precursors can be used without restriction. Certain metals or semi-metals, such as titanium or silicon, have a very strong affinity to hydroxyl groups ($OH^-$), and an ideal chemistry for LCD processing can be permanently destroyed if these compounds are exposed to even minute amounts of oxygen or water vapor. In this instance, it is necessary to react these air/moisture-sensitive compounds in a dry, inert gas atmosphere, such as helium, argon, or dry nitrogen and to package, store, and handle the solutions under glove box conditions. In this instance, the inert gas should be introduced as purge gas into the vacuum distillation column.

The reacted solutions are then assayed to determine a precise molar concentration 208A, 208B, . . . , 208N. Inductively-coupled plasma atomic emission spectroscopy (ICP-AES) is the preferred assay method. The assayed solutions are then titrated and thoroughly blended to form a mixed solution 210 that contains a molar stoichiometry known to produce the desired stoichiometry after spray deposition when a multi-component electroceramic is desired. The mixed precursor solution is then filtered once more after blending the plurality of precursors. Solution stoichiometry will differ from the deposit stoichiometry and depend very strongly on specific characteristics of the deposition system. The precursor solution may have to be enriched with certain metal cation concentrations that might be prone to higher loss rates during the deposition process; however, metal cation loss rates are extremely predictable when all process parameters are tightly controlled. Solutions prepared with high rank carboxylate solutions are capable of dissolving high molar concentrations of carboxylic acid salts. Metal densities in solution are more conveniently expressed in terms of their percentage weight of equivalent oxides (wt % equiv. oxide), which allows a quick calculation to determine how much solid oxide material will be created from a given quantity of solution. For instance, 100 gms of a solution that has an 10% wt % equiv. oxide, will produce 10 gms of metal oxide material after the entire quantity of material has been deposited. In general, it is advisable to prepare solutions to have wt % equiv. oxide ranging from 0.001% to 25%, preferably 0.1% to 20%. Dilute solutions (0.001% to 1% wt % equiv. oxide, are preferred when making thin film materials (<1 micron thickness) using liquid aerosol spray deposition. More concentrated solutions, 1% to 25% wt % equiv. oxide, are preferred when fabricating precursor waxes, thick films (1 micron≤deposit thickness <1 mm), or bulk materials (thickness ≥1 mm). The prepared solution may then be deposited on a substrate heated to temperatures between 200° C. and 500° C., preferably 250° C. and 430° C., using a liquid aerosol spray 212 for curtain coating processes, or for blanket coating processes when it is intended to completely cover the substrate surface area. The deposition is then followed by a bake out step 213 at temperatures ranging between 300° C. and 600° C., preferably 350° C. and 450° C., to remove any residual organic material remaining in the deposit after the deposition process. Controlled gas atmospheres comprising dry air, an inert gas, such as nitrogen, helium, argon, or others, with or without partial pressure redox gases, such as oxygen, or mixtures of carbon monoxide and carbon dioxide may also be applied during the bake out process to accelerate the removal or residual organic compounds. The bake out step 213 may also comprise a rapid thermal annealing step. Most often, the deposited material remains as a solid solution with no visible crystallization after the bake out step 213. It is usually desirable to render the deposited material into an advanced state of crystallization with a precisely controlled microstructure therefore an optional annealing step 214, preferably a rapid thermal annealing step, is applied. Focused pulsed laser light, using a wavelength that is absorbed by the medium, is a preferred process to be used in the rapid thermal annealing step because it allows a very high degree of control over the energy/power delivered to the deposit during the optional annealing step 214. It is advantageous to use the pulsed laser light annealing in conjunction with other thermal controls described above.

A low cost technique to disperse a variety of ceramic compositions useful as passive components in selective locations over a single sheet or layer is preferred. A low cost technique to disperse a variety of ceramic compositions in selective locations over a single sheet or layer at room temperature or temperatures below 250° C. is also preferred. As a solution process, LCD technology is amenable to direct-write processing, which allows multiple material compositions to be applied locally on a single layer. While inkjet deposition systems would be a likely choice for this objective, a solid-solution deposit is preferred to realize the microstructure controls that achieve the best tolerances. As noted above, the solid-solution is formed when all liquid precursors are decomposed simultaneously. A multi-component precursor solution applied to the substrate at low temperature that is subsequently ramped through all precursor decomposition temperatures would initiate the sequential decomposition of multiple precursors. Sequential decomposition favors all the individual metal oxides to segregate from the solution as nano-nucleates that remain dispersed throughout the deposited material, which is disadvantageous to microstructure control. Applying the solutions to a substrate heated to temperatures sufficient to initiate the simultaneous decomposition of all metalorganic precursors preserves the molecular-level mixing achieved in the liquid solution. The boiling solvent and decomposition products generated with the simultaneous decomposition produces a "steam" of waste products to emanate from the deposit. This is disadvantageous to inkjet deposition systems as the steaming waste products will contaminate the printing heads. As shown in FIGS. 10A, 10B, localized deposition of multiple solutions can be achieved by applying a first liquid aerosol spray 218A of one particular precursor solution through a perforation 224 in a first solid mask 220A that is located above the heated substrate 222. This allows a first ceramic composition 226A to form on the substrate 222 in a select location. A second ceramic composition 226B (FIG. 10B) can then be formed in a second location by applying a second liquid aerosol spray 218B through a perforation in a second solid mask 220B. The solid masks 220A, 220B should have recesses 228 in the vicinity of the perforations 224 that prevent the solid masks 220A, 220B from pulling off the deposited ceramic compositions 226A, 226B when they are removed from the surface of the substrate 222. This method can be used to provide a plurality of ceramic compositions that have properties useful as resistors, capacitors, or inductors, or to provide ceramic compositions that might provide differing performance values for a set of resistor components, or a set of capacitor components or a set of inductor components at selective locations on the substrate's surface.

Figure 11:
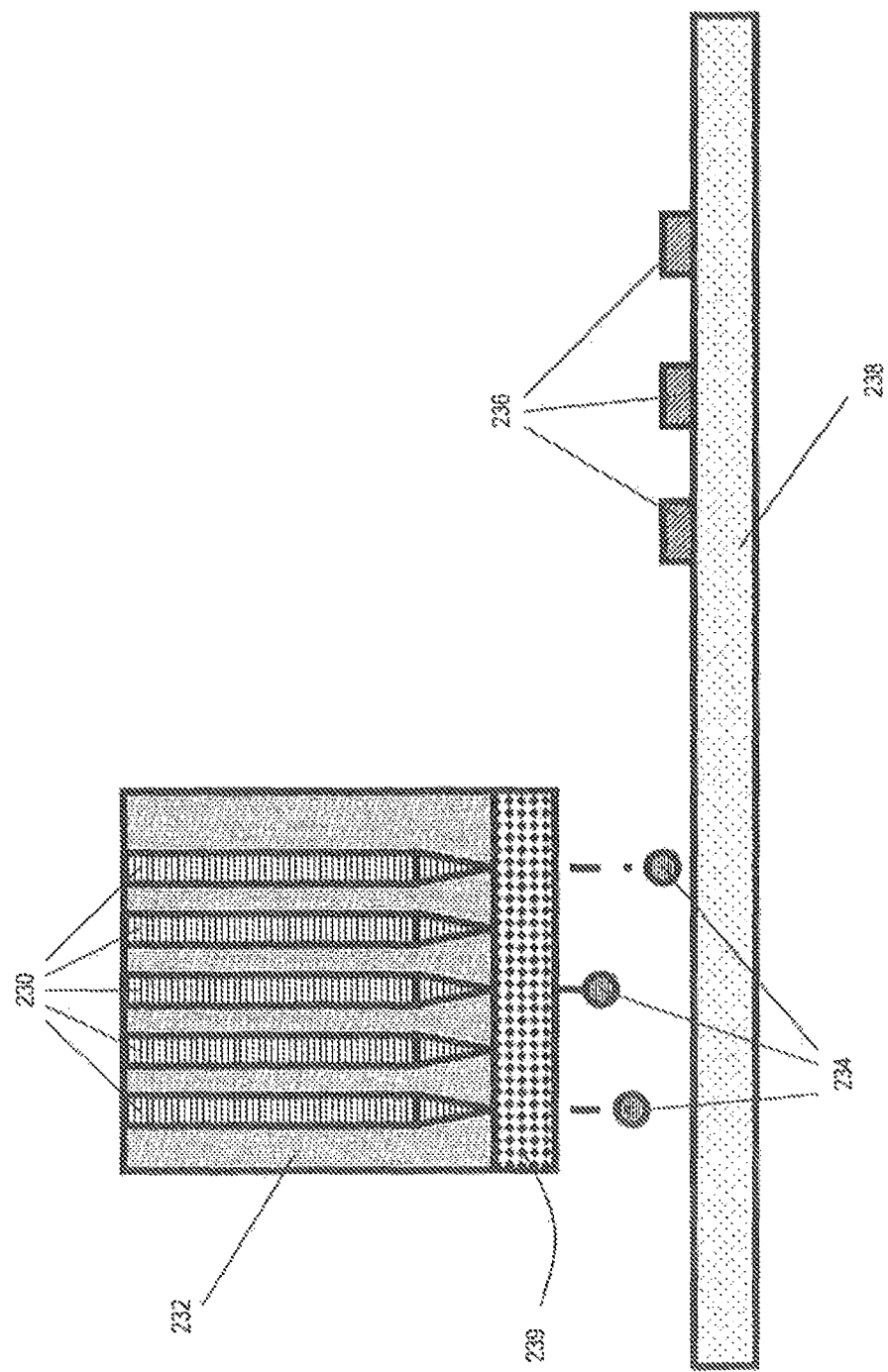
FIG. 11 depicts a method to apply a plurality of ceramic compositions in selective locations on a substrate surface by printing LCD electroceramic using solid wax precursors.
Figure 12B:
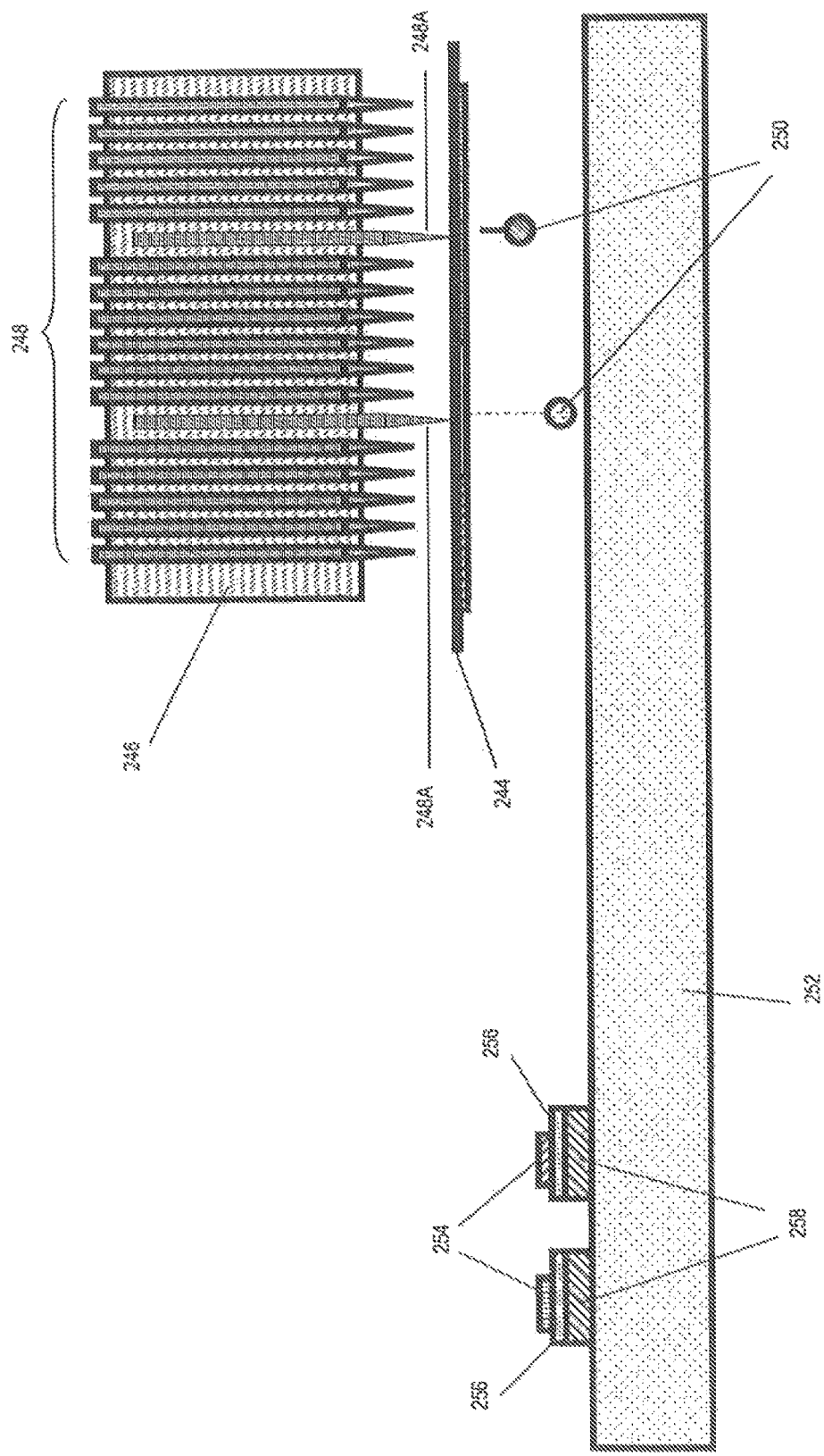

Another specific embodiment of the invention includes methods to locate a plurality of ceramic compositions at selective locations on the substrate surface at lower deposition temperatures. In this instance, the solvent is completely removed from mixed solution 210 using a solvent extraction step 215 (FIG. 9) to render the precursor into a solid wax that can be applied selectively to a substrate surface using a traditional wax printing system 216. Intermolecular forces within the waxy solid phase are strong enough to preserve the level of molecular mixing created in solution that inhibits phase segregation into single species oxides when the waxy solid is subsequently decomposed into the desired metal oxide ceramic. The creation of a solid wax phase precursor allows a number of conventional printing techniques to be used to deposit a plurality of different ceramic compositions on a single surface. FIG. 11 depicts one method that uses a plurality of wax sticks 230, each of which may contain precursors to a distinct ceramic composition, that are locally heated at the printer head 232 to liquefy the end of wax sticks 230 to cause droplets 234 of the precursor wax to solidify into a solid wax deposits 236 at selective locations across the surface of substrate 238 as the print head 232 traverses the substrate. The molten wax droplets 234 emerging from the printer head 232 may also be accelerated and directed by an inkjet processing stage 239.

FIGS. 12A1, 12A2, 12B make reference to an alternative wax printing technique wherein a plurality of wax precursor compositions 240A, 240B, 240C, 240D, etc. are applied to the surface of a tape 242 to form a precursor ribbon 244 with an alternating pattern of wax precursor compositions. One or more precursor ribbons 244 can then be feed off of a spool through a printing head 246 (FIG. 12B) that has an array of fine heated needles 248. Selective needles 248A in the array of needles 248 can be brought into contact with the precursor ribbon 244 as it passes in front of a print head and cause a specific precursor wax to melt into droplets 250 that adhere to a pre-selected location on the substrate 252, where it hardens in place as a solid precursor wax deposit 254.

The simultaneous decomposition of liquid aerosols at a substrate's surface generates a free-radical chemistry that causes the depositing metal oxides to bond aggressively to metal and dielectric surfaces. The decomposition cycle of the wax-based precursor does not share the same level of aggressive free-radical bonding between the metal oxide deposit and the substrate. These deposits show a preference for bonding to oxide surfaces over clean metallic surfaces. In this instance, a thin oxide layer 256 can be applied to the surface of a metallic electrode 258, to which wax precursors 254 will be applied to form an electroceramic. In order to better achieve performance tolerances and thermal stability ≤±5%, preferably ≤±1%, it is preferable to avoid the sequential decomposition of wax precursors that may cause agglomerations of single species oxides that disrupt fine microstructure controls. To maximize decomposition rates of the solid precursor wax deposits 254 an ultraviolet-assisted (UV-assisted) pyrolysis step 217 (FIG. 9), preferably a UV-assisted rapid thermal annealing pyrolysis step using focused energy in the form of microwave, infrared, or ultraviolet radiation, is applied to accelerate the initial decomposition of printed wax precursors into a solid solution of metal oxides. The UV-assisted pyrolysis step 217 is then followed by bake out step 213, and optional annealing step 214.

Reference is now made to FIGS. 13A-27B to describe physical embodiments for passive components having performance tolerances and thermal stability ≤±5%, preferably ≤±1% that are embedded within a circuit board or interconnect structure. A particular embodiment of the invention utilizes the selective deposition methods discussed above to form a plurality of passive components having a wide range of resistance, capacitance, inductance and impedance values on single layer. This embodiment may comprise a single class of passive component, for instance resistors only, or may combine all classes of passive components (resistors, capacitors, and inductors) on the single layer. As shown in FIGS. 13A, 13B, a discrete resistor element 270 consists of at least two conducting electrodes 260A, 260B that are affixed to a sacrificial substrate or layer 262. The at least two conducting electrodes 260A, 260B are derived from a low resistivity metal, such as copper, silver, or gold, or other metal or metal alloy with superior conducting properties. The two conducting electrodes 260A, 260B may be photolithographically patterned from thin film material, or they may be formed by direct-write methods, such as screen-printing or inkjet printing. Sacrificial layer 262 can be a peel-apart foil that generally comprises a high quality thin film used to form the conducting electrodes, a chemical stop layer, such as a chromate monolayer, and a more mechanically rugged carrier foil or plate. Sacrificial layer 262 may also comprise a dielectric surface. The materials selection for sacrificial layer 262 is predicated on its ability to withstand all future processing steps and the ease with which it can be removed at an appropriate point in the fabrication process. Resistive electroceramic 264 is selectively deposited between the conducting electrodes 260A, 260B. The thickness 265 of the resistive electroceramic 264, the width 266 of resistive electroceramic 264, and the spacing 268 between the two conducting electrodes 260A, 260B, are all selected to produce a targeted performance value for the resistive element 270, given the intrinsic resistivity (measured in Ω-cm) of the resistive electroceramic 264. The resistance value of a resistor element can also be finely tuned by laser trimming, which carves a recess 271 into the resistive electroceramic.

Figure 9:
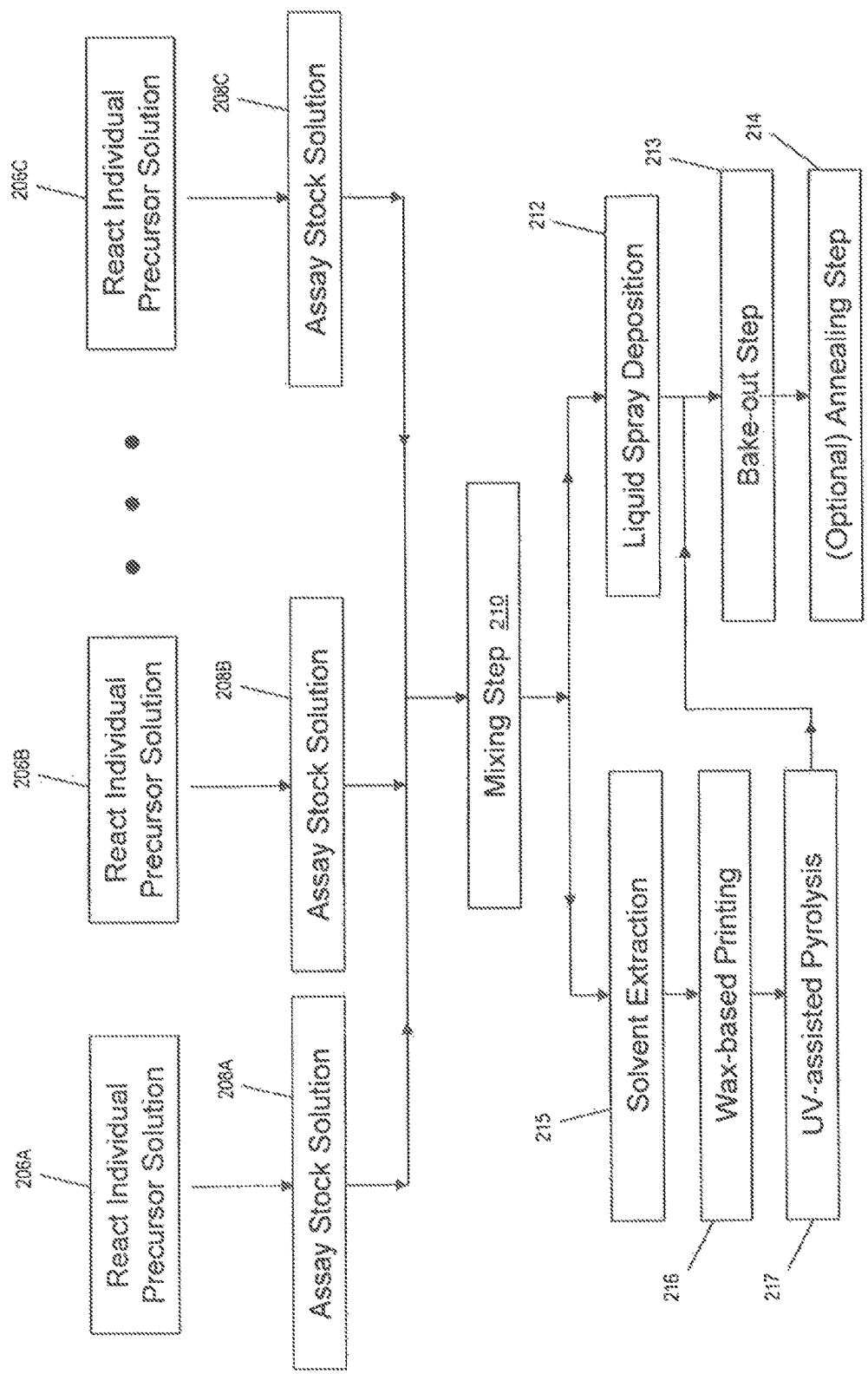
FIG. 9 is a flow chart describing the processes used to formulate a precursor solution that can be used to formulate a liquid aerosol spray or a solid wax useful in printing a plurality of ceramic compositions in selective locations on a substrate surface.

The intrinsic resistivity of the resistive electroceramic 264 is dependent upon electroceramic chemical composition and microstructure. Elemental resistors are characterized as having intrinsic sheet resistivity greater than 25 μΩ-cm. As mentioned above, LCD resistive electroceramic will exhibit the properties of an amorphous phase solid-state solution immediately after the bake-out step 213 (FIG. 9). Subsequent annealing steps 214 will nucleate grains within the deposit. The amorphous phase, which effectively has 0 nm grain size, will exhibit the greatest intrinsic resistivity. Electrical conductivity is generally greatest within a grain, and impaired as the current traverses a grain boundary. Therefore, a unit volume of a given electroceramic composition will have its highest intrinsic resistivity when it has 0 nm grain size, and will have its lowest intrinsic resistivity when that unit volume comprises a single grain. Similarly, a unit volume of resistive electroceramic comprising a large number of small grains (and grain boundaries) will have higher intrinsic resistivity than the same unit volume of identical electroceramic comprising a smaller number of grain boundaries and larger grains. It is often convenient to bundle passive components in arrays, wherein each component in the array could have identical resistance values. Alternatively, it is desirable for the passive component arrays to contain individual components that have sharply different resistance values.

A specific embodiment is shown in FIGS. 14A, 14B where each resistive electroceramic 272A, 272B, 272C, . . . , 272N, in an array 273 of resistive elements 274, is formed with identical volumes of identical electroceramic material to be selectively annealed using focused radiation such that each resistor element 275A, 275B, 275C, . . . , 275N, has different microstructure (grain size) and a measurably different resistance value. An additional embodiment for resistor arrays includes an array 276 of resistor elements 277A, 277B, 277C, . . . , 277N, consisting of resistive electroceramic 278A, . . . 278N having identical composition and microstructure, wherein a significant physical dimension, such as the length of the resistor element (as shown), 279A, 279B, 279C, . . . , 279N is altered to produce different resistance values. It is understood that the alterable significant physical dimension can alternatively be the resistive element thickness 265 or its width 266 as shown in FIGS. 13A, 13B. Yet another embodiment includes an array 280 in which selective deposition is used to produce resistors elements 282A, 282B, 282C, . . . , 282N that have different electroceramic compositions 284B, 284C, . . . , 284N and significantly different resistance values.

Resistive electroceramic compositions are usually classified in terms of their crystal structure and typically contain the following metal oxides as a primary component: copper oxide (CuO), nickel oxide (NiO), ruthenium oxide (RuO$_2$), iridium oxide (IrO$_2$), rhomdium oxide (Rh$_2$O$_3$), osmium oxide (OsO$_2$), and antimony oxide (Sb$_2$O$_3$). This group of primary metal oxides comprises the group of preferred electroceramic compositions. These single component resistive electroceramics adopt a rutile crystal structure, with the exception of antimony oxide (Sb$_2$O$_3$) and rhomdium oxide (Rh$_2$O$_3$), which have a trigonal crystal structures, and copper oxide (CuO) and nickel oxide (NiO), which have a cubic close-packed crystal structure. Intrinsic resistivity of the primary metal oxides with rutile crystal structures can be altered when the rutile primary oxides are combined together and with one or more transition-metal oxides and/or heavy-metal oxides in amounts that crystallize into a pyrochlore crystal structure. Intrinsic resistivity of the primary metal oxides with rutile crystal structures can also be altered when the rutile primary oxides are combined together and with one or more alkaline earth metal oxides and heavy-metal oxides in amounts that crystallize into a perovskite crystal structure. The compositional chemistry of these crystal structures generally adopt the following formulas:

$$M^{(1)}M^{(2)}{}_2O_7 \text{(pyrochlore)} \tag{2a}$$

$$M^{(3)}M^{(2)}O_3 \text{(perovskite)}. \tag{2b}$$

Where $M^{(1)}$ represents one or more trivalent transition-metal oxides and/or one or more trivalent heavy-metal oxides, $M^{(2)}$ represents one or more of the primary metal oxides with rutile crystal structure cited above, and $M^{(3)}$ represents one or more alkaline earth metal oxides. Preferred trivalent transition-metal oxides are from the group consisting of: scandium oxide (Sc$_2$O$_3$), titanium oxide, (Ti$_2$O$_3$), vanadium oxide (V$_2$O$_3$), chromium oxide (Cr$_2$O$_3$), manganese oxide (Mn$_2$O$_3$), iron oxide (Fe$_2$O$_3$). Preferred heavy-metal oxides are drawn from the group consisting of bismuth oxide (Bi$_2$O$_3$), lanthanum oxide (La$_2$O$_3$), cerium oxide (Ce$_2$O$_3$), lead oxide (PbO) and neodymium oxide (Nd$_2$O$_3$). Preferred alkaline earth metal oxides are drawn from the group consisting of magnesium oxide (MgO), calcium oxide (CaO), strontium oxide (SrO), and barium oxide (BaO). Indium-tin oxide (ITO) and antimony-tin oxide are preferred electroceramic compositions when there is a need to have an optically transparent conductor or resistive element, for instance in optical display applications.

Figure 15:
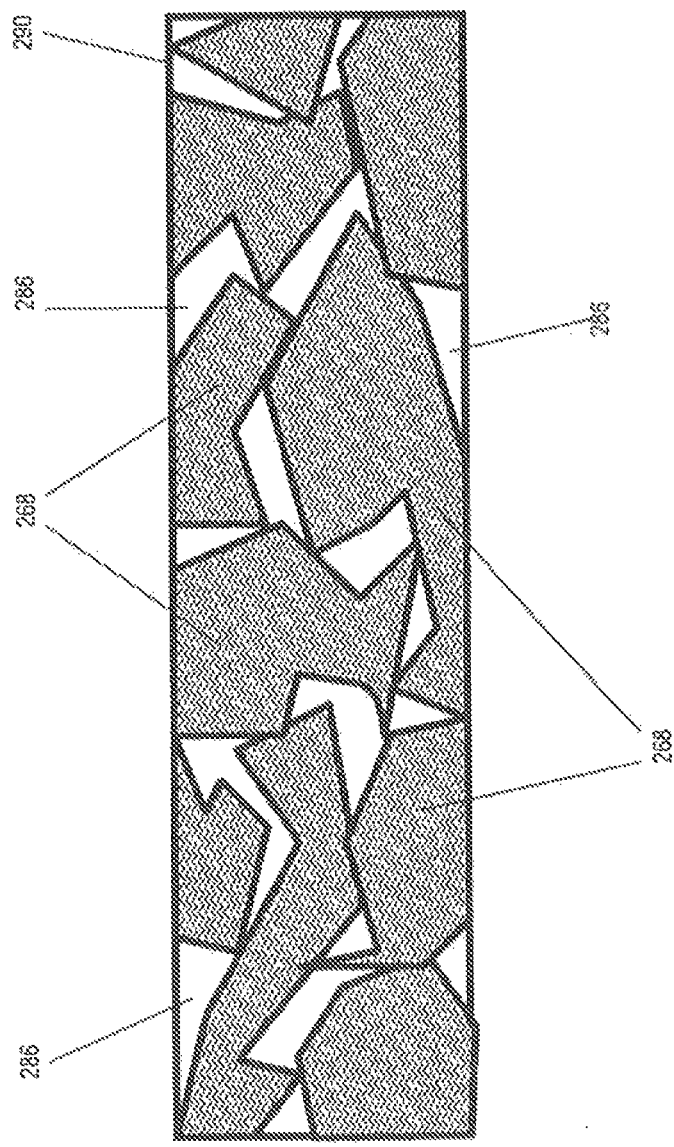
FIG. 15 depicts the microstructure of a mixed-phase resistive ceramic.

As shown in FIG. 15, electroceramic intrinsic resistivity can be increased if a strongly insulating oxide, such as silicon dioxide or aluminum dioxide precursor, is added in small amounts, 0.001-10 mol %, preferably 0.1-3 mol % to the solid state solution. These strongly insulating oxide phases 286 will separate out from resistive electroceramic phases 288 during the annealing step causing the combined mixed phase material 290 to have higher intrinsic resistivity.

As will be described below, a specific need of the invention requires electroceramic resistors having a wide range of resistance values, allowing the user to select precise resistance values from 1Ω to 500 mega-Ω, preferably resistance values selected from 10Ω to 50 mega-Ω. A further need requires these electroceramic resistor need to have thermal stability and performance tolerances ≤±5%, preferably ≤±1%, and to be integrated into at least one layer of a circuit board or interconnect that is in electrical communication with a semiconductor chip or another passive circuit element, including an antenna. The wide range of resistance values are derived by selectively depositing appropriate electroceramic compositions or appropriate electroceramic compositions blended with a small amount of strongly insulating oxides and controlling the microstructure of the electroceramic composition to have grain size ranging from 0 nm to 10 microns, preferably ranging from 0 nm to 2 microns.

Figure 16C:
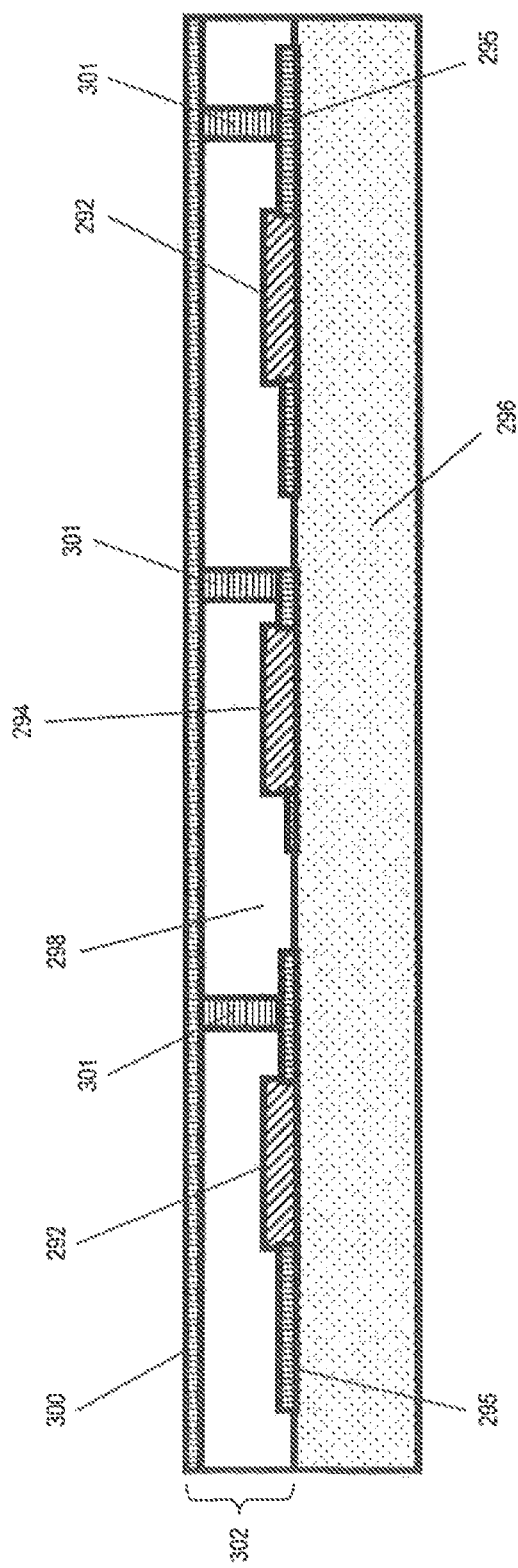

Reference is now made to FIGS. 16A, 16B, 16C, and 16D, to describe methods to embed a plurality of discrete resistors or resistor arrays into a circuit board or interconnect structure. FIG. 16A shows a top view of a substrate 296 having a discrete resistor 292 and a plurality of resistor arrays 294 selectively deposited at precise locations within a pad and trace electrode network 295 that is patterned on sacrificial substrate 296. The pad and trace electrode network 295 is used to route signals vertically and within the plane of the discrete resistors. The resistive electroceramic in each resistor element forming the discrete resistors 292 or resistor arrays 294 is selectively annealed using laser processes to render the resistive electroceramic composition(s) into a microstructure state that meets the targeted resistance value. The individual resistors may be tested and reworked, either through additional selective annealing or laser scribing, prior to further processing.

Once all resistor elements are fabricated within desired tolerances, an insulating dielectric layer 298, a metallization layer 300, and vertical interconnects (vias) 301 that maintain electrical communications between the metallization layer 300 and the pad and trace electrode network 295 are then applied to the structure as shown in FIG. 16C. The dielectric layer 298 may be an organic material, such as FR4, polyfluorotetraehylene (PFTE) Teflon, or Rogers Duroid materials. Alternatively, the dielectric layer 298 may be an LCD processed inorganic material, such as silica, alumina, or a silicate or aluminate dielectric using a curtain coating or blanket coating liquid aerosol spray. The metallization layer 300 may comprise ground or power planes, or may be patterned to function as a signal routing network. The metallization layer 300 may be applied using a variety of techniques, such as a metal sheet that is bonded to the dielectric layer through an adhesive agent, or through direct-write methods, such as screen printing or inkjet printing, preferably using low-temperature nano-particle pastes. It is recommended to use a low-temperature metallization technique so the formed structure is subject to maximum temperatures that will not alter the microstructure of the embedded electroceramic. The layer structure 302 comprising at least one pre-tested embedded resistor element 292 or resistor array 294 in electrical communication with a pad and trace electrode network 295 and the metallization layer 300 is then separated from the sacrificial substrate 296.

Figure 16D:
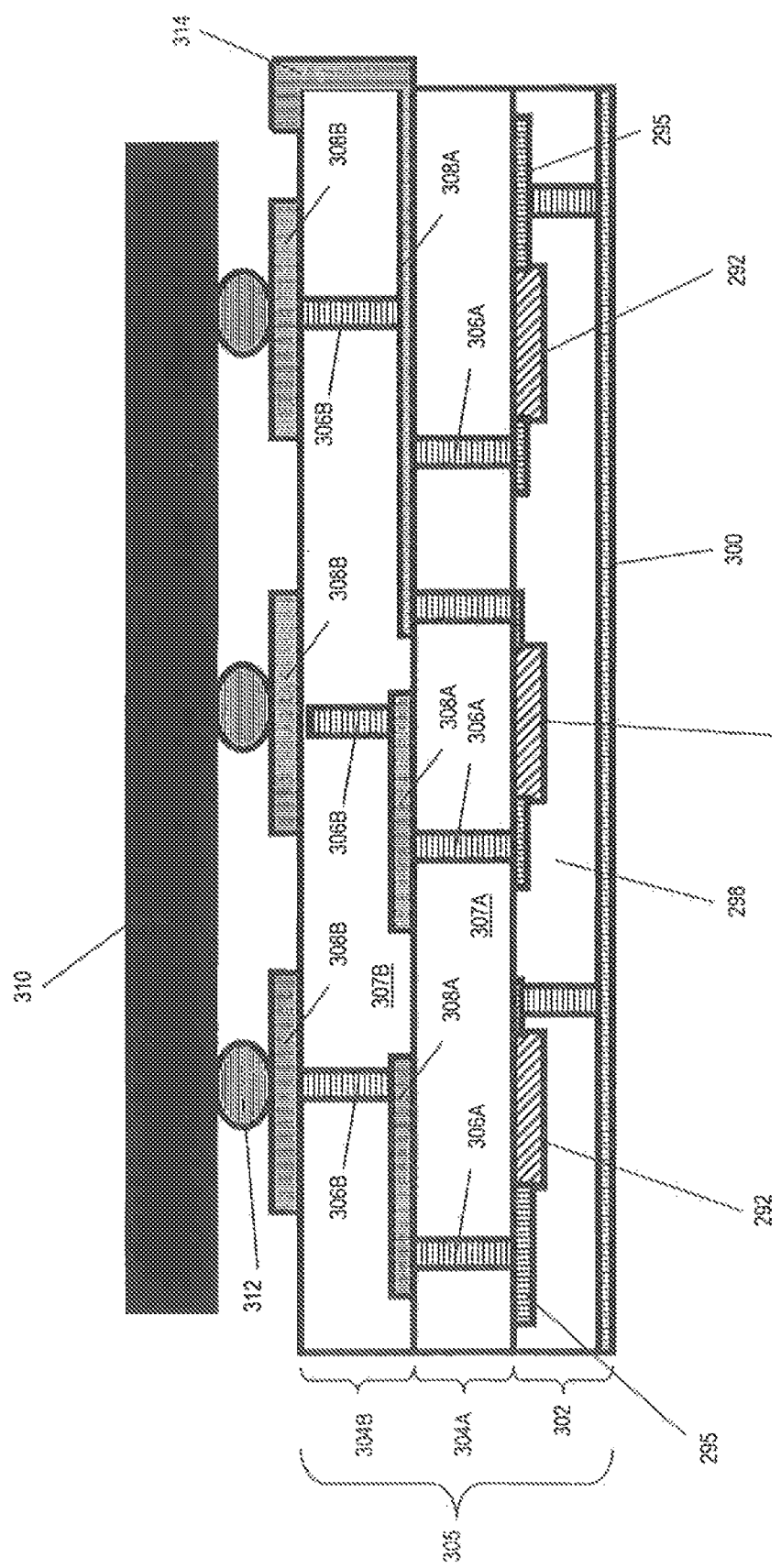

The embedded resistor layer structure 302 can then be combined with one or more additional signal routing layers 304A, 304B into a stacked multilayer structure 305 as shown in FIG. 16D. Signal routing layers 304A, 304B contain vias 306A, 306B within a dielectric material 307A, 307B that maintain electrical communication between the metallization layers 308A, 308B of each signal routing layer 304A, 304B and the embedded resistor components 292 and 294. The metallization layers 308A, 308B may include, in whole or in part, signal traces or power and or ground planes. This embodiment thereby provides electrical communication between the embedded resistor 292 and resistor arrays 294 and a semiconductor device 310 through conductive means 312 in electrical contact with a surface metallization layer 308B, or an external device (not shown) through an electrical contact 314 located on the periphery of the stacked multilayer structure 305.

Reference is now made to FIGS. 17A, 17B, 17C, 17D, 17E, 17F, and 17G that describe methods to embed discrete capacitor components having thermal stability and performance tolerances ≤±5%, preferably ≤±1%, within a printed circuit board or an interconnect structure. As shown in FIGS. 17A, 17B, the discrete parallel plate capacitor 316 is one embodiment for a discrete capacitor element. It consists of dielectric material 317 having relative permittivity $\in_R \geq 10$, preferably $\in_R \geq 100$, inserted between a top electrode 318 and a bottom electrode 319. The relative permittivity ($\in_R$) and thickness (d) 321 of the dielectric material 317, and the surface area 322 of the top 318 or bottom 319 electrodes, which ever is smaller, principally determine the total capacitance of the discrete capacitor element 316, in accordance with equation (1). The parallel plate capacitor is assembled by patterning the bottom electrode 319, at least one trace conductor 323 and a via pad 324 in a metallization layer affixed to a sacrificial substrate 325, using the methods discussed above. Tight dimensional controls on the dielectric thickness 321 and the electrode surface areas 322 are required to achieve high tolerance. A preferred embodiment for a discrete capacitor element is shown in FIGS. 17C, 17D, 17E, 17F and 17G. The inter-digitated capacitor 326 incorporates two opposed electrodes 328A, 328B that are patterned into a single metallization layer that has been applied to a sacrificial substrate 330. Each electrode has respective electrode fingers 332A and 332B that are interleaved with the fingers of the opposed electrode to produce meandering line capacitance in the gap between the two sets of fingers. High permittivity electroceramic 333 (FIGS. 17E, 17F) is selectively deposited on and between the electrode fingers 332A, 332B to fill the gap spacing 334 that exists between the opposed electrode fingers 332A, 332B and complete the capacitor 326. To first order, the capacitance is determined by the gap spacing 336 between fingers 332A and 332B, the mean finger length 337 and the dielectric permittivity of the electroceramic 333. Therefore, manufacturing to high tolerance is limited to maintaining tolerance controls over a two process parameters: the accuracy of the patterned electrode fingers 328A, 328B and the chemical/microstructure properties and thickness 338 of the high permittivity electroceramic 333. The occurrence of strong fringing fields 339 (FIG. 17D) that protrude above the electrodes 328A, 328B is an artifact of inter-digitated capacitors that can affect tolerances. The extent to which these fields protrude is inversely proportional to the relative permittivity ($\in_R$) of the high-κ electroceramic 333. The high permittivity electroceramic 333 should have a relative permittivity $\in_R \geq 50$, and preferably $\in_R \geq 100$, with respective thicknesses 338 (FIG. 17F) that are ≥10 μm, and ≥6 μm, respectively, to mitigate the affect of fringing fields on tolerance. Performance tolerance controls are also improved by maintaining uniform line capacitance within the device. Therefore, it is an additional preferred embodiment to utilize curved edges 340A, 340B (FIG. 17G) at the end points where the electrode fingers 332A, 332B interlock to preserve uniform spacing 334 throughout the capacitor's meander path. The discrete inter-digitated capacitor 326 maintains electrical communication to via pads 342A, 342B through one or more electrical traces 344A, 344B making electrical contact with the electrode fingers 332A, 332B.

Figure 18:
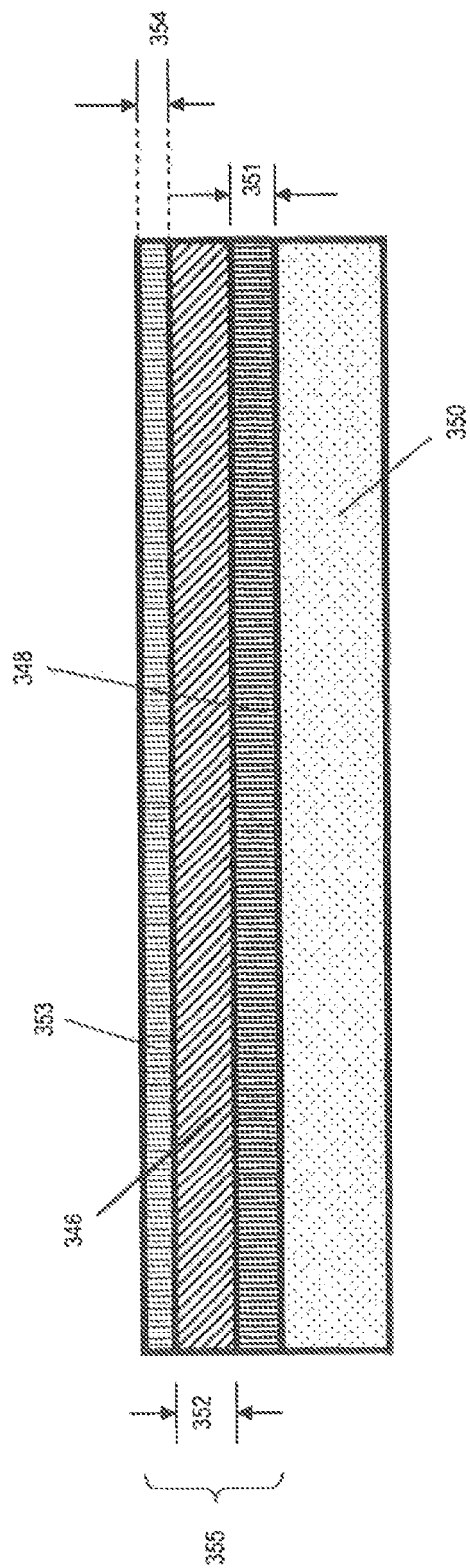
FIG. 18 depicts embodiments and fabrication relating to a sheet capacitor with COG-type behavior with an electrode formed from nano-metallic pastes.

A further need of the invention includes distributed sheet capacitance or decoupling capacitors that have COG-type behavior. COG-type behavior refers to a capacitance value that changes ≤±250 ppm/° C. Therefore, a COG-type capacitor will hold its performance value within 4.1% of its target over temperatures ranging from 40° C. to 125° C. As noted above, decoupling capacitors have value in suppressing power noise. Reference is now made to FIGS. 18, 19A, and 19B to describe a method to fabricate a sheet capacitor 355 having sheet capacitance ≥20 nf/inch$^2$, preferably having sheet capacitance ≥150 nf/inch$^2$, and has performance tolerance ≤±5%, preferably ≤±1% over the temperature range from −40° C. to 125° C. High permittivity LCD electroceramic 346 is applied to a conducting sheet electrode 348 that is affixed to a sacrificial substrate 350. More specifically a reusable metal foil, such as a nickel foil, provides malleable, yet stable mechanical substrate to the thin films assembled on its surface. The thickness 351 of the conducting sheet electrode 348 ranges between 1 µm and 2 mm, preferably 20 µm and 200 µm. High permittivity electroceramic 346 is applied to the conducting sheet electrode 348 using the LCD liquid aerosol spray process described in FIG. 9, and subjected to an annealing process, preferably a rapid thermal annealing process, that renders the high permittivity electroceramic 346 into a paraelectric microstructure that provides maximal relative permittivity, $\in_R \geq 50$, preferably $\in_R \geq 150$, and stable thermal performance. The high permittivity electroceramic 346 has thickness 352 in the range of 10 nm to 2 mm, preferably 500 nm to 100 µm. A top electrode layer 353 is applied using a low-temperature nano-particle paste to have thickness 354 ranging from 1 µm to 1 mm, preferably 25 µm to 50 µm. The sacrificial substrate 350 is removed to produce sheet capacitor 355 prior to inserting it into a printed circuit board or interconnect structure.

FIGS. 19A and 19B depict an alternative method to fabricate a sheet capacitor 356. High permittivity electroceramic 358A, 358B is applied to two separate conducting metal foils 360A, 360B to produce metal-ceramic laminates 362A, 362B. The metal-ceramic laminates 362A, 362B are then brought together ceramic-face 364A to ceramic face 364B. The combined metal-ceramic-metal structure 356 is then hot-pressed/hot-rolled at temperatures ranging from 600° C. to 900° C. for a period ranging from 2 minutes to 2 hours, preferably 5 minutes to 1 hour, to render the high permittivity electroceramic 366 into a paraelectric microstructure that provides maximal relative permittivity, $\in_R \geq 50$, preferably $\in_R \geq 150$, and stable thermal performance. Applied mechanical pressure 368 should range between 5 tons/inch$^2$ and 200 tons/inch$^2$. A dry atmosphere that does not contain oxygen is used for oxidation-sensitive metals, such as copper. In this instance, reduction-oxidation (redox) controls can be established using partial-pressure carbon monoxide/carbon dioxide mixtures in the oxygen-free atmospheres.

As noted above, a thermally stable capacitance value is a specific objective. FIG. 8 depicts how fine control over microstructure can stabilize electroceramic relative permittivity. Electroceramic composition impacts dielectric strength. High permittivity is related to high electron density of the material. Therefore, electroceramic compositions comprised of heavy-metal oxides are preferred when maximizing relative permittivity, as the heavy-metals contribute higher electron densities. A specific embodiment of the invention provides thermal stability to discrete capacitors 316, 326 or sheet capacitors 356 by limiting the microstructure of the above referenced high permittivity electroceramics to grain sizes ≤70 nm, preferably ≤50 nm throughout the LCD deposits. Embedded capacitors components (discrete or sheet) having thermally stable capacitance values ranging from 0.01 pF to 900 µF with tolerances of ≤±5%, preferably ≤±1%, is a specific embodiment of the invention.

High permittivity electroceramics preferred under this invention have perovskite crystal structures and will generally have the following chemical formula.

Where metals from group $M^{(1)}$ and $M^{(2)}$ exist in 1:1 molar ratios. It is possible for a plurality of metals to be represented within each group; however, the combined molarity for each group must remain the same. For instance, if two metals, $M^{(1a)}$, $M^{(1b)}$, are selected from group $M^{(1)}$ and two other metals are selected from group $M^{(2)}$, the chemical formula (3) is modified as:

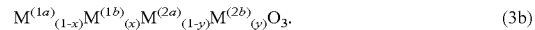

Group $M^{(1)}$ metal oxides preferred for use in high permittivity electroceramics include: alkaline earth metal oxides selected from the group consisting of magnesium oxide (MgO), calcium oxide (CaO), strontium oxide (SrO), and barium oxide (BaO); alkali metal oxides selected from the group including lithium oxide ($Li_2O$), sodium oxide ($Na_2O$), potassium oxide ($K_2O$), and rubidium oxide ($Rb_2O$); and heavy-metal oxides selected from the group including lanthanum oxide ($La_2O_3$), cerium oxide ($Ce_2O_3$), lead oxide (PbO) and neodymium oxide ($Nd_2O_3$). Group $M^{(2)}$ metal oxides preferred for use in high permittivity electroceramics include: titanium oxide (TiO2), zirconium oxide (ZrO), hafnium oxide (HfO), tantalum oxide ($Ta_2O_5$), and niobium oxide ($Nb_2O_5$).

Figure 20C:
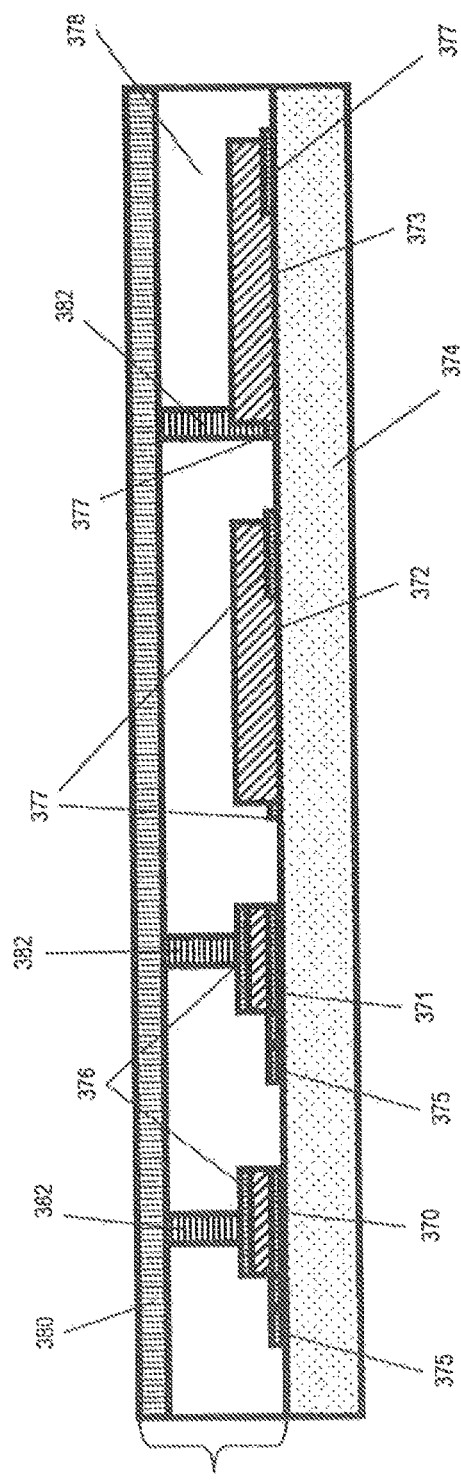

Reference is now made to FIGS. 20A, 20B, and 20C to describe methods to integrate discrete capacitors and sheet capacitors into an embedded discrete capacitor layer 369 that can subsequently be incorporated into a printed circuit board or interconnect structure. Discrete parallel plate capacitors 370 or capacitor arrays 371 and inter-digitated capacitors 372 or capacitor arrays 373 are fabricated on a sacrificial substrate 374. Each discrete parallel plate capacitor 371, 372 possesses via pads 375 and upper electrodes 376 that are used to make subsequent electrical connections. Each discrete inter-digitated capacitor 372, 373 possesses two via pads 377 that are used to make subsequent electrical connections. As shown in FIG. 20C, once all capacitor elements are fabricated within desired tolerances, an insulating dielectric layer 378, a metallization layer 380, and vertical interconnects (vias) 382 that maintain electrical communications between the metallization layer 380 and the via pads 375, 377 or upper electrodes 376 (where desired) are then applied to the structure. The dielectric layer 378 may be an organic material, such as FR4, polyfluorotetraehylene (PFTE) Teflon, or Rogers Duroid materials. Alternatively, the dielectric layer 378 may be an LCD processed inorganic material, such as silica, alumina, or a silicate or aluminate dielectric using a curtain coating or blanket coating liquid aerosol spray. The metallization layer 380 may comprise ground or power plane, or may patterned to function as a signal routing network. The metallization layer 380 may be applied using a variety of techniques, such as a metal sheet that is bonded to the dielectric layer through an adhesive agent, or through direct-write methods, such as screen printing or inkjet printing, preferably using low-temperature nano-particle pastes. It is recommended to use a low-temperature metallization technique so the formed structure is subject to maximum temperatures that will not alter the microstructure of the embedded electroceramic. The embedded discrete capacitor layer 369 comprising at least one pre-tested embedded discrete capacitor element 370 or 371 in electrical communication with a via pad 375, 377 or via 382 is then separated from the sacrificial substrate 374 for use in a printed circuit board or interconnect structure.

Figure 21A:
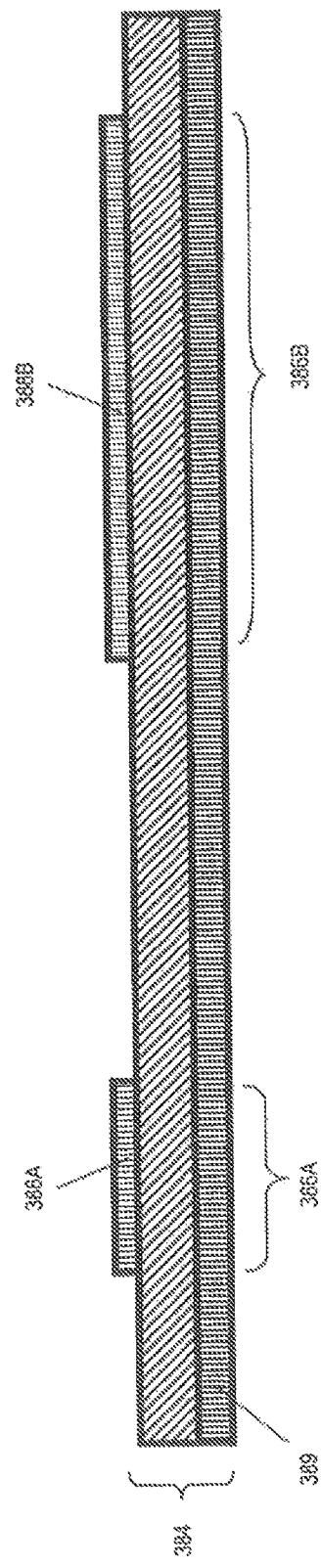
FIGS. 21A, 21B depict embodiment and fabrication relating to embedded capacitors derived from a sheet capacitor layer.
Figure 21B:
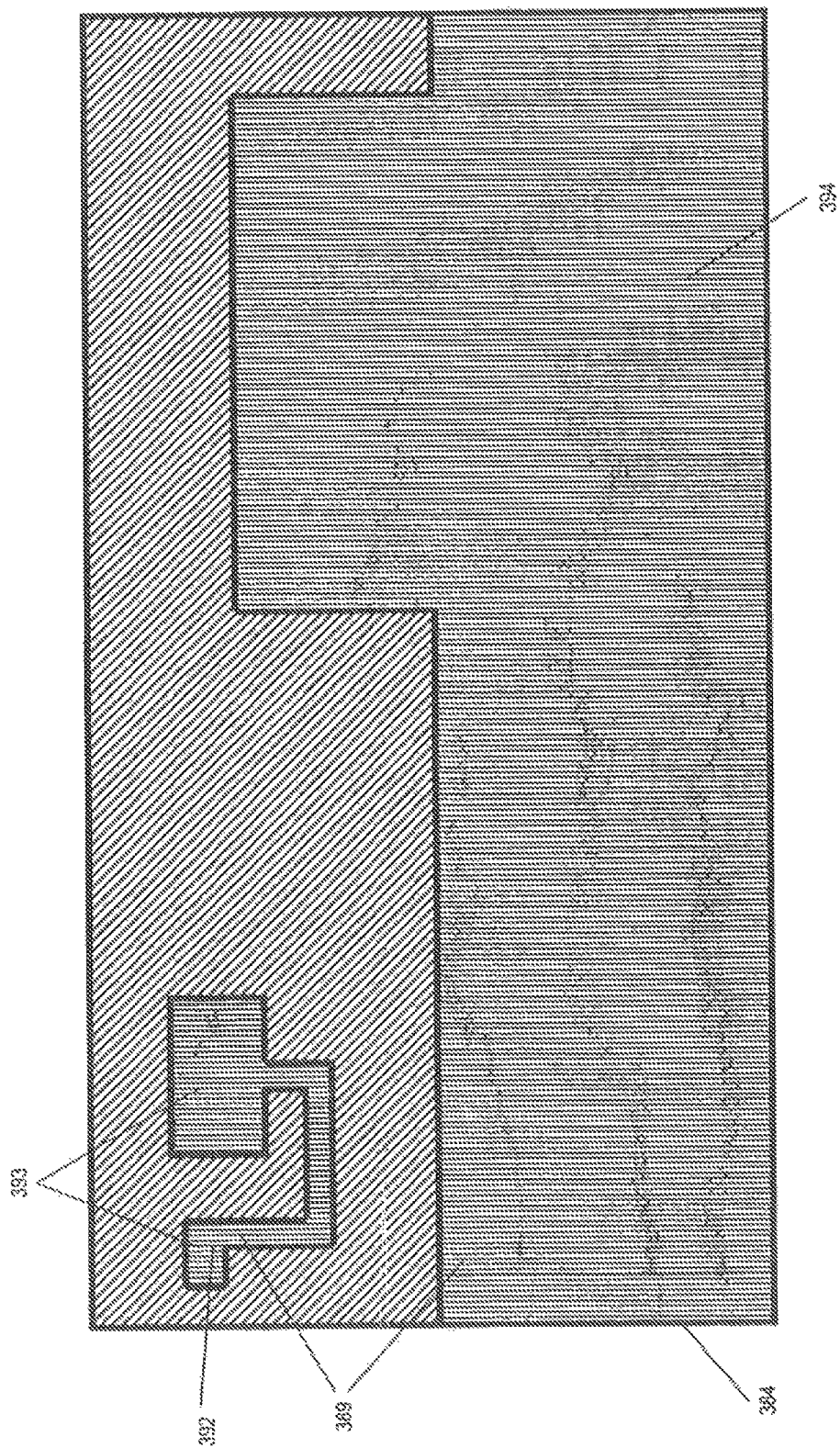
Figure 22:
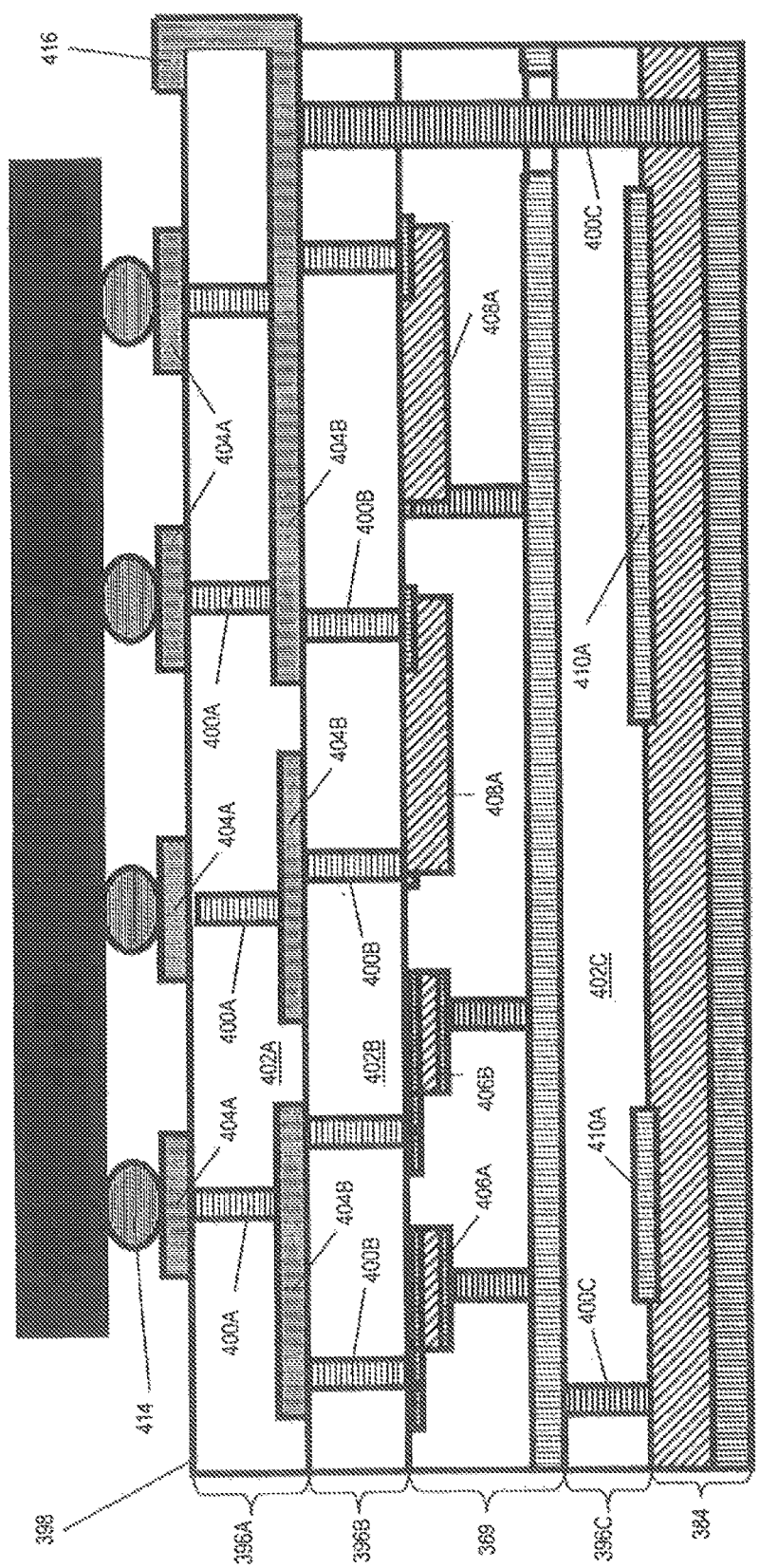
FIG. 22 depicts a printed circuit board that contains electrically interconnected embedded discrete and sheet capacitors.

Reference is now made to FIGS. 21A, 21B and 22 to describe methods to embed discrete and sheet capacitors with COG-type behavior into a printed circuit board or interconnect structure. As shown in FIGS. 21A, 21B, conducting electrode material from sheet capacitor with COG-type behavior is selectively removed using a subtractive process to produce a sheet capacitor layer 384 containing one or more parallel plate capacitors 386A, 386B with floating ground planes 388A, 388B and a metallization layer 389 that contain signal traces 392, pads 393, or functions as a power plane 394. The sheet capacitor layer 384 and/or an embedded discrete capacitor layer 369 (FIG. 20C) can then be combined with one or more additional signal routing layers 396A, 396B, 396C into a stacked multilayer structure 398. Signal routing layers 396A, 396B, 396C contain vias 400A, 400B, 400C and metallization 404A, 404B, 404C used to conduct signals within dielectric material 402A, 402B, 402C. This electrical network is used to maintain electrical communication between the embedded capacitor components 406A, 406B, 408A, 408B and 410A, 410B and a semiconductor device 412 through conductive means 414 in electrical contact with a surface metallization layer 404A, or an external device (not shown) through an electrical contact 416 located on the periphery of the stacked multilayer structure 398.

Figure 23B:
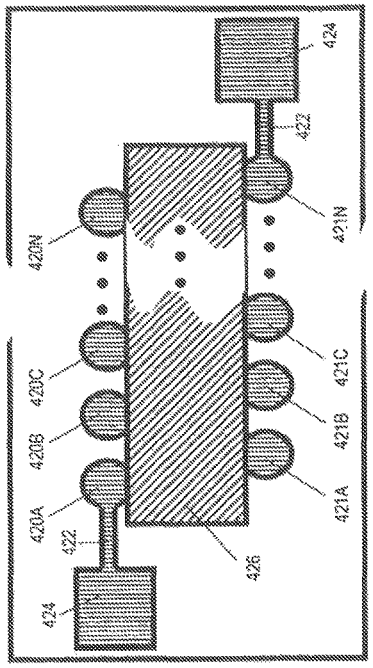
Figure 23C:
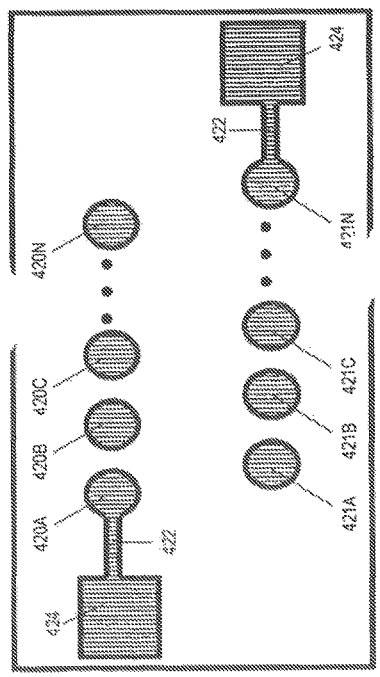
Figure 23D:
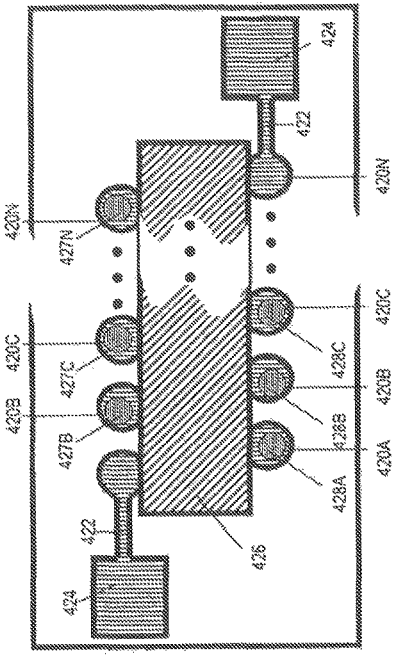
Figure 23E:
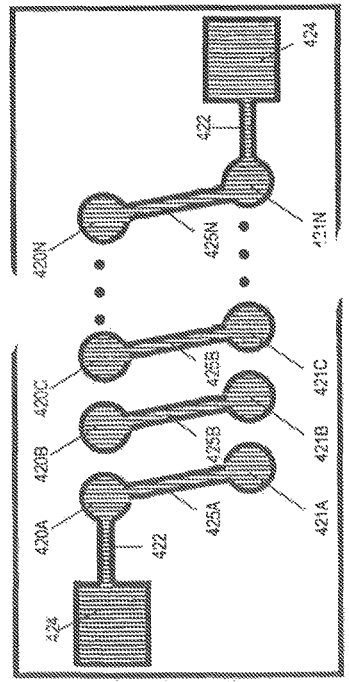
Figure 23F:
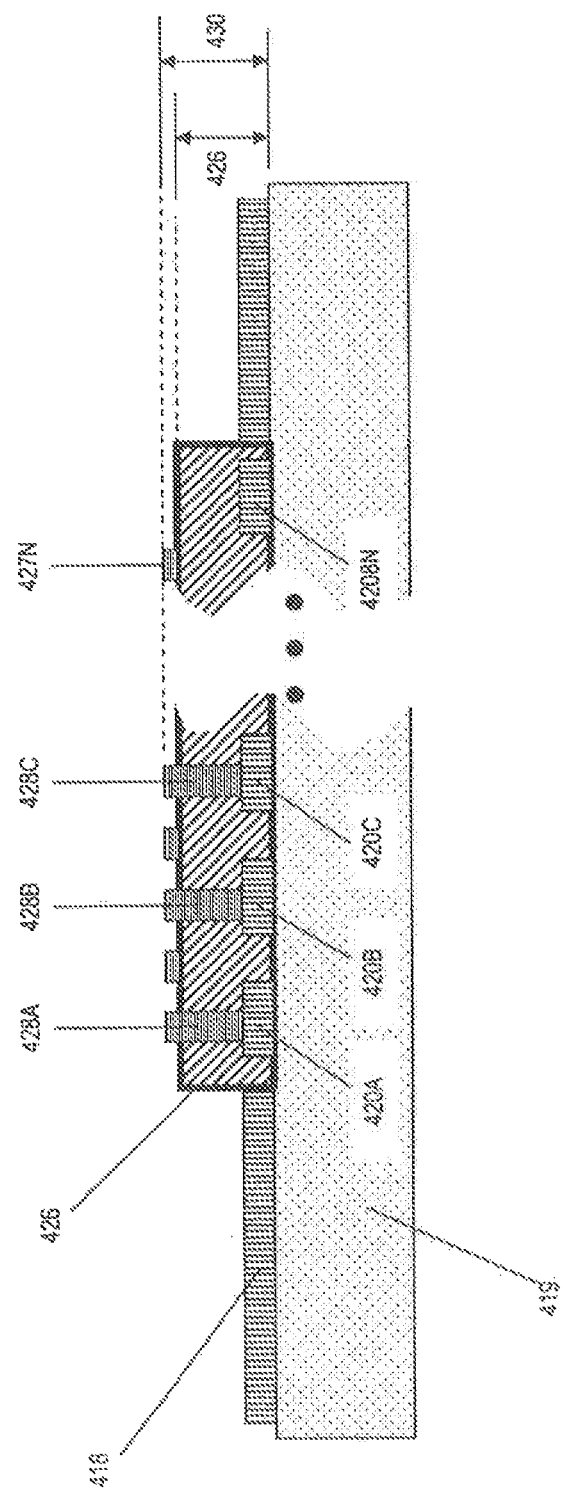
Figure 23G:
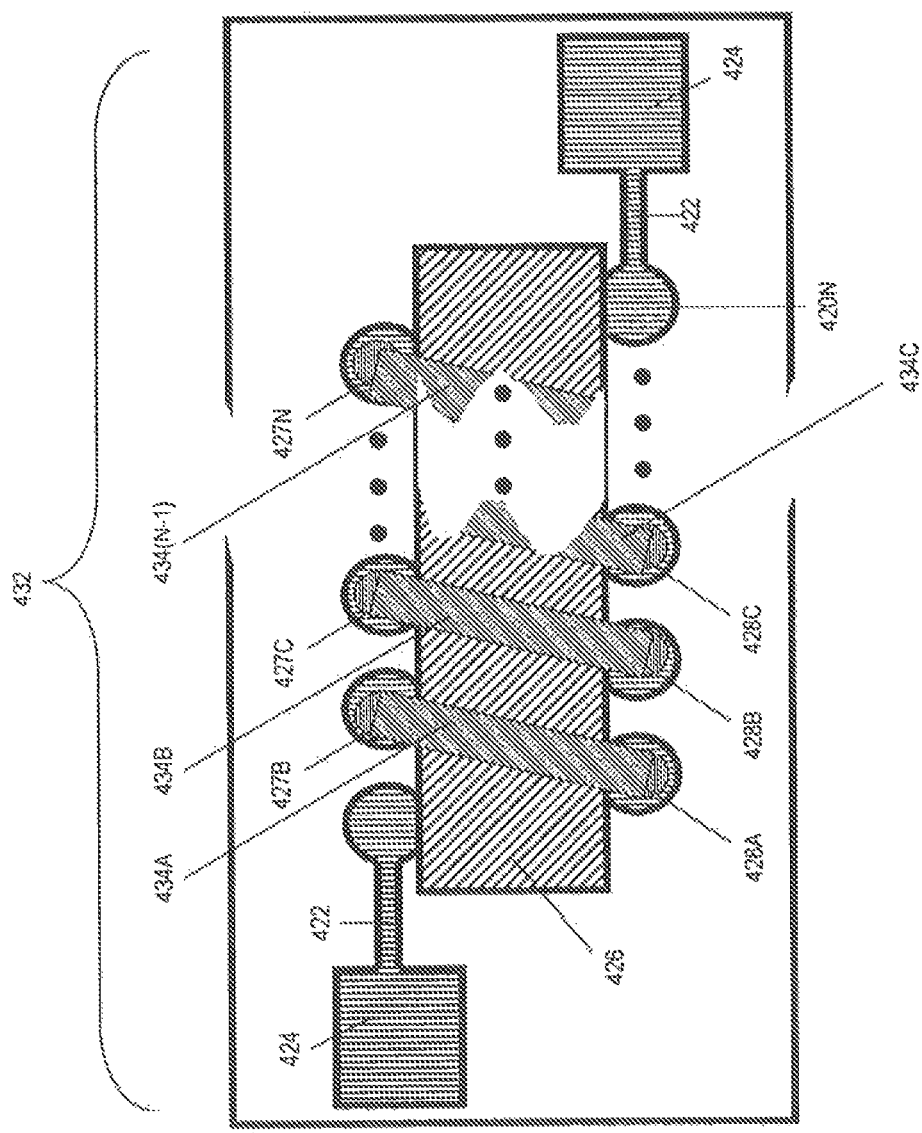

Reference is now made to FIGS. 23A, 23B, 23C, 23D, 23E, 23F and 23G to describe methods to embed at least one ceramic inductor coil within a dielectric layer that can be integrated into printed circuit board or interconnect structure. A patterned metallization layer 418 is affixed to a sacrificial substrate 419 (FIG. 23A). The patterning in the metallization layer 418 provides two sets of pads 420A, 420B, 420C, ..., 420N and 421A, 421B, 421C, ..., 421N that are used to construct the coil windings, at least one conductive trace 422, and at least one via pad 424 in FIG. 23B to route signals within the layer that contains the inductor coil or to route signals to other layers that maintain electrical communication with the layer. A first set of conducting elements 425A, 425B, 425C, ..., 425N are inserted between conducting pads 420A and 421A, 420B and 421B, 420C and 421C, and 420N and 421N, respectively, to form the lower half of the coil (FIG. 23C). The conducting elements may be formed within the patterned metallization layer 418 or, preferably, they may comprise round wire bonds, which have higher self-inductance and lower resistivity. An electroceramic 426 (FIG. 23D) having relative permeability $\mu_R \neq 1$ is selectively deposited between the two sets of pads (420A, 420B, 420C, ..., 420N and 421A, 421B, 421C, ..., 421N) and over the conducting elements 425A, 425B, 425C, ..., 425N (FIG. 23D). Vertical interconnects 427B, 427C, ..., 427N and 428A, 428B, 428C, ..., 428(N−1) (FIGS. 23E, 23F), preferably metal studs, having height 430 equal to or 10-20% greater than the thickness of magnetic electroceramic 426 are inserted on pads 420B, 420C, ..., 420N and 421A, 421B, 421C, ..., 421(N−1), respectively. The thickness of deposited magnetic electroceramic 426 should be in the range 10 μm≤t≤5,000 μm, preferably in the range 100 μm≤t≤500 μm. FIG. 23G shows how the ceramic inductor coil 432 is completed by stitch bonding a second set of conducting wire elements 434A, 434B, 434C, ..., 434(N−1), between vertical interconnects 428A and 427B, 428B and 427C, 428C and 427(C+1), ..., 428(N−1) and 427N, respectively. The inductance L of the ceramic inductor coil 432 is determined by:

$$L = N^2 \mu_o \mu_R A / l \qquad (4)$$

Where N is the number of turns in the coil, $\mu_o = 4\pi \times 10^{-7}$ H/m, $\mu_R$ is the relative permittivity of the electroceramic 426, A is the cross-sectional area of a single turn in the coil, and l is the length of the coil. The resistance, dimensional uniformity, and surface roughness of the metal conductor used to fabricate the coil, and the precision placement of the all conducting elements are key tolerance parameters, which is why wire bonding methods are preferred. Stud bumping and stitch bonding equipment having a bond placement accuracy <±5 μm, preferably ≤±3.5 μm, a height accuracy of <±10 μm, preferably ≤±3 μm, and a minimum pitch of 60 μm, preferably 50 μm, such as that provided by the AT Premier (in AccuBump mode), K&S, Willow Grove, Pa., are recommended process tools. Laser trimming the selectively deposited electroceramic 426 is recommended to maintain accurate control over dimensional tolerances.

Controlling the permeability of the inductor coil electroceramic 426 to a value ≤±5%, preferably ≤±1%, is another specific embodiment of the invention. It is another specific embodiment of the invention to produce elemental ceramic inductor coils providing inductance in the range of 0.01 pH to 500 nH with performance values ≤±5%, preferably ≤±1% of the targeted value. Electroceramic permeability is primarily a function of electroceramic composition, grain size, and is usually dependent upon frequency and temperature. Preferred electroceramic compositions for use in a ceramic inductor coil include ferrites and garnets. Ferrites adopt body-centered cubic crystal structure and have the following chemical formula:

$$M_1 Fe_2 O_4 \qquad (5a)$$

Where Fe is iron oxide and $M_1$ represents one or more select metal oxides having a total molar concentration that is half the iron oxide molar concentration. Group $M_1$ metal oxides preferred for use in high permeability ferrite electroceramics include: cobalt monoxide (CoO), nickel oxide (NiO), zinc oxide (ZnO), manganese oxide (MnO), copper oxide (CuO), vanadium oxide (VO), magnesium oxide (MgO) and lithium oxide ($Li_2O$). Garnets adopt either rhombic dodecahedron or trapezohedron crystal structures, or a combination of the two, and have the following chemical formula:

$$A_3 B_2 (SiO_4)_3 \qquad (5b)$$

Where group A metal oxides have equal molar concentration to silicon oxide and group B metal oxides have molar concentration that is ⅔ the molar concentration of silicon oxide. Group A metal oxides preferred for use in high permeability garnet electroceramics include: calcium oxide (CaO), magnesium oxide (MgO), iron oxide (FeO), and manganese oxide (MnO). Group B metal oxides preferred for use in high permeability garnet electroceramics include: aluminum oxide ($Al_2O_3$), iron oxide ($Fe_2O_3$), chromium oxide ($Cr_2O_3$), vanadium oxide ($V_2O_3$), zirconium oxide ($ZrO_2$), titanium oxide ($TiO_2$), silicon oxide ($SiO_2$), yttrium oxide ($Y_2O_3$), cobalt oxide ($Co_3O_4$), gadolinium oxide ($Gd_2O_3$) neodymium oxide ($Nd_2O_3$) and holmium oxide ($Ho_2O_3$). Ceramic inductor coils 432 (FIG. 23G) having inductance values ranging from 0.01 pH to 1,000 μH and tolerances ≤±5%, preferably ≤±1%, will comprise ferrite or garnet electroceramic 426 selectively annealed to have controlled microstructure with grain size ranging from 10 nm to 25 μm, preferably from 250 nm to 5 μm.

Figure 24A:
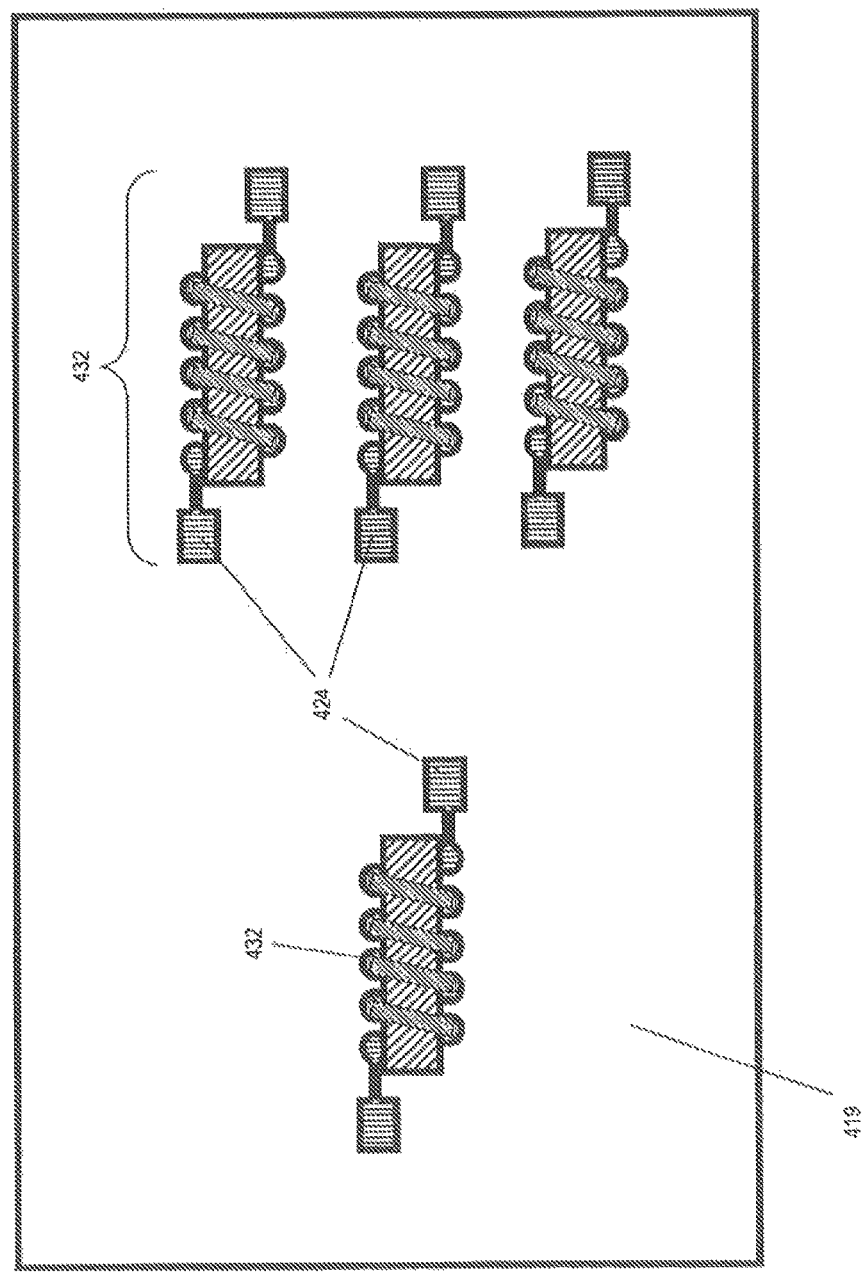
FIGS. 24A, 24B depict embodiments and fabrication relating to inductor coils embedded in a dielectric layer.
Figure 24B:
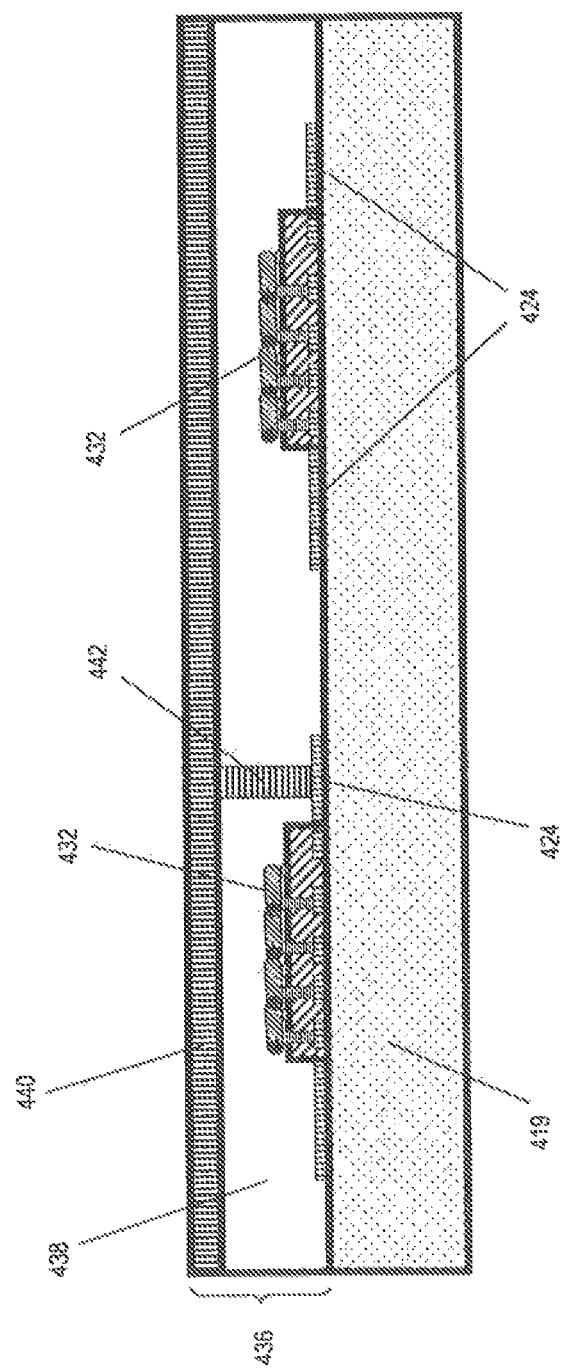

Reference is now made to FIGS. 24A, 24B to describe methods to integrate at least one discrete inductor coil 432 fabricated on a sacrificial substrate 419 into an embedded discrete inductor coil layer 436 that can subsequently be incorporated into a printed circuit board or interconnect structure. Each discrete inductor coil 432 possesses at least one via pad 424 that is used to make subsequent electrical connections. As shown in FIG. 24B, once all inductor coils are fabricated within desired tolerances, an insulating dielectric layer 438, a metallization layer 440, and vertical interconnects (vias) 442 that maintain electrical communications between the metallization layer 440 and the at least one via pad 424 (where desired) are then applied to the structure. The dielectric layer 438 may be an organic material, such as FR4, polyfluorotetraehylene (PFTE) Teflon, or Rogers Duroid materials. Alternatively, the dielectric layer 438 may be an LCD processed inorganic material, such as silica, alumina, or a silicate or aluminate dielectric using a curtain coating or blanket coating liquid aerosol spray. The metallization layer 440 may comprise a ground or power plane, or may be patterned to function as a signal routing network. The metallization layer 440 may be applied using a variety of techniques, such as a metal sheet that is bonded to the dielectric layer through an adhesive agent, or through direct-write methods, such as screen printing or inkjet printing, preferably using low-temperature nano-particle pastes. It is recommended to use a low-temperature metallization technique so the formed structure is subject to maximum temperatures that will not alter the microstructure of the embedded electroceramic. The embedded discrete inductor layer 436 comprising at least one pre-tested embedded discrete inductor coil 432 in electrical communication with a via pad 424 or via 442 is then separated from the sacrificial substrate 419 for use in a printed circuit board or interconnect structure.

Figure 25:
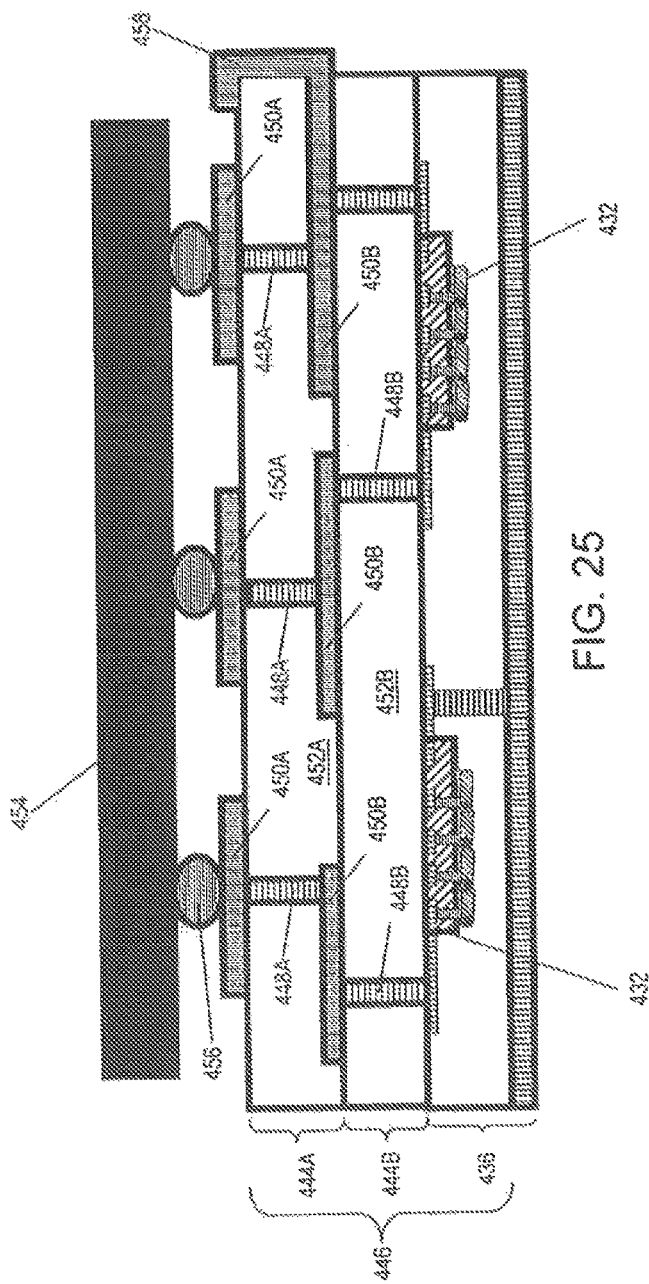
FIG. 25 depicts embodiments and fabrication relating to a printed circuit board that contains electrically interconnected embedded discrete inductor coils.

Reference is now made to FIG. 25 to describe methods to embed at least one discrete inductor coil into a printed circuit board or interconnect structure. The embedded discrete inductor coil layer 436 can then be combined with one or more additional signal routing layers 444A, 444B, into a stacked multilayer structure 446. Signal routing layers 444A, 444B contain vias 448A, 448B, and metallization 450A, 450B used to conduct signals within dielectric material 452A, 452B. This electrical network is used to maintain electrical communication between the at least one embedded inductor coil 432 and a semiconductor device 454 through conductive means 456 in electrical contact with a surface metallization layer 450A, or an external device (not shown) through an electrical contact 458 located on the periphery of the stacked multilayer structure 446.

Figure 26A:
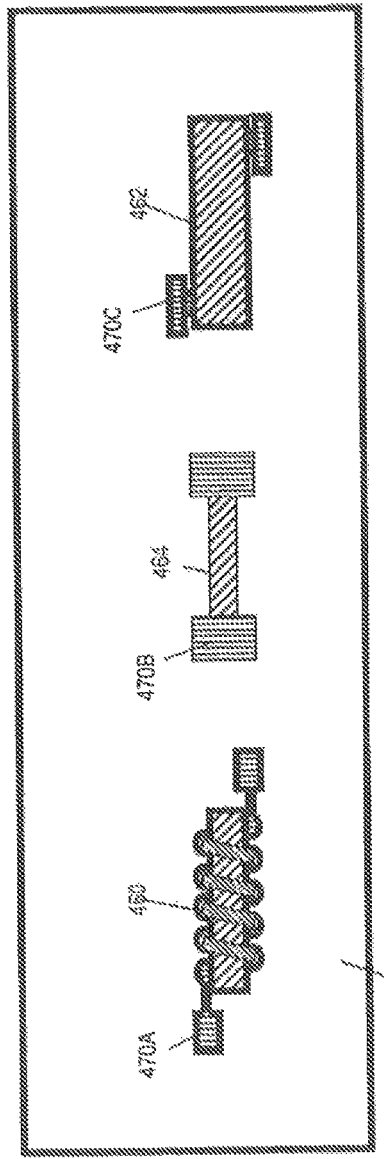
FIG. 26A, 26B depict embodiments and fabrication relating to a dielectric layer that contains embedded resistors, capacitors, and inductors.
Figure 26B:
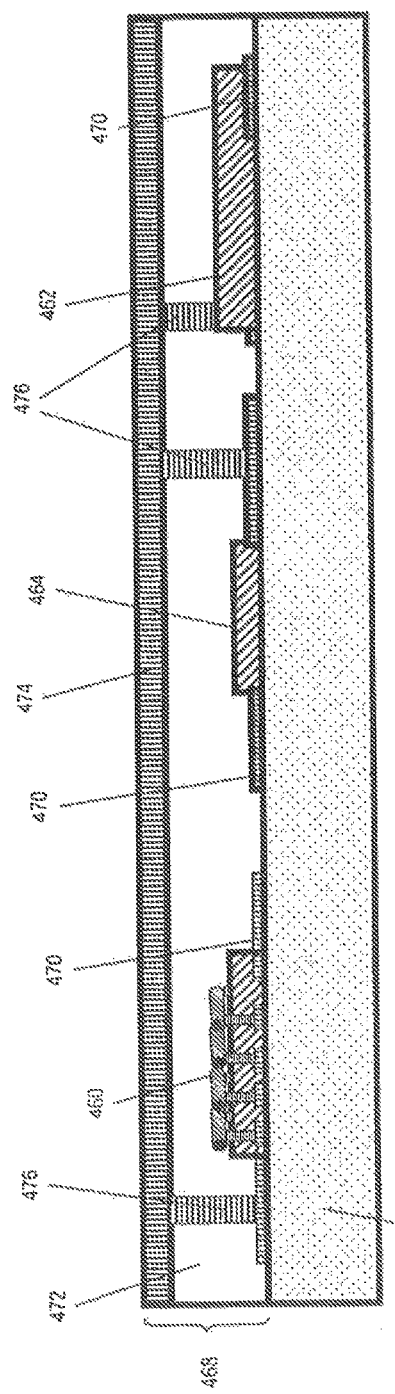

Reference is now made to FIGS. 26A, 26B and 27A, 27B to describe methods to integrate at least one discrete inductor coil 460, at least one discrete capacitor 462, and at least one discrete resistor 464 fabricated on a sacrificial substrate 466 into a single embedded passive layer 468 that can subsequently be incorporated into a printed circuit board or interconnect structure. Each component 460, 462, 464 possesses at least one via pad 470A, 470B, 470C that is used to make subsequent electrical connections. As shown in FIG. 26B, once all passive components are fabricated within desired tolerances, an insulating dielectric layer 472, a metallization layer 474, and vertical interconnects (vias) 476 that maintain electrical communications between the metallization layer 474 and the at least one via pad 470 of the passive components 460, 462, 464 (where desired) are then applied to the structure. The dielectric layer 472 may be an organic material, such as FR4, polyfluorotetraehylene (PFTE) Teflon, or Rogers Duroid materials. Alternatively, the dielectric layer 472 may be an LCD processed inorganic material, such as silica, alumina, or a silicate or aluminate dielectric using a curtain coating or blanket coating liquid aerosol spray. The metallization layer 474 may comprise a ground or power plane, or may be patterned to function as a signal routing network. The metallization layer 474 may be applied using a variety of techniques, such as a metal sheet that is bonded to the dielectric layer through an adhesive agent, or through direct-write methods, such as screen printing or inkjet printing, preferably using low-temperature nano-particle pastes. It is recommended to use a low-temperature metallization technique so the formed structure is subject to maximum temperatures that will not alter the microstructure of the embedded electroceramic. The embedded passive component layer 468, comprising at least one pre-tested embedded passive component 460, 462, 464 in electrical communication with via pads 470 or via 476, is then separated from the sacrificial substrate 466 for use in a printed circuit board or interconnect structure.

Figure 27A:
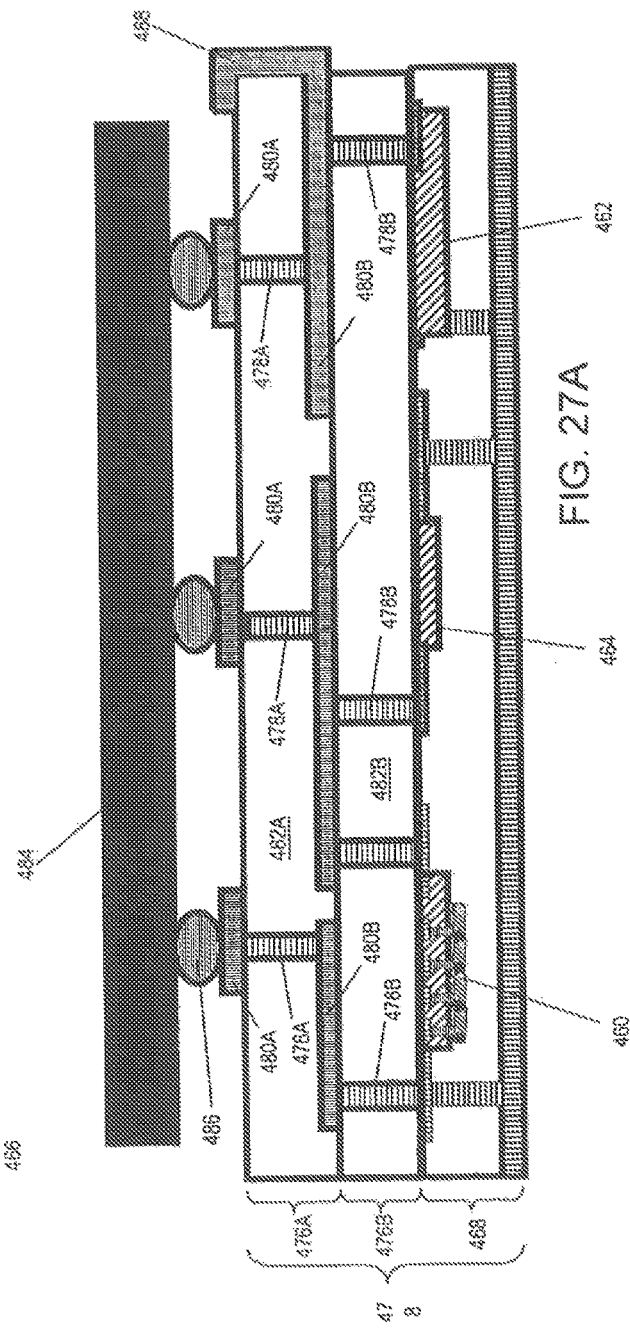

Reference is now made to FIG. 27A, 27B to describe methods to embed at least one discrete inductor coil into a printed circuit board or interconnect structure. In one embodiment (FIG. 27A), the embedded passive component layer 468 can then be combined with one or more additional signal routing layers 476A, 476B, into a stacked multilayer structure 478. Signal routing layers 476A, 476B contain vias 478A, 478B, and metallization 480A, 480B used to conduct signals within dielectric material 482A, 482B. This electrical network is used to maintain electrical communication between the at least one embedded inductor coil 460, the at least one embedded discrete capacitor 462, and the at least one embedded discrete resistor 464 and a semiconductor device 484 through conductive means 486 in electrical contact with a surface metallization layer 480A, or an external device (not shown) through an electrical contact 488 located on the periphery of the stacked multilayer structure 478. In another embodiment (FIG. 27B), electrical connectivity between embedded resistor, capacitor, and inductor components and a semiconductor device 484 is achieved by assembling a multilayer structure ack 489 comprising an embedded resistor layer 302, an embedded capacitor layer 369, and an embedded inductor coil layer 436, with one or more signal routing layers 476A, 476B. The one or more signal routing layers are additionally used to establish electrical communication with external devices through an electrical contact 488 located on the periphery of the multilayer structure 489. In the manner described in reference to FIGS. 27A, 27B, a multilayer circuit board may be constructed a combination of various components and using the most suitable two-dimensional or three-dimensional arrangement.

The methods and embodiments described above provide a means to produce thermally stable filtering circuits that comprise circuit LCR elements with tolerances ≤±5%, preferably ≤±1%, that can be used to control a circuit's reactive impedance Z with a tolerance of ≤±5%, preferably ≤±1%. Wireless circuits include an antenna as a principle circuit element. The tuning (impedance) of an antenna element is affected by dielectric materials that are positioned within the antenna's reactive near-field region. Making reference to FIG. 28, the reactive-near field protrudes a distance d from an antenna element 490 that has a maximal dimension D 491 given by:

$$d = 0.62\sqrt{D^3/\lambda} \qquad (6)$$

Where λ is the wavelength of the electromagnetic emissions radiated by the antenna element 490. A handset device that contains an antenna element surrounded by low permittivity dielectric materials has a reactive near-field region that protrudes beyond the handset's packaging and is therefore influenced by dielectric loads in the immediate vicinity of the handset, such as the users' hands and heads, or the layout or the mobile device's packaging. These loads are likely to shift dramatically during use, which is undesirable to maintaining stable impedance in the antenna circuit element. Furthermore, making even minor changes to the design of the handset package requires a re-design of its RF front-end circuitry if the same antenna is to be re-used in the renovated handset package. Therefore, it is desirable to provide a platform-independent antenna module that has a tuning (impedance) that is not affected by changes in the dielectric loads surrounding the antenna module. A specific embodiment of the invention produces a platform-independent antenna module that produces a reactive near field that is contained within the body of the antenna module and, therefore, not affected by changes in the dielectric loads that surround it.

Figure 29B:
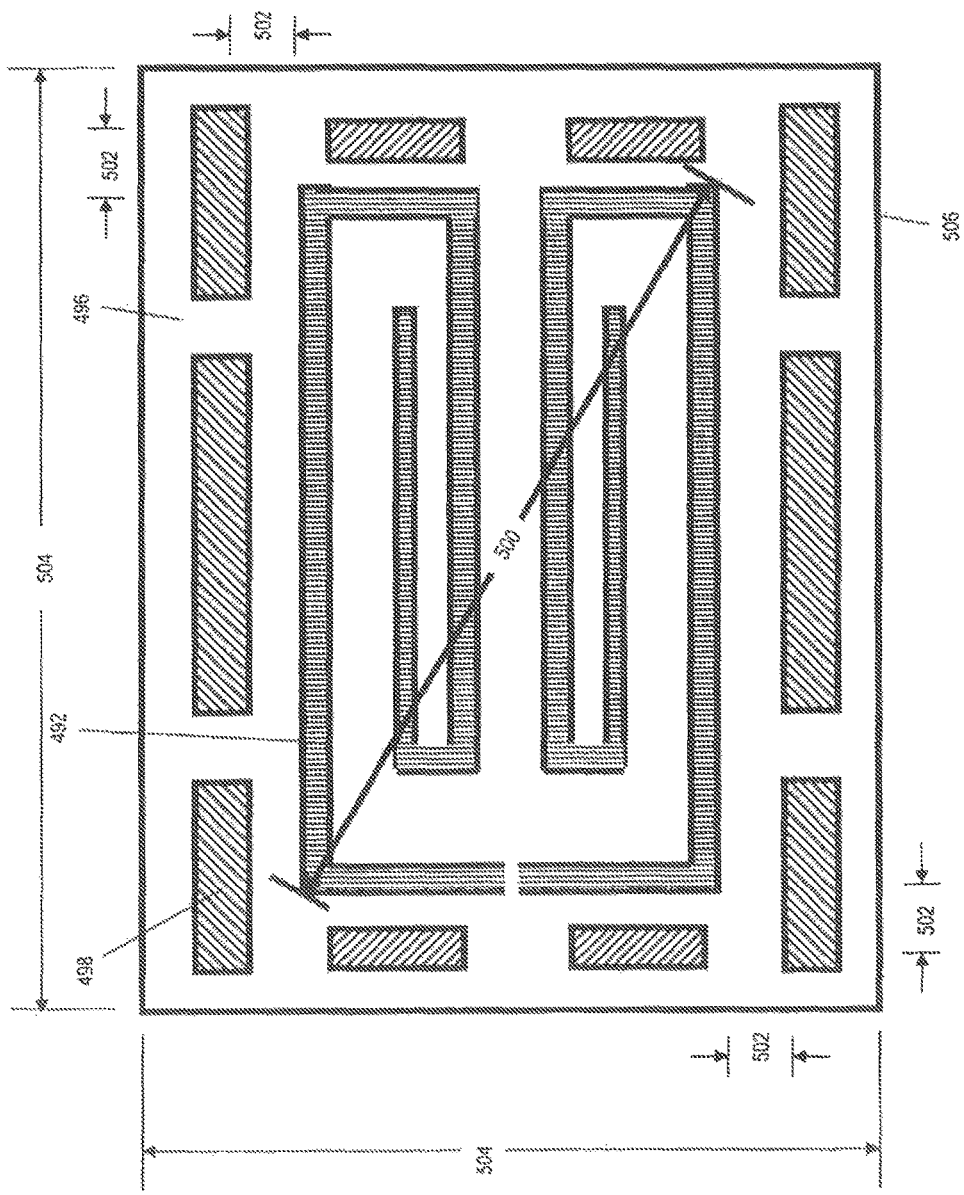
Figure 29C:
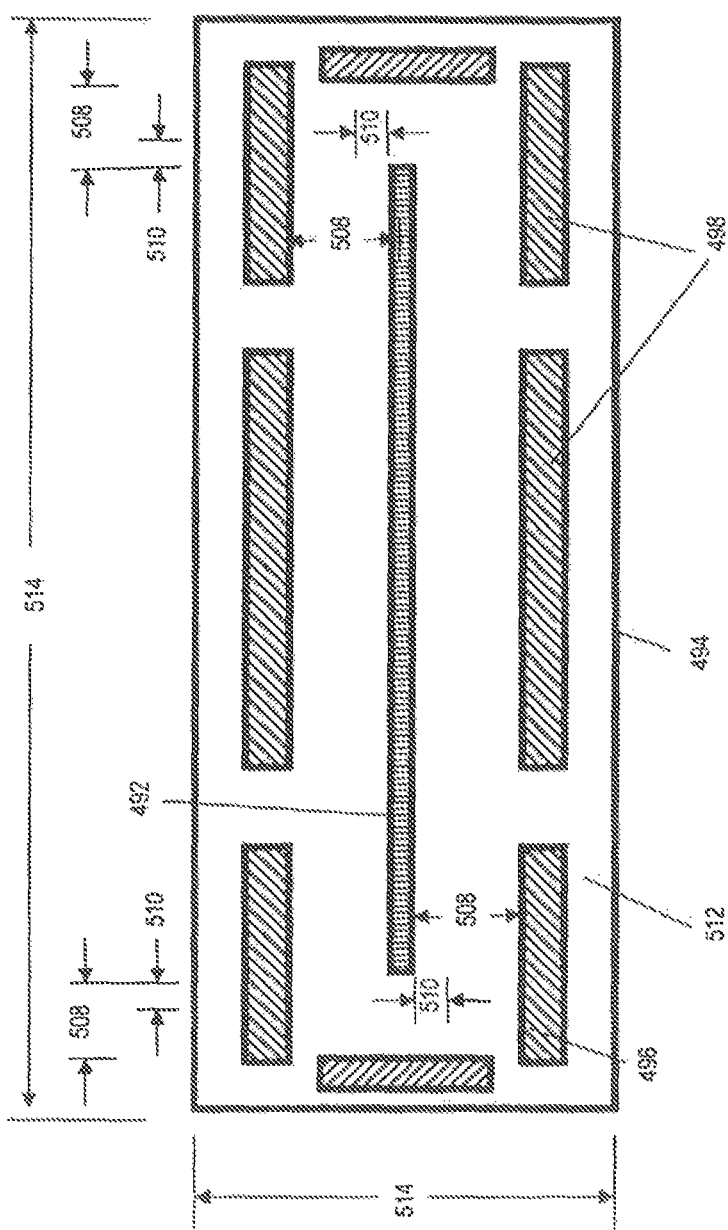

Reference is now made to FIGS. 29A, 29B, 29C that describe a folded antenna element 492 contained within a meta-material dielectric body 494. The meta-material dielectric body 494 comprises a low-permittivity host dielectric 496 with relative permittivity $\in_R \leq 10$, preferably $\in_R \leq 5$, and at least one high permittivity dielectric inclusion 498 having relative permittivity $\in_R \geq 10$, preferably $\in_R \geq 100$. By definition, the at least one dielectric inclusion 498 within a meta-material dielectric body 494 has physical dimension that is small compared to the wavelength of electromagnetic excitations propagating through meta-material dielectric body 494. The meta-material dielectric body 494 has an effective dielectric permittivity $\in_{REff}$ that is proportional to the relative volume fractions of the relative permittivities of the host dielectric 496, $\in_{RHost}$, and the at least one dielectric inclusion 498, $\in_{RIncl}$. A specific embodiment of the invention in FIG. 29B comprises a folded antenna element 492 having a maximal physical dimension $D_{folded}$ 500 embedded within a meta-material dielectric body 494 that has an effective permittivity $\in_{REff} \geq 10$, preferably has an effective permittivity $\in_{REff} \geq 100$. Although, the diagrams contained in FIGS. 29A, 29B, 29C depict a folded dipole antenna, it should be understood that the same reasoning applies to a folded monopole antenna. High permittivity and high permeability dielectric media reduce the phase velocity of electromagnetic excitations propagating through them. The reduced phase velocity, in turn, produces an effective wavelength $\lambda_{Eff}$ given by:

$$\lambda_{Eff} = c / (f \sqrt{\mu_R \varepsilon_R}) \tag{7a}$$

$$= \lambda_{freespace} / \sqrt{\mu_R \varepsilon_R} \tag{7b}$$

Where c is the speed of light in a vacuum (c=2.9979×10$^8$ m/sec$^2$), f is the frequency of the electromagnetic excitation, and $\mu_R$ and $\in_R$ are the relative permeability and relative permittivity of the dielectric medium, respectively, and $\lambda_{freespace}$ is the wavelength of electromagnetic excitation in a vacuum. Therefore, an electromagnetic excitation propagating through a non-magnetic medium ($\mu_R$=1) will have an effective wavelength $\lambda_{Eff}$ equal to $\lambda_{freespace}/4$ and $\lambda_{freespace}/10$ when the dielectric medium has relative permittivity $\in_R$=16 and $\in_R$=100, respectively. Therefore, the resonant length $l_{res}$ of a folded dipole or a folded monopole antenna, which is generally given by $l_{res} \approx \lambda/2$, and $l_{res} \approx \lambda/4$, respectively, is decreased proportionally, thereby allowing the maximum physical dimension of the folded antenna element 492 to be reduced to the point that its reactive near field protrudes a distance d 502 that is contained within a distance S 503 separating the folded antenna element 492 from an exterior surface of the meta-material dielectric body 494. In this embodiment, the reactive near field will remain unaffected by changes in dielectric loading beyond the physical dimensions 504 of the antenna module 506. High permittivity dielectric media generally have unstable thermal properties and high loss that can adversely affect frequency tuning and signaling performance. Therefore, it is another preferred embodiment of the invention to fabricate the antenna module 506 using selectively deposited dielectric inclusions 498 having thermal stability tolerances for relative permittivity $\in_R$ and relative permeability $\mu_R$ that are $\leq \pm 5\%$, preferably $\leq \pm 1\%$ of targeted values. High-loss materials located within an antenna's reactive near field region will affect the antenna's signal modulation in a manner that limits phase modulation roll-off rates, which, in turn, limits the number of wireless symbols that can be transmitted by the antenna. Thus, it is desirable to engineer the folded antenna element 492 and the meta-material dielectric body 494 such that the at least one high permittivity dielectric inclusion 496 is located a distance 508 away from the folded antenna element 492 that is greater than the distance d 510 to which the reactive near field protrudes In this special embodiment the reactive near field is contained within a low loss host dielectric 512 having a loss tangent tan $\delta \leq 10^{-3}$, preferably an ultra-low loss dielectric host having a loss tangent tan $\delta \leq 2 \times 10^{-4}$. Amorphous silica is a preferred ultra-low loss dielectric medium because it has stable dielectric properties over temperatures ranging from −150° C. to +250° C. and a loss tangent tan $\delta = 2 \times 10^{-5}$. Organic dielectric media suitable for use as an ultra-low loss dielectric host 512 include PFTE Teflon and Rogers Duroid dielectric. This special embodiment also provides a platform-independent antenna module since the reactive near field protrudes a distance d 510 that remains within the antenna module's solid state dimensions 514.

The art described above instructs methods and embodiments that provide wireless circuit elements (embedded passive components and platform-independent antenna modules) that maintain precise impedance tuning in the presence of electromagnetic and thermal disturbances. These embodiments are combined into a further embodiment that establishes the passive spread-spectrum receiver. Making reference to FIGS. 30, 31A, 31B, 32, 33A, 33B the spread-spectrum receiver 517 comprises at least one frequency-selective antenna (FSA) element 518 in electrical communication through conductive means 519 with a printed circuit board or interconnect structure 520 that comprises one or more embedded passive components having thermal stability and performance tolerances $\leq \pm 5\%$, preferably $\leq \pm 1\%$, used to construct impedance-matched transmission lines 521 within the printed circuit board or interconnect structure 520. The printed circuit board or interconnect structure 520 is, in-turn, in electrical communication through conductive means 522 with semiconductor devices 523A, 523B located on a top 574 or bottom 572 major surface of the printed circuit board or interconnect structure 520. At least one of the semiconductor devices 523A is a low-noise power amplifier 522A, preferably a differential low-noise power amplifier, in electrical communication with the FSA element 518 through one or more impedance-matched transmissions 521 and a first pass band filter 526. The use of lumped circuit elements to impedance-match two components through a transmission line is generally referred to in the art as L-section matching. In general, L-section matching with discrete components mounted on the surface of a printed circuit is only used for frequencies up to about 1 GHz, because the size of the reactive components is not very small ($<\lambda/10$) compared to the operating wavelength. The use of high resistivity, high permittivity, or high permeability electroceramics to form the embedded passive component embodiments described above sharply reduces passive component size. Furthermore, embedding these components within the circuit board or interconnect structure eliminates solder joints and surface vias that contribute reactive noise to the circuit. Therefore, a printed circuit board or interconnect structure that comprises L-section matched transmission lines tuned with embedded passive components having thermal stability and performance tolerances ≤±5%, preferably ≤±1%, is an additional preferred embodiment of the invention.

Figure 31A:
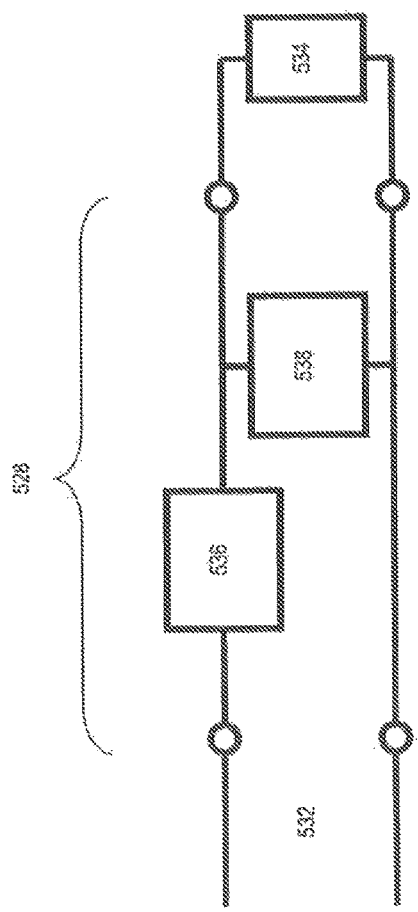
FIGS. 31A, 31B depict the placement of reactive loads on L-section matched impedance transmission lines.
Figure 31B:
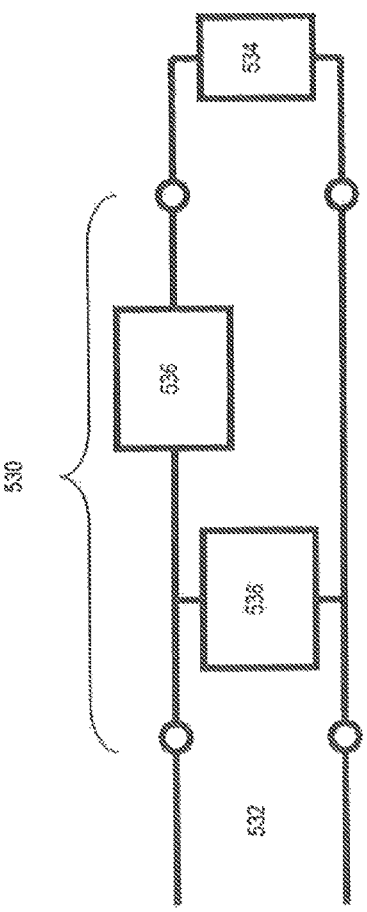
Figure 33A:
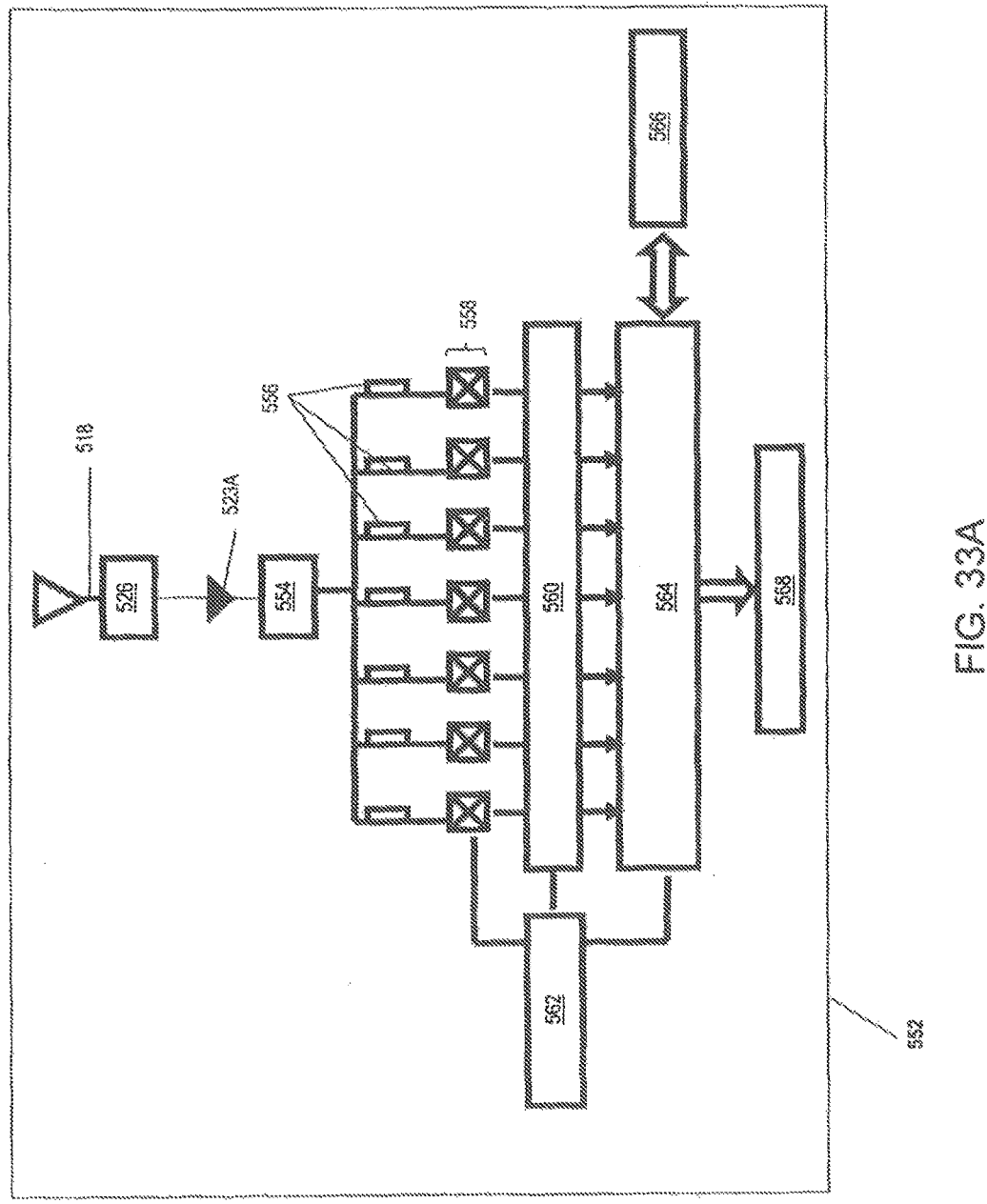
FIGS. 33A, 33B depict the system architecture a single carrier and a multiple carrier spread-spectrum receiver, respectively.
Figure 33B:
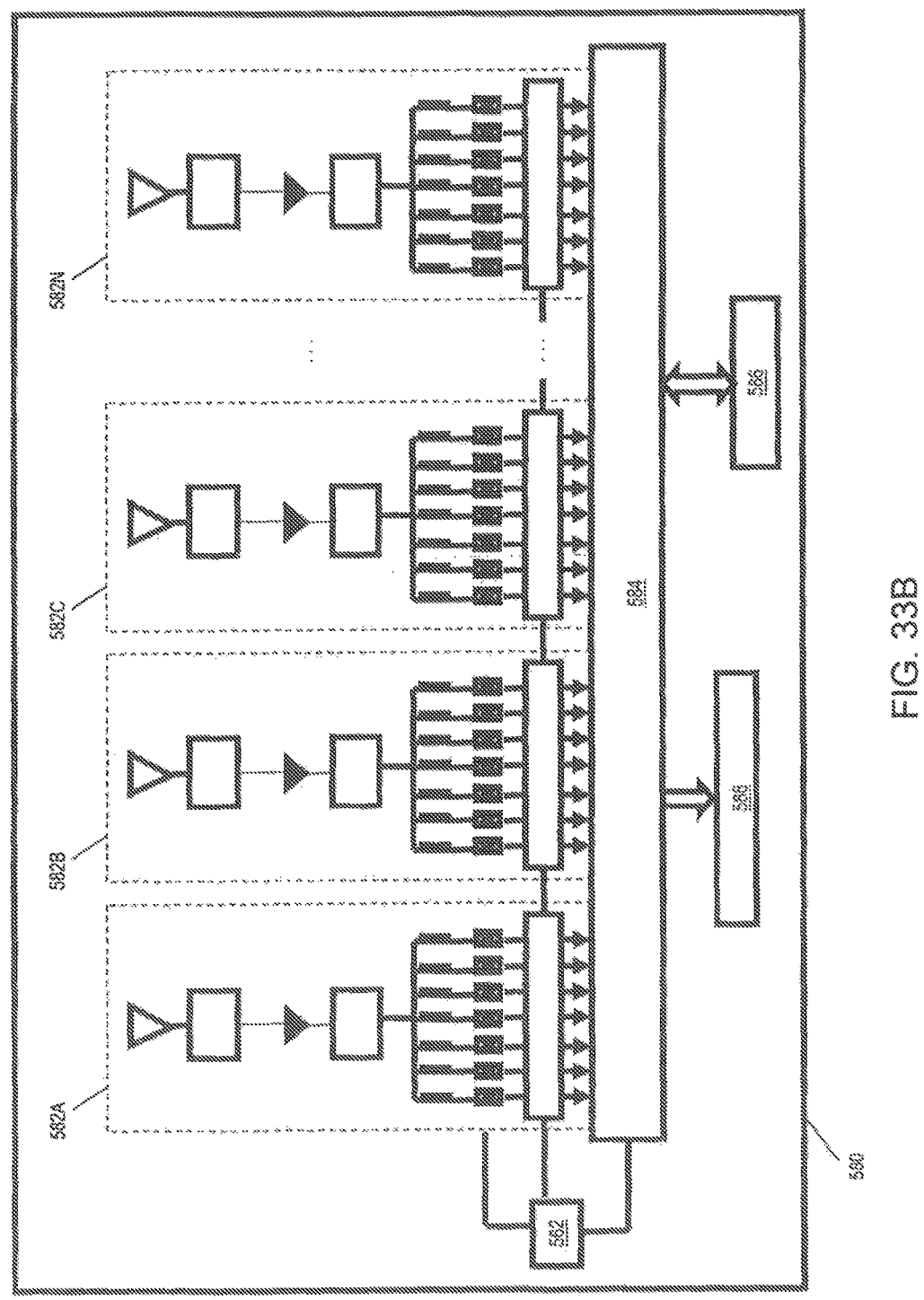

FIGS. 31A, 31B depict two characteristic configurations for L-section matching 528, 530 between a signal source impedance $Z_o=(R_o+X_o)$ 532 and a transmission line load $Z_L=(R_L+X_L)$ 534 that comprise a reactive series load jX 536 and a reactive parallel load jB 538. L-section matching 528 (FIG. 31A) is used when the real part $R_L$ of the load impedance $Z_L$ 534 is greater than the source impedance $Z_o$ 532. In this instance, the reactive parallel load jB 538 is determined by:

$$B=[X_L\pm\sqrt{(R_L/Z_o)}\times\sqrt{(R_L^2+X_L^2-Z_oR_L)}]/(R_L^2+X_L^2) \quad (8a)$$

And, the reactive series load jX 536 is determined by:

$$X=(1/B)+(X_LZ_o/R_L)-(Z_o/BR_L) \quad (8a)$$

L-section matching 530 (FIG. 31B) is used when the real part $R_1$ of the load impedance $Z_L$ 534 is less than the source impedance $Z_o$ 532. In this instance, the reactive parallel load jB 538 is determined by:

$$B=\pm\sqrt{[(R_L(Z_o-R_L)]}-X_L \quad (8c)$$

And, the reactive series load jX 536 is determined by:

$$X=(1/B)+(X_LZ_o/R_L)-(Z_o/BR_L) \quad (8d)$$

It is not a requirement for all impedance tuning within the printed circuit board or interconnect structure 520 to be managed using L-section matching methods as circuit tuning can also be realized using transmission-line stubs. However, the high tolerance controls, small size, and wide range of performance values enabled by the invention provide convenient means to integrate precise bandwidth filters, such as quarter-wave transformers, binomial multi-section transformers, and Chebyshev multi-section matching transformers into the spread-spectrum receiver. These filtering devices are well known to practitioners skilled in the art of microwave circuit, reference is made to *Microwave Engineering, 3rd Edition*, David M. Pozar, John Wiley & Sons, Hoboken, N.J. © 2005 (ISBN: 0-471-44878-8) for a complete description on impedance tuning parameters for these devices.

As shown in FIG. 32A, 32B, an FSA element 518 is characterized by a conductance band 540 that is tuned to a center frequency $f_c$ 542 of interest and provides ≥−20 dB signal isolation, preferably ≥−40 dB signal isolation between an upper band frequency $f_U$ 544 and a lower band frequency $f_L$ 546 that characterize the limits for a pass band 548 of interest (FIG. 32A). The FSA conductance band 540 is narrower than the desired pass band 548, so the FSA 518 is additionally tuned to have frequency-dependent impedance that provides input signal reflection coefficients 550 (FIG. 32B) of approximately 1 at the center frequency $f_c$ 542 and input signal reflection coefficient of approximately 2 at the upper band frequency $f_U$ 544 and lower band frequency $f_L$ 546. Signal reflection coefficients are alternatively referred to as the voltage standing wave ratio (VSWR).

Figure 30:
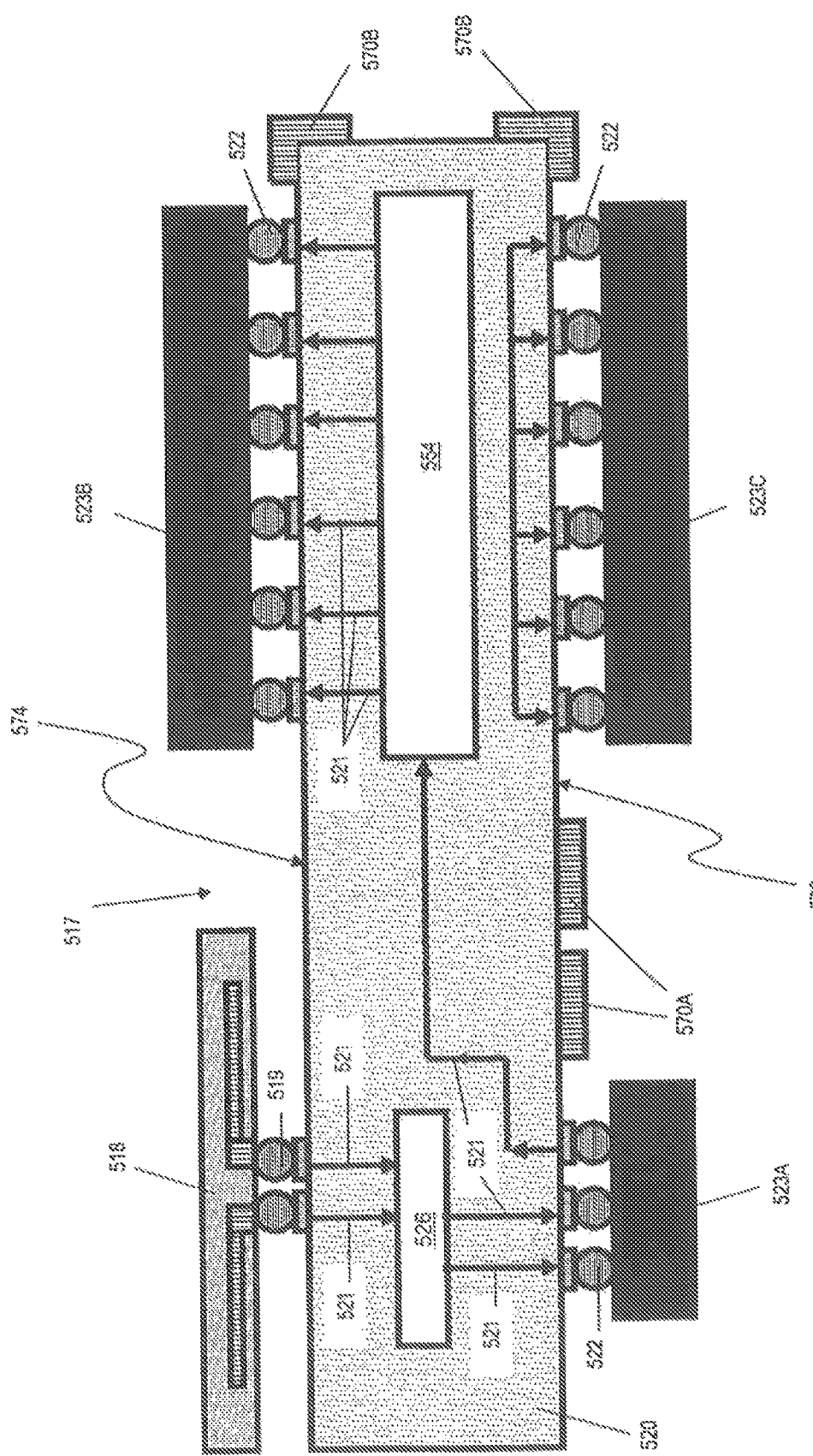
FIG. 30 depicts an embodiment and construction of a spread-spectrum receiver.

Reference is now made to FIGS. 30, 33 and 34 to describe design features of the spread-spectrum receiver device as they relate to embedded passive components and filtering devices derived there from within the printed circuit board or interconnect structure 520. FIG. 33 depicts the architecture of a single carrier-frequency spread-spectrum device 552, comprising an FSA element 518, a first pass band filter 526 tuned to output signal frequencies contained within a desired pass band 548 (FIG. 32A) to a low-noise power amplifier (LNA) semiconductor device 523A. The LNA semiconductor device 523A amplifies signals in the desired pass band 548 and directs them to a second pass band filter 554. The second pass band filter 554 functions as a comb filter, preferably using an array of quarter-wave transformers. The second pass band filter 554, isolates discrete frequency components contained in the desired pass band 548 into separate channels 556. Signals in the separate channels 556 are directed through impedance-matched transmission lines 521 (FIG. 30) to a semiconductor device 523B (FIG. 30) that contains sensor elements 558 and an analog-to-digital conversion stage 560 that integrates signal characteristics of isolated frequency components contained within separate channels 556 over a time period equal to the pulse duration length T of the wireless symbol. A clock 562 transfers the digitally formatted integration values from the separate channels 556 to a microprocessor 564 that compares the relative integration values to a reference table 566 and outputs the wireless symbol 568 that corresponds to the measured weighting across the isolated frequency channels 556. Electrical contacts 570A, 570B (FIG. 30) on a major surface 572, 574 (570A) or the periphery (570B) of the printed circuit board or interconnect structure 520 are used to establish electrical communication with external devices (not shown). A wide band spread-spectrum receiver 580 may alternatively comprise a plurality of single carrier-frequency spread-spectrum stages 582, 582B, 582C, . . . , 582N that operate in parallel to supply a microprocessor 584 with data on frequency-weighting of multiple carrier signals, which is referenced in a look-up table 586 to produce a complex wireless symbol 588 (FIG. 34).

Although the invention has been described with respect to various embodiments, it should be realized this invention is also capable of a wide variety of further and other embodiments within the spirit and scope of the appended claims.

What is claimed is:

1. An antenna, comprising:
   a folded antenna element having a maximum dimension D; and
   a meta-material dielectric body embedding said folded antenna element a distance S from an exterior surface of said meta-material dielectric body;
   wherein said meta-material dielectric body comprises a dielectric host having a relative permittivity $\in_R \leq 10$ and one or more dielectric inclusions having relative permittivity $\in_R > 10$;
   wherein said distance S is greater than the protrusion length d of the folded antenna element's reactive near-field region, and
   wherein said reactive near-field protrusion length d is defined as $d=0.62\sqrt{(D^3/\lambda)}$, and $\lambda$ is the wavelength of an electromagnetic excitation emitted or received by said folded antenna element.

2. The antenna of claim 1, wherein the dielectric host is an organic dielectric.

3. The antenna of claim 2, wherein said organic dielectric includes FR4, Rogers Duroid or PFTE Teflon dielectric.

4. The antenna of claim 2, wherein said organic dielectric host has a loss tangent $\tan \delta \leq 10^{-3}$.

5. The antenna of claim 2, wherein the dielectric host is an inorganic dielectric.

6. The antenna of claim 5, wherein said inorganic dielectric host is a silica or alumina dielectric.

7. The antenna of claim 5, wherein said inorganic dielectric host has a loss tangent tan $\delta \leq 10^{-3}$.

8. The antenna of claim 5, wherein said inorganic dielectric host has a value for relative permittivity $\in_R$ that is stable over operating temperatures between −150° C. and +250° C.

9. The antenna of claim 1, wherein the inclusions are spatially separate from all elements of the antenna.

10. An antenna, comprising:
a folded antenna element having a maximum dimension D; and
a meta-material dielectric body embedding said folded antenna element a distance S from a dielectric inclusion contained within said meta-material dielectric body;
wherein said meta-material dielectric body comprises a dielectric host having a relative permittivity $\in_R \leq 10$ and one or more dielectric inclusions having relative permittivity $\in_R > 10$;
wherein said distance S is greater than the protrusion length d of the folded antenna element's reactive near-field region, and
wherein said reactive near-field protrusion length d is defined as $d=0.62\sqrt{(D^3/\lambda)}$, and $\lambda$ is the wavelength of an electromagnetic excitation emitted or received by said folded antenna element.

* * * * *